United States Patent
Wachi et al.

(10) Patent No.: US 8,629,699 B2
(45) Date of Patent: Jan. 14, 2014

(54) CLOCK DATA RECOVERY CIRCUIT AND TRANSCEIVER SEMICONDUCTOR INTEGRATED CIRCUIT CONTAINING THE SAME

(71) Applicant: Renesas Electronics Corporation, Kawasaki (JP)

(72) Inventors: Yusuke Wachi, Chiyoda-ku (JP); Takayuki Noto, Kawasaki (JP); Tomoaki Takahashi, Kawasaki (JP); Takashi Kawamoto, Chiyoda-ku (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/672,264

(22) Filed: Nov. 8, 2012

(65) Prior Publication Data
US 2013/0113534 A1    May 9, 2013

(30) Foreign Application Priority Data
Nov. 9, 2011 (JP) .................................. 2011-245387

(51) Int. Cl.
*H03L 7/00* (2006.01)

(52) U.S. Cl.
USPC .......................................... 327/144; 327/141

(58) Field of Classification Search
USPC ......... 327/2, 3, 7, 12, 39, 40, 42, 47, 49, 141, 327/144, 146, 154, 155, 165; 375/375
See application file for complete search history.

(56) References Cited

U.S. PATENT DOCUMENTS

| | | | |
|---|---|---|---|
| 6,002,279 A * | 12/1999 | Evans et al. | ................... 327/144 |
| 6,483,360 B2 | 11/2002 | Nakamura | |
| 7,336,754 B2 | 2/2008 | Aoyama | |
| 7,512,051 B2 | 3/2009 | Hayashi | |
| 8,253,451 B1 * | 8/2012 | Hsieh et al. | ................... 327/141 |

FOREIGN PATENT DOCUMENTS

| | | |
|---|---|---|
| JP | 2002-050960 A | 2/2002 |
| JP | 2005-005999 A | 1/2005 |
| JP | 2005-100555 A | 4/2005 |
| JP | 2009-219021 A | 9/2009 |

* cited by examiner

*Primary Examiner* — Hai L Nguyen
(74) *Attorney, Agent, or Firm* — Sughrue Mion, PLLC

(57) ABSTRACT

A clock data recovery circuit which has a high degree of jitter tolerance and can alleviate increase in the phase number of a multi-phase clock, power consumption, and a semiconductor chip area is provided. Each circuit of plural edge detection circuits comprises a first edge detection circuit and a second edge detection circuit. The first detection circuit detects that a data edge leads in phase more than −1 phase from an edge detection phase, the second detection circuit detects that the data edge laggs in phase more than +1 phase from the edge detection phase. In response to the first output signal or the second output signal, the edge detection phase is changed by the amount of −1 phase or +1 phase. When the data edge is detected in the range of ±1 phase, a next edge detection phase is maintained in the current state.

20 Claims, 31 Drawing Sheets

CLOCK DATA RECOVERY CIRCUIT AND TRANSCEIVER SEMICONDUCTOR INTEGRATED CIRCUIT CONTAINING THE SAME

CROSS-REFERENCE TO RELATED APPLICATIONS

The disclosure of Japanese Patent Application No. 2011-245387 filed on Nov. 9, 2011 including the specification, drawings, and abstract is incorporated herein by reference in its entirety.

BACKGROUND

The present invention relates to a clock data recovery circuit and a semiconductor integrated circuit containing the same, and especially relates to technology which is effective in alleviating the increase of the phase number of a multi-phase clock, power consumption, and a semiconductor chip area of an oversampling digital clock data recovery circuit with a high degree of jitter tolerance.

In order to realize the two-way communications of high-speed and large-capacity data between a host and a device, high-speed interface specifications, such as USB, a serial ATA (Advanced Technology Attachment), and PCI Express, are proposed and put in practical use. As for many of those interface specifications, the serial transmission mode is adopted and data is transmitted at a frequency set beforehand. In a data receiving unit, a clock is reproduced from data received, and receive data is restored on the basis of the reproduced clock. The above-described restoration operation is realized by a clock data recovery circuit. Generally, data transferred from a transmitting unit is a signal superimposed with a jitter, under the influence of a signal distortion arising from transmission lines such as a cable and wiring in an LSI, intersymbol interference depending on a data signal pattern, thermal noise generated by a circuit element of a transceiver front end unit, voltage fluctuation of a power supply line inside the LSI, deviation of a clock frequency which exists between a host and a device, and others. A jitter is a time variation of a signal phase, accordingly, the edge position of a data signal which is superimposed with a jitter exhibits amount of fluctuation in time. The clock data recovery circuit is required to restore a clock and data even from a data signal superimposed with a jitter as described above.

The clock data recovery circuit includes two kinds: an analog clock data recovery circuit and an oversampling digital clock data recovery circuit. The analog clock data recovery circuit utilizes a phase locked loop (PLL) and synchronizes the phase of a built-in voltage-controlled oscillator (VCO) of the PLL with the phase of a received data signal. The oversampling digital clock data recovery circuit performs oversampling of receive data by a multi-phase clock, and determines the edge position of the receive data on the basis of the sampling information.

Patent Literature 1 cited bellow discloses that, on the basis of the receive data edge position information from a data selecting unit, a part of unnecessary clock signals in a multi-phase clock is stopped, in order to reduce power consumption in an oversampling digital clock data recovery circuit.

Patent Literature 2 discloses a clock data recovery circuit which comprises a phase detector, an integrator, a pattern generator, a mixer, and a phase interpolator, in order to reduce a circuit scale, a chip size, and power consumption. The phase detector inputs a data signal and a synchronous clock signal, detects the phase lead and the phase lag, and generates a first up/down signal. The integrator integrates the first up/down signal, and generates a second up/down signal and a third up/down signal. The pattern generator inputs the third up/down signal, and generates a fourth up/down signal. The mixer inputs the second up/down signal and the fourth up/down signal, and generates a fifth up/down signal. The phase interpolator interpolates the phase of the clock signal supplied on the basis of the fifth up/down signal, and the output clock from the phase interpolator is fed back to the phase detector as the clock signal.

Patent Literature 3 cited below discloses an oversampling digital clock data recovery circuit in which, in order to realize high resolution and high accuracy, a first multi-phase clock with a fixed phase and an equal phase interval and a second multi-phase clock with an equal but different phase interval are employed, and in which one clock of the first multi-phase clock and one clock of the second multi-phase clock are synchronized in phase, and the combination of the clocks to be synchronized in phase is switched.

Patent Literature 4 discloses an information processing device which comprises an edge position measuring unit, a jitter measuring unit, an edge interval measuring unit, a propagation-delay-difference control amount measuring unit, and a channel data discriminating unit, in order to reduce a propagation delay difference and an error factor and to realize highly accurate binarization control and a highly accurate reproduction. The edge position measuring unit measures an edge position in the time-axis of a binary signal by a multi-phase clock, the jitter measuring unit measures a jitter amount on the basis of the edge position information, and the edge interval measuring unit measures an edge interval length on the basis of the edge position information. On the basis of the measured jitter amount and edge interval length, the propagation-delay-difference control amount measuring unit calculates the control amount of the propagation delay difference between an input and an output of the comparator which generates the binary signal. The channel data discriminating unit reproduces the data corresponding to the channel clock on the basis of the edge position information. (Patent Literature)

(Patent Literature 1) Japanese Patent Laid-open No. 2009-219021

(Patent Literature 2) Japanese Patent Laid-open No. 2005-5999

(Patent Literature 3) Japanese Patent Laid-open No. 2002-50960

(Patent Literature 4) Japanese Patent Laid-open No. 2005-100555

SUMMARY

In the development of devices such as a semiconductor integrated circuit which employs recording media, including an HDD (Hard Disk Drive), a CD (Compact Disk), a DVD (Digital Versatile Disk), and a BD (Blu-ray Disc, "Blu-ray Disc" is a trademark of Blu-ray Disc Association), connectibility with various hosts is required in order to secure general versatility. In such a semiconductor integrated circuit which is required to secure general versatility, it has been an essential concern to supply it to a market at low prices. For this reason, it is required that a semiconductor integrated circuit should be mass-produced with a small chip area.

The present inventors have been engaged, in advance of the present invention, in the research and development of devices such as a semiconductor integrated circuit which employs recording media including an HDD, a CD, a DVD, and a BD, which are connectable with various kinds of hosts.

In the research and development of the devices, in order to alleviate spurious radiation in coupling with a host, a serial ATA interface using a spread spectrum clock generator (SSCG) was adopted.

Also in the research and development of the devices, in order to reproduce a frequency diffused clock and a transmit signal with high accuracy, in the state where the clock signal frequency of the receive signal from the host is spread by the serial ATA interface using a spread spectrum clock generator (SSCG), adoption of a clock data recovery circuit was considered.

<<A Configuration of the Device Examined in Advance of the Present Invention>>

FIG. 1 illustrates a configuration of a device configured by a semiconductor integrated circuit employing a recording medium, examined by the present inventors in advance of the present invention.

The following explains in detail a transceiver LSI 7 which configures the device illustrated in FIG. 1.

Generally, there is a serial ATA interface unit of standards, for example as an interface for coupling a memory medium (peripheral device), such as an optical disk device or a hard disk drive unit, to a computer, such as a personal computer. By employing the serial ATA, various kinds of memory media can be coupled to a computer under a command and control software with compatibility. In the device illustrated in FIG. 1, an optical disk device is adopted as a memory medium, and this peripheral device is coupled with a host computer by a serial ATAPI. ATAPI is the abbreviation for Advanced Technology Attachment Peripheral Interface.

The optical disk device illustrated in FIG. 1 is comprised of an optical disk 5, an optical pickup 6, a transceiver LSI 7, and a crystal oscillator 3, and is coupled to a host computer (HOST) 2 with a serial ATAPI system.

The optical pickup 6 irradiates the optical disk 5 with an optical beam, and performs read and write of data. The transceiver LSI 7 comprises a recording/reproduction unit (READ/WRITE) 8 which performs data writing and data reading of the optical pickup 6, and an interface unit (ATAPI) 11 which generates the data of the recording/reproduction unit 8 to the host computer (HOST) 2.

The interface unit (ATAPI) 11 comprises a serializer (SER) 14, a first PLL circuit (PLL1) 16, a second PLL circuit (PLL2) 13, a deserializer (DES) 15, and a clock data recovery circuit (CDR) 1.

In data reading from the optical disk as the peripheral device, the serializer (SER) 14 as a parallel-to-serial converter converts parallel transmit data from the recording/reproduction unit 8 into a serial transmit signal which is synchronized with a clock supplied from the second PLL circuit (PLL2) 13, and generates the data to the host computer 2. That is, in the data reading from the optical disk 5, the serializer (SER) 14 of the interface unit (ATAPI) 11 converts the parallel transmit data from the recording/reproduction unit 8 into the serial transmit signal TXDATA which is synchronized with the clock CLK02 supplied from the second PLL circuit (PLL2) 13, and generates the data to the host computer 2. In that case, the second PLL circuit (PLL2) 13 configures a spread spectrum clock generator (SSCG) by a fractional PLL circuit including a ΣΔ-modulator; accordingly, it is possible to suppress spurious radiation due to the serial transmit signal TXDATA.

On the other hand, in data writing to the optical disk as the peripheral device, the clock data recovery circuit (CDR) 1 receives a received data signal RXDATA from the host computer 2, generates serial reproduction data RDATA and a reproduction clock RCLK in response to the clock CLK01 supplied from the first PLL circuit (PLL1) 16, and generates the data to the deserializer (DES) 15. The deserializer (DES) 15 as a serial-to-parallel converter generates parallel receive data from the serial reproduction data RDATA and the reproduction clock RCLK, and the data writing to the optical disk is executed.

That is, in the data writing to the optical disk 5, the clock data recovery circuit (CDR) 1 of the interface unit (ATAPI) 11 receives the received data signal RXDATA from the host computer 2, generates the serial reproduction data RDATA and the reproduction clock RCLK in response to the clock CLK01 supplied from the first PLL circuit (PLL1) 16, and generates the data to the deserializer (DES) 15. The deserializer (DES) 15 generates the parallel receive data from the serial reproduction data RDATA and the reproduction clock RCLK, and outputs the data to the recording/reproduction unit 8; accordingly the data writing to the optical disk 5 is executed. The reproduction clock RCLK reproduced by the clock data recovery circuit (CDR) 1 is supplied to the input terminal of the first PLL circuit (PLL1) 16 as a reference frequency signal. As a result, the frequency of the clock CLK01 generated by the first PLL circuit (PLL1) 16 can be changed, following changes of the clock signal frequency of the received data signal RXDATA and the frequency of the reproduction clock RCLK from the host computer 2 by the serial ATA interface using a spread spectrum. Therefore, even in the state where the clock frequency changes by the serial ATA interface using the spread spectrum, the clock data recovery circuit (CDR) 1 of the interface unit (ATAPI) 11 can generate the serial reproduction data RDATA and the reproduction clock RCLK.

However, the present inventors have clarified the issue that, since the transceiver LSI 7 illustrated in FIG. 1 comprises the first PLL circuit (PLL1) 16 and the second PLL circuit (PLL2) 13, the power consumption thereof is great and the semiconductor chip area thereof is also large. In particular, a loop filter (LP) included in the PLL circuit comprises a capacitive element and a resistive element which have a large chip occupation area, and a voltage-controlled oscillator (VCO) included in the PLL circuit comprises a multi stage CMOS inverter chain; therefore, the transceiver LSI 7 illustrated in FIG. 1 has great power consumption and a large chip occupation area.

Therefore, in advance of the present invention, the present inventors examined the sharing of a single PLL circuit by the first PLL circuit (PLL1) 16 and the second PLL circuit (PLL2) 13, in order to reduce the semiconductor chip area of the transceiver LSI 7 illustrated in FIG. 1, which was examined by the present inventors in advance of the present invention.

In the present sharing, in response to a clock generated by the single shared PLL circuit, the serializer (SER) 14 converts the parallel transmit data from the recording/reproduction unit 8 into the serial transmit data TXDATA, and generates the data to the host computer 2. On the other hand, in response to the clock generated by the single shared PLL circuit, the clock data recovery circuit (CDR) 1 receives the received data signal RXDATA from the host computer 2 and generates the serial reproduction data RDATA and the reproduction clock RCLK, and generates the data to the deserializer (DES) 15.

On the other hand, in the present sharing, the phase of the reproduction clock RCLK generated by the clock data recovery circuit (CDR) 1 and the phase of the clock signal generated by a single PLL circuit are in an asynchronous relation. Therefore, in the clock data recovery circuit (CDR) 1 which employs the single PLL circuit, the received data signal RXDATA is oversampled by the multi-phase clock generated by the single PLL, and the edge position of the receive data is determined on the basis of the sampling information. By defining the clock of a phase which is separated by 0.5 UI from the determined edge position as the reproduction clock RCLK of the clock data recovery circuit, and by defining the sampling data sampled by the clock of a phase which is separated by 0.5 UI as the reproduction data, the operation of following the receive data is performed. This is the operation of the oversampling digital clock data recovery circuit. Here, UI is the abbreviation for unit interval. UI is a period of a 1-bit data signal, and a reciprocal of a transfer bit rate. It is employed also to indicate the degree of a jitter, for example.

<<The Clock Data Recovery Circuit Examined in Advance of the Present Invention>>

FIG. 2 illustrates a configuration of an oversampling digital clock data recovery circuit examined by the present inventors in advance of the present invention.

As illustrated in FIG. 2, the received data signal RXDATA is oversampled by multi-phase clock signals CLK0-CLK9 with frequency equivalent to the number of bit rate of the received data signal RXDATA in a sampling circuit 100; consequently, ten sampling data Sample_Φ0-Sample_Φ9 are generated. The ten sampling data Sample_Φ0-Sample_Φ9 are inputted into an edge detection circuit 101, and the edge detection circuit 101 determines the position of the data edge by observing a point where a high level and a low level of the sampling data stream are switched.

For example, when eight pieces of the sampling data Sample_Φ0-Sample_Φ7 are at a low level and two pieces of the sampling data Sample_Φ8-Sample_Φ9 are at a high level, it turns out that the edge of the received data signal RXDATA exists between the rising edge of the 8th phase clock signal CLK7 and the rising edge of the 9th phase clock signal CLK8 of the 10-phase clock signals CLK0-CLK9. It is defined that the reproduction clock RCLK is given by the third phase clock signal CLK2 which is the clock separated by 0.5 UI from the edge position of the received data signal RXDATA determined by the edge detection circuit 101 (that is, the clock phase being furthest from two adjoining receive data edges). It is also defined that the reproduction data RDATA is given by the data Sample_Φ2 which is the received data signal RXDATA sampled by the rising edge of the third phase clock signal CLK2.

On the other hand, the analog clock data recovery circuit employs a PLL as described above; accordingly, the semiconductor chip area thereof is large and the power consumption thereof is great. Therefore, the oversampling digital clock data recovery circuit is increasingly adopted in recent years. Also as for the oversampling digital clock data recovery circuit, various circuit configurations are considered for realizing further low power consumption.

Jitter tolerance of the oversampling digital clock data recovery circuit is dependent on the phase number of a multi-phase clock, and the jitter tolerance improves by increase of the phase number of the multi-phase clock. The oversampling digital clock data recovery circuit determines only that a receive data edge exists between the edges of which of two adjoining clock signals in the multi phases of the multi-phase clock, and it cannot specify the precise position information of the receive data edge. Accordingly, a certain amount of quantization errors is included. For example, the following assumes the case where, in an oversampling digital clock data recovery circuit in which the multi-phase clock has six phases, the edge of the received data signal RXDATA exists between the rising edge of the fourth phase clock signal CLK3 and the rising edge of the fifth phase clock signal CLK4. In this case, when the receive data edge exists extremely near the rising edge of the fourth phase clock signal CLK3, and conversely, when the receive data edge exists extremely near the rising edge of the fifth phase clock signal CLK4, the same edge detection result is obtained. That is, when the receive data edge exists between the rising edge of the fourth phase clock signal CLK3 and the rising edge of the fifth phase clock signal CLK4 and when the receive data edge exists extremely near the rising edge of the fourth phase clock signal CLK3, it is determined that the detection edge of the receive data exists in the position of the fourth phase clock signal CLK3; accordingly, the quantization error becomes approximately 0 UI. However, when the receive data edge exists between the rising edge of the fourth phase clock signal CLK3 and the rising edge of the fifth phase clock signal CLK4, and when the receive data edge exists extremely near the rising edge of the fifth phase clock signal CLK4, it is similarly determined that the detection edge of the receive data exists in the position of the fourth phase clock signal CLK3, and the quantization error becomes (1/6) UI. With reference to FIG. 3 illustrated in the following, the relation of the quantization error and the jitter tolerance is explained.

FIG. 3 illustrates operation of the clock data recovery circuit in the case of setting the phase number of a multi-phase clock to six phases and 12 phases, in the oversampling digital clock data recovery circuit examined by the present inventors in advance of the present invention, as illustrated in FIG. 2.

That is, FIG. 3 explains the relation between the received data signal RXDATA and the reproduction data RDATA and the reproduction clock RCLK, in the case of setting the phase number of the multi-phase clock to six phases and 12 phases, in the oversampling digital clock data recovery circuit illustrated in FIG. 2.

The data continuation time for one bit of the received data signal RXDATA from timing t=t1 to timing t=t2 is 1.0 UI. The oversampling digital clock data recovery circuit illustrated in FIG. 2 of which the phase number of the multi-phase clock is six phases has a resolution that the 1-bit data continuation time (1.0 UI) of the received data signal RXDATA from timing t=t1 to timing t=t2 is divided into six equal parts. When the phase number of the multi-phase clock is 12 phases, the oversampling digital clock data recovery circuit has a resolution that the 1-bit data continuation time is divided into 12 equal parts.

As illustrated in FIG. 3, the received data signal RXDATA changes from a high level to a low level at timing t=t1. The oversampling digital clock data recovery circuit detects the data edge position of the received data signal RXDATA at timing t=t1, and reflects the detection result to the phase of the reproduction clock RCLK. As described above, the phase of the reproduction clock RCLK generated by the clock data recovery circuit becomes a phase separated by 0.5 UI from the data edge of the received data signal RXDATA. However, the phase of the reproduction clock RCLK has a quantization error of the magnitude corresponding to the phase number of the multi-phase clock.

As illustrated in the middle part of FIG. 3, when the phase number of the multi-phase clock is six phases, the maximum quantization error of the phase of the reproduction clock RCLK is (1/6) UI. Therefore, a clock signal which has a phase separated by (1/3) UI from the data edge of the received data signal RXDATA may be selected as the reproduction clock RCLK from the multi-phase clock. In this case, when data having a jitter of the magnitude of (1/3) UI is supplied during the time progress from timing t=t2 to timing t=t3 as the received data signal RXDATA, the timing of the next data edge will move from timing t=t3 to timing t=t4. Due to the jitter caused by the present data edge movement, the edge of the received data signal RXDATA and the rising edge of the reproduction clock RCLK overlap at timing t=t4; therefore, the level of the reproduction data RDATA which should be a low level when there is no jitter becomes a high level, and an error will occur in the reproduction data RDATA.

On the other hand, as illustrated in the lower part of FIG. 3, when the phase number of the multi-phase clock is 12 phases, the maximum quantization error of the phase of the reproduction clock RCLK is (1/12) UI. Therefore, a clock signal which has a phase separated by (5/12) UI from the data edge of the received data signal RXDATA may be selected as the reproduction clock RCLK from the multi-phase clock. In this case, as in the above-described case where the phase number of the multi-phase clock is six phases, when data having a jitter of the magnitude of (1/3) UI is supplied during the time progress from timing t=t2 to timing t=t3 as the received data signal RXDATA, the timing of the next data edge will move from timing t=t3 to timing t=t4. Even when a jitter occurs due to the data edge movement, the reproduction clock RCLK rises after the falling of the jittered data edge of the received data signal RXDATA at timing t=t4. Accordingly, the reproduction data RDATA becomes a low level correctly, and an error does not occur in the reproduction data RDATA.

That is, when the phase number of the multi-phase clock is 12 phases, compared with the case where the phase number of the multi-phase clock is six phases, even when data having a jitter of the magnitude of (1/3) UI is supplied during the time progress from timing t=t2 to timing t=t3 as the received data signal RXDATA, there is an operation margin for (1/12) UI in occurrence of a reproduction error of the reproduction data RDATA.

Therefore, when compared with the case where the phase number of the multi-phase clock are six phases, in the oversampling digital clock data recovery circuit of which the phase number of the multi-phase clock is 12 phases, it is understood that jitter tolerance is improved by the amount equal to the difference (1/12) UI between the quantization error (1/6) UI for the case where the phase number of the multi-phase clock is six phases and the quantization error (1/12) UI for the case where the phase number of the multi-phase clock is 12 phases. That is, it is understood that jitter tolerance of the oversampling digital clock data recovery circuit is dependent on the phase number of a multi-phase clock, and the jitter tolerance improves by increase of the phase number of the multi-phase clock.

However, increase of the phase number of the multi-phase clock of the oversampling digital clock data recovery circuit is accompanied by not only increase of the consumption current and the area of the clock data recovery circuit itself, but increase of the consumption current and the semiconductor chip area of the phase locked loop (PLL) for generating the multi-phase clock. That is, it is understood that there exists a trade-off between the jitter tolerance and the consumption current/semiconductor chip area in the oversampling digital clock data recovery circuit.

It has also been examined by the present inventors in advance of the present invention that the technologies respectively disclosed by Patent Literature 1, Patent Literature 2, Patent Literature 3, and Patent Literature 4 cited above are applied in order to dissolve the trade-off between the jitter tolerance and the consumption current/semiconductor chip area.

However, the examination result by the present inventors has clarified the following issue: that is, the technology disclosed by Patent Literature 1 cuts off a multi-phase clock of a unnecessary phase, however the PLL for generating the multi-phase clock needs to generate the multi-phase clock of the phase number required for a necessary accuracy, and the reduction effect of consumption current is restrictive. It has been clarified that technology disclosed by Patent Literature 1 also has the following issue: that is, when an excessive jitter is superimposed on a data signal, the timing of the change edge of the reproduction clock of the phase under cutoff and the timing of a data edge may overlap; accordingly, it is likely that an error may occur in the reproduction data.

The examination result by the present inventors has clarified the following issue: that is, the technology disclosed by Patent Literature 2 can reduce the power consumption/semiconductor chip area by reducing the clock phase number of the PLL; however, in that case, a phase interpolator is necessary and the consumption current and the semiconductor chip area for the phase interpolator increase.

The examination result by the present inventors has clarified the following issue: that is, the technology disclosed by Patent Literature 3 requires two separate PLLs in order to generate the first multi-phase clock and the second multi-phase clock; accordingly the power consumption and the semiconductor chip area increase.

The examination result by the present inventors has clarified the following issue: that is, the technology disclosed by Patent Literature 4 requires not only a jitter measuring circuit but a digital-analog converter (DAC) for adjusting the slice level voltage of a comparator which generates a binary signal in response to the output of the propagation-delay-difference control amount measuring unit; accordingly, the power consumption and the semiconductor chip area increase.

The present invention has been made as the result of the above-described examination which has been performed by the present inventors in advance of the present invention.

Therefore, the purpose of the present invention is to provide an oversampling digital clock data recovery circuit which has a high degree of jitter tolerance and can alleviate increase in the phase number of the multi-phase clock, the power consumption, and the semiconductor chip area.

The above and other purposes and new features of the present invention will become clear from the description of the present specification and the accompanying drawings.

The following explains briefly typical inventions to be disclosed by the present application.

That is, a typical embodiment of the present invention is a clock data recovery circuit (1) which comprises a sampling circuit (106), an edge detector (105), a phase selection signal generating circuit (103), and a clock data generating circuit (104).

The sampling circuit (106) samples a received data signal (RXDATA) by multi-phase clock signals (CLK0-CLK5) and generates plural sampling signals (Sample_Φ0-Sample_Φ5).

The edge detector (105) responds to the sampling signals (Sample_Φ0-Sample_Φ5) and the multi-phase clock signals (CLK0-CLK5), and generates plural edge detection signals (Edge_Φ0-Edge_Φ5).

The phase selection signal generating circuit (103) responds to the edge detection signals (Edge_Φ0-Edge_Φ5) and the multi-phase clock signals (CLK0-CLK5), and generates plural phase selection signals (PSEL_Φ0-PSEL_Φ5).

The clock data generating circuit (104) responds to the sampling signals (Sample_Φ0-Sample_Φ5), the phase selection signals (PSEL_Φ0-PSEL_Φ5), and the multi-phase clock signals (CLK0-CLK5), and generates a reproduction clock (RCLK) and reproduction data (RDATA).

The edge detector (105) comprises plural edge detection circuits (105M: M=0-5). The plural edge detection circuits (105M) of the edge detector (105) respond to the sampling signals (Sample_Φ0-Sample_Φ5) and the multi-phase clock signals (CLK0-CLK5), and generate the plural edge detection signals (Edge_Φ0-Edge_Φ5).

Each edge detection circuit of the plural edge detection circuits (105M) comprises a first edge detection circuit (105M1) and a second edge detection circuit (105M2) (refer to FIG. 4).

When the first edge detection circuit (105M1) detects that an data edge of the received data signal supplied currently is leading more than −1 phase of the multi-phase clock signals from an edge detection phase of one edge detection clock signal corresponding to the data edge detection phase of the each edge detection circuit among the multi-phase clock signals, the first edge detection circuit (105M1) generates a first edge detection output signal (DN_ΦM).

When the second edge detection circuit (105M2) detects that the data edge of the received data signal supplied currently is lagging more than +1 phase of the multi-phase clock signals from the edge detection phase of one edge detection clock signal corresponding to the data edge detection phase of the each edge detection circuit among the multi-phase clock signals, the second edge detection circuit (105M2) generates a second edge detection output signal (UP_ΦM).

In response to the first edge detection output signal (DN_ΦM) or the second edge detection output signal (UP_ΦM), a next edge detection phase of the edge detector (105) is changed by the amount of −1 phase, or +1 phase from the edge detection phase of the one edge detection clock signal.

The first edge detection circuit (105M1) and the second edge detection circuit (105M2) are able to detect that the data edge of the received data signal supplied currently lies in the range of ±1 phase of the multi-phase clock signals from the edge detection phase of one edge detection clock signal corresponding to the data edge detection phase of the each edge detection circuit among the multi-phase clock signals.

When the first edge detection circuit (105M1) and the second edge detection circuit (105M2) detect that the data edge of the received data signal supplied currently lies in the range of ±1 phase, the next edge detection phase of the edge detector (105) is maintained at the edge detection phase of the one edge detection clock signal (refer to FIG. 6).

The following explains briefly an effect obtained by the typical inventions to be disclosed in the present application.

That is, according to the present invention, it is possible to provide an oversampling digital clock data recovery circuit which has a high degree of jitter tolerance and can alleviate increase in the phase number of the multi-phase clock, the power consumption, and the semiconductor chip area.

BRIEF DESCRIPTION OF THE DRAWINGS

The present invention will become fully understood from the detailed description given hereinafter and the accompanying drawings and wherein.

DETAILED DESCRIPTION

Figure 1:
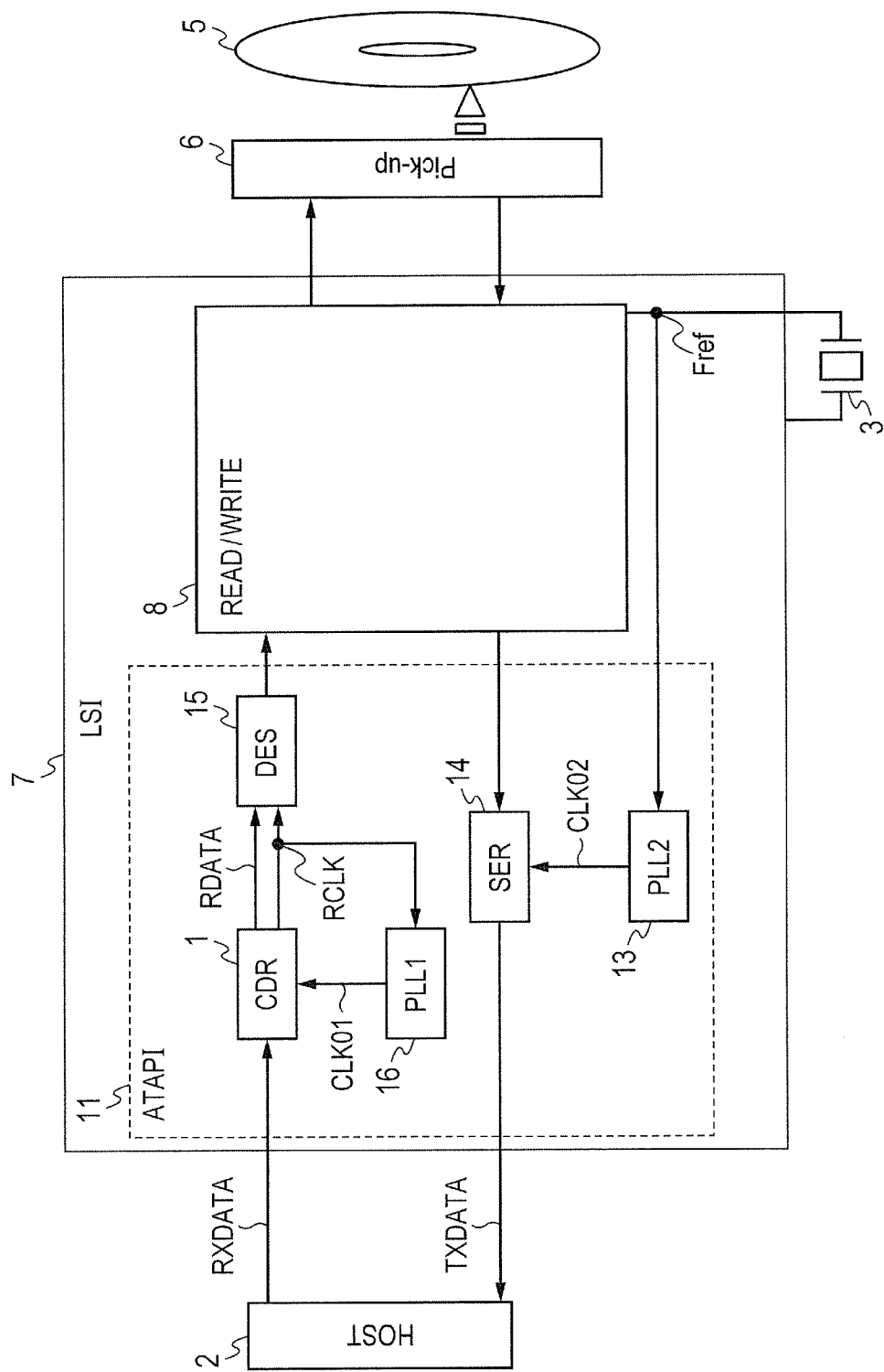
FIG. 1 is a drawing illustrating a configuration of a device comprised of a semiconductor integrated circuit employing a recording medium, examined by the present inventors in advance of the present invention.

Hereinafter, with reference to the accompanying drawings, the embodiments of the present invention are explained in detail.

1. Outline of Embodiment

First, an outline of a typical embodiment of the invention disclosed in the present application is explained. A numerical symbol of the drawing referred to in parentheses in the outline explanation about the typical embodiment only illustrates what is included in the concept of the component to which the numerical symbol is attached.

(1) A typical embodiment of the present invention is a clock data recovery circuit (1) which comprises a sampling circuit (106), an edge detector (105), a phase selection signal generating circuit (103), and a clock data generating circuit (104).

The sampling circuit (106) samples a received data signal (RXDATA) by multi-phase clock signals (CLK0-CLK5) and generates plural sampling signals (Sample_Φ0-Sample_Φ5).

The edge detector (105) responds to the sampling signals (Sample_Φ0-Sample_Φ5) and the multi-phase clock signals (CLK0-CLK5), and generates plural edge detection signals (Edge_Φ0-Edge_Φ5).

The phase selection signal generating circuit (103) responds to the edge detection signals (Edge_Φ0-Edge_Φ5) and the multi-phase clock signals (CLK0-CLK5), and generates plural phase selection signals (PSEL_Φ0-PSEL_Φ5).

The clock data generating circuit (104) responds to the sampling signals (Sample_Φ0-Sample_Φ5), the phase selection signals (PSEL_Φ0-PSEL_Φ5), and the multi-phase clock signals (CLK0-CLK5), and generates a reproduction clock (RCLK) and reproduction data (RDATA).

The edge detector (105) comprises plural edge detection circuits (105M: M=0-5). The plural edge detection circuits (105M) of the edge detector (105) respond to the sampling signals (Sample_Φ0-Sample_Φ5) and the multi-phase clock signals (CLK0-CLK5), and generate the plural edge detection signals (Edge_Φ0-Edge_Φ5).

Figure 4:
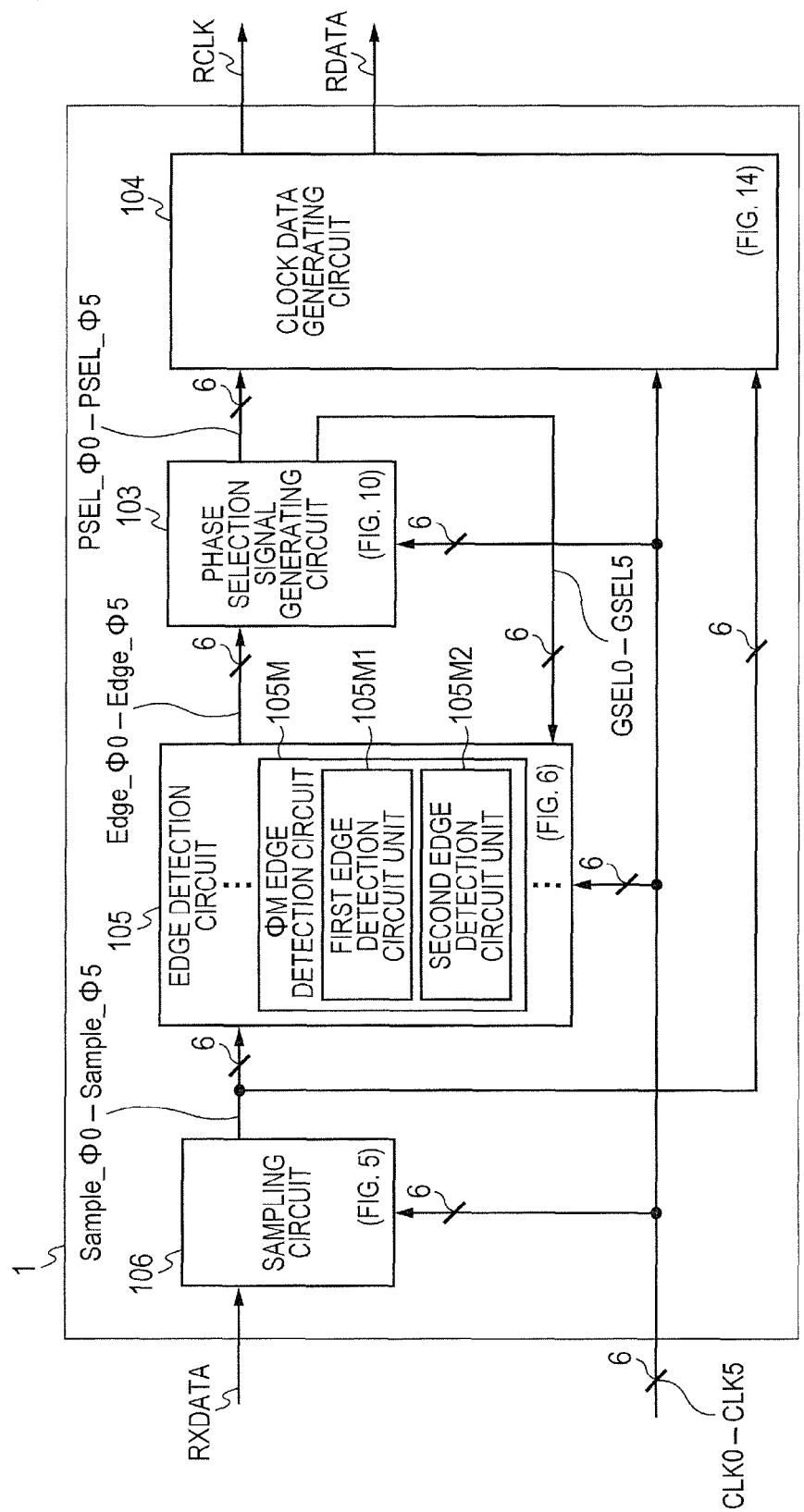
FIG. 4 is a drawing illustrating a configuration of a clock data recovery circuit 1, according to Embodiment 1 of the present invention.

Each edge detection circuit of the plural edge detection circuits (105M) comprises a first edge detection circuit (105M1) and a second edge detection circuit (105M2) (refer to FIG. 4).

When the first edge detection circuit (105M1) detects that an data edge of the received data signal supplied currently is leading more than −1 phase of the multi-phase clock signals from an edge detection phase of one edge detection clock signal corresponding to the data edge detection phase of the each edge detection circuit among the multi-phase clock signals, the first edge detection circuit (105M1) generates a first edge detection output signal (DN_ΦM).

When the second edge detection circuit (105M2) detects that the data edge of the received data signal supplied currently is lagging more than +1 phase of the multi-phase clock signals from the edge detection phase of one edge detection clock signal corresponding to the data edge detection phase of the each edge detection circuit among the multi-phase clock signals, the second edge detection circuit (105M2) generates a second edge detection output signal (UP_ΦM).

In response to the first edge detection output signal (DN_ΦM) or the second edge detection output signal (UP_ΦM), a next edge detection phase of the edge detector (105) is changed by the amount of −1 phase, or +1 phase from the edge detection phase of the one edge detection clock signal.

The first edge detection circuit (105M1) and the second edge detection circuit (105M2) are able to detect that the data edge of the received data signal supplied currently lies in the range of ±1 phase of the multi-phase clock signals from the edge detection phase of one edge detection clock signal corresponding to the data edge detection phase of the each edge detection circuit among the multi-phase clock signals.

Figure 6:
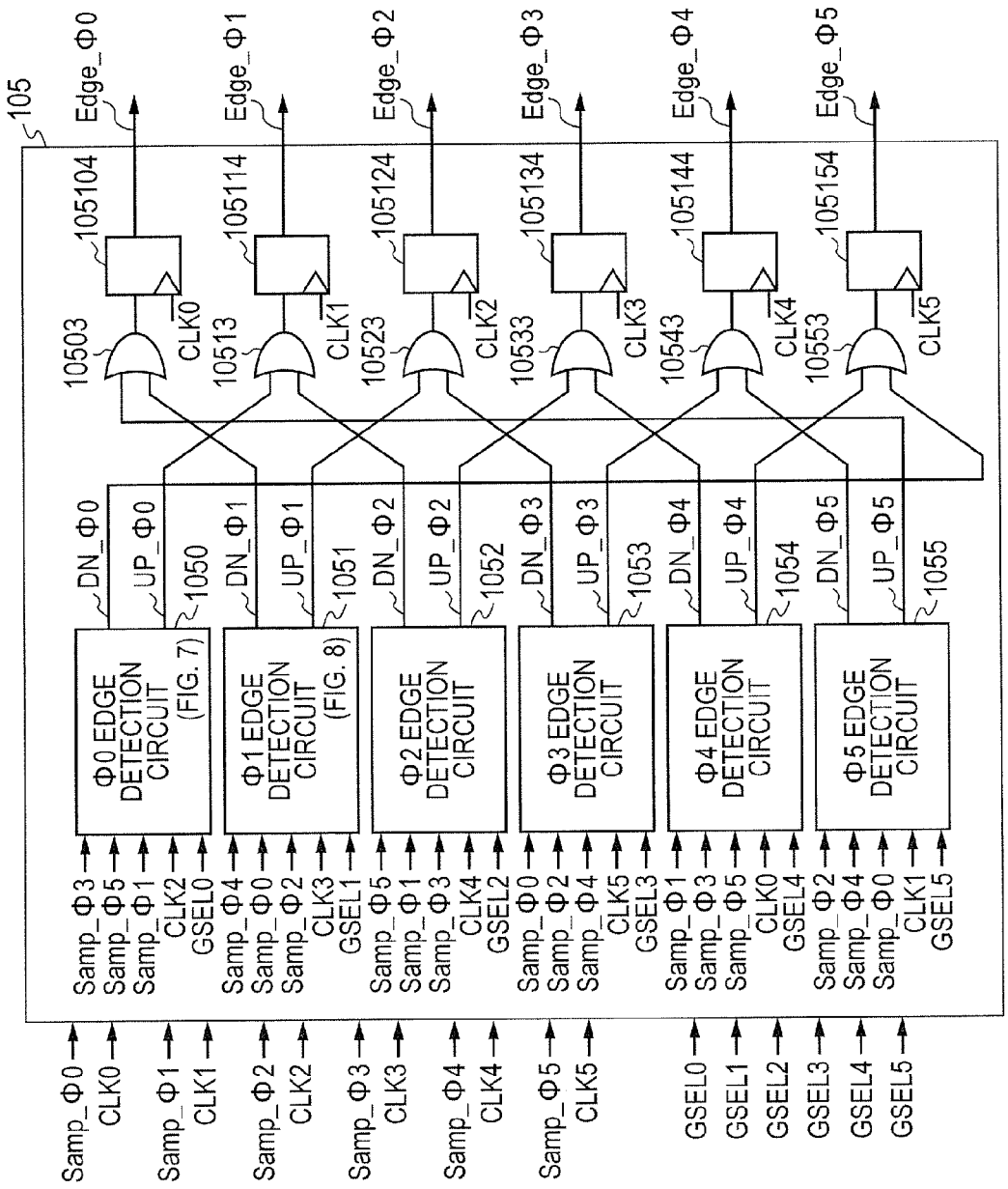
FIG. 6 is a drawing illustrating a configuration of an edge detection circuit 105 of the clock data recovery circuit 1, according to Embodiment 1 of the present invention illustrated in FIG. 4.

When the first edge detection circuit (105M1) and the second edge detection circuit (105M2) detect that the data edge of the received data signal supplied currently lies in the range of ±1 phase, the next edge detection phase of the edge detector (105) is maintained at the edge detection phase of the one edge detection clock signal (refer to FIG. 6).

According to the present embodiment, it is possible to provide an oversampling digital clock data recovery circuit which has a high degree of jitter tolerance and can alleviate increase in the phase number of the multi-phase clock, the power consumption, and the semiconductor chip area.

In a preferred embodiment, the phase selection signal generating circuit (103) responds to the edge detection signals (Edge_Φ0-Edge_Φ5) and the multi-phase clock signals (CLK0-CLK5) and further generates plural gate control signals (GSEL_Φ0-GSEL_Φ5).

The plural gate control signals (GSEL_Φ0-GSEL_Φ5) generated by the phase selection signal generating circuit (103) are supplied to the plural edge detection circuits (105M) of the edge detector (105).

One edge detection signal of the plural edge detection signals (Edge_Φ0-Edge_Φ5) generated by the edge detector (105) is set to a predetermined voltage level for indicating one clock signal corresponding to the data edge of the received data signal supplied currently of the multi-phase clock signals (CLK0-CLK5).

In response to the one edge detection signal set at the predetermined voltage level, one gate control signal of the plural gate control signals (GSEL_Φ0-GSEL_Φ5) generated by the phase selection signal generating circuit (103) is set at a predetermined signal level.

One edge detection circuit to which the one gate control signal set at the predetermined signal level is supplied among the plural edge detection circuits (105M) of the edge detector (105) is controlled to an active state, and the other edge detection circuits of the plural edge detection circuits (105M) of the edge detector (105) are controlled to a non-active state (refer to FIG. 4).

According to the preferred embodiment, it becomes possible to reduce the power consumption furthermore.

In another preferred embodiment, the phase selection signal generating circuit (103) comprises plural phase selection signal generating circuits (1030-1035) which generate the plural phase selection signals (PSEL_Φ0-PSEL_Φ5) and the plural gate control signals (GSEL_Φ0-GSEL_Φ5).

Figure 10:
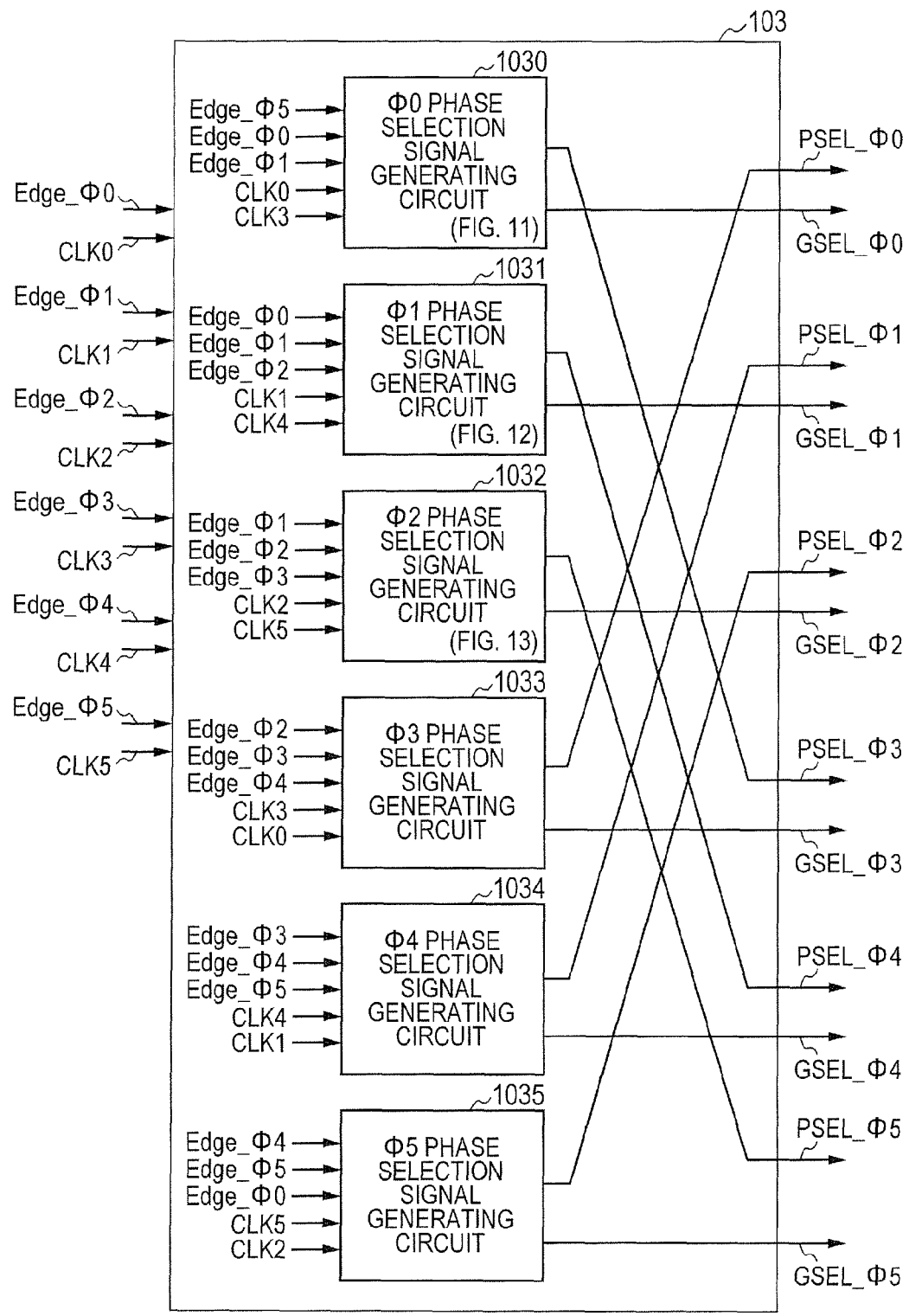
FIG. 10 is a drawing illustrating a configuration of a phase selection signal generating circuit 103 of the clock data recovery circuit 1, according to Embodiment 1 of the present invention illustrated in FIG. 4.

One phase selection signal and one gate control signal which are generated by each phase selection signal generating circuit of the plural phase selection signal generating circuits (1030-1035) have a phase difference of 0.5 unit intervals substantially (refer to FIG. 10).

According to yet another preferred embodiment, the first edge detection circuit (10501) and the second edge detection circuit (10502) of the each edge detection circuit (1050) of the plural edge detection circuits comprise a first exclusive OR circuit (105010) and a second exclusive OR circuit (105020), respectively.

A first input signal and a first reference signal are supplied to the first exclusive OR circuit (105010) of the first edge detection circuit (10501). A second input signal and a second reference signal are supplied to the second exclusive OR circuit (105020) of the second edge detection circuit (10502).

The first input signal supplied to the first exclusive OR circuit (105010) is a one-phase-leading sampling signal (Samp_Φ5) which is formed from the received data signal (RXDATA) sampled by a one-phase-leading clock signal (CLK5) of the multi-phase clock signals, leading by −1 phase as compared with the one edge detection clock signal corresponding to the data edge detection phase of the each edge detection circuit.

The first reference signal supplied to the first exclusive OR circuit (105010) is a multi-phase-leading sampling signal (Samp_Φ3) which is formed from the received data signal (RXDATA) sampled by a multi-phase-leading clock signal (CLK3) of the multi-phase clock signals, leading by −2 phases or more as compared with the one edge detection clock signal corresponding to the data edge detection phase of the each edge detection circuit. The second input signal supplied to the second exclusive OR circuit (105020) is a one-phase-lagging sampling signal (Samp_Φ1) which is formed from the received data signal (RXDATA) sampled by a one-phase-lagging clock signal (CLK1) of the multi-phase clock signals, lagging by +1 phase as compared with the one edge detection clock signal corresponding to the data edge detection phase of the each edge detection circuit.

The second reference signal supplied to the second exclusive OR circuit (105020) is a multi-phase-lagging sampling signal (Samp_Φ3) which is formed from the received data signal (RXDATA) sampled by a multi-phase-lagging clock signal (CLK3) of the multi-phase clock signals, lagging by +2 phases or more as compared with the one edge detection clock signal corresponding to the data edge detection phase of the each edge detection circuit.

In response to the output signal of the predetermined level of the first exclusive OR circuit (105010), the each edge detection circuit (1050) of the plural edge detection circuits generates the first edge detection output signal (DN_Φ0).

Figure 7:
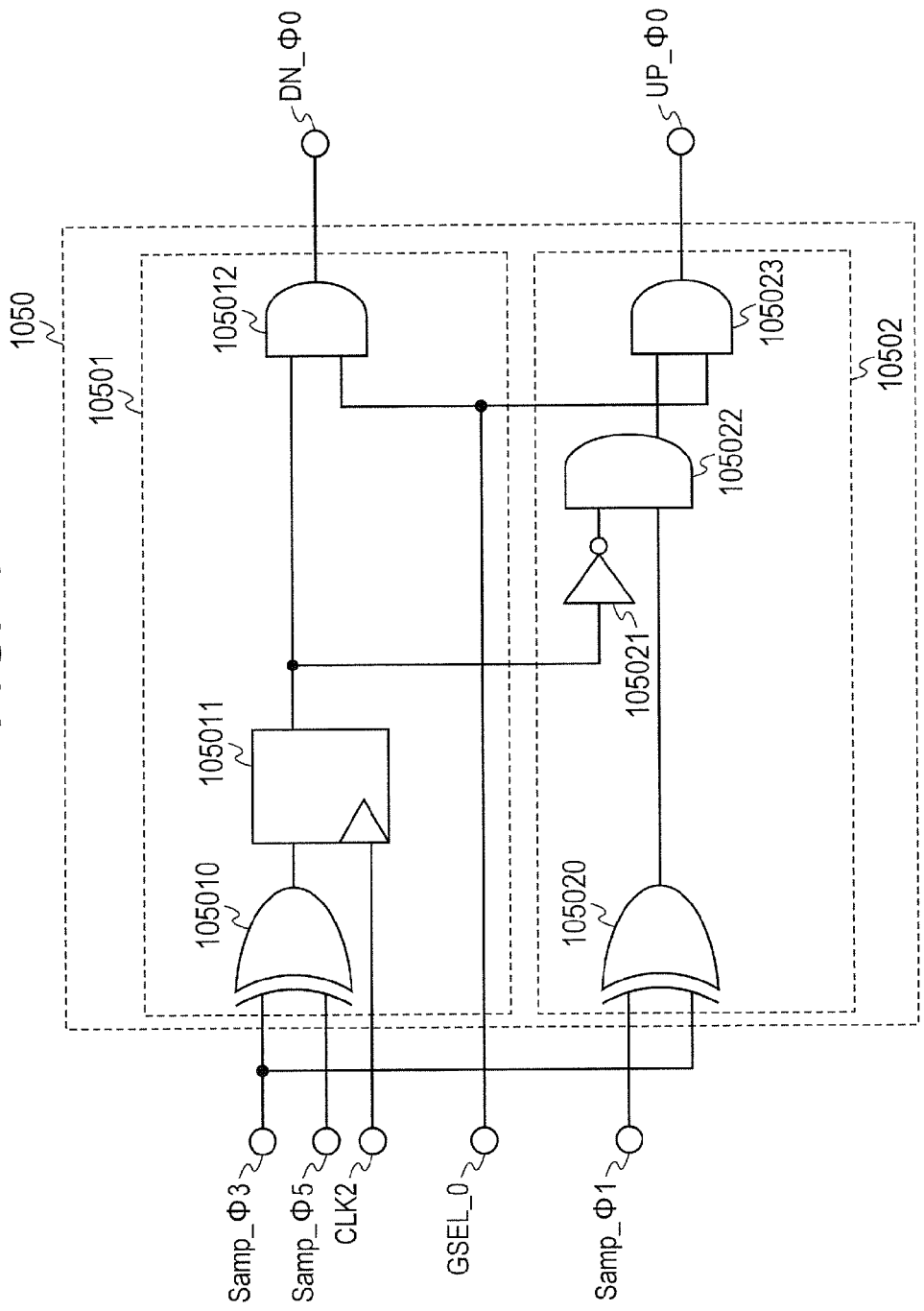
FIG. 7 is a drawing illustrating a configuration of a Φ0 edge detection circuit 1050 included in the edge detection circuit 105, according to Embodiment 1 of the present invention illustrated in FIG. 6.

In response to the output signal of the predetermined level of the second exclusive OR circuit (105020), the each edge detection circuit (1050) of the plural edge detection circuits generates the second edge detection output signal (UP_Φ0) (refer to FIG. 7).

In another more preferred embodiment, in initializing operation at the time of power-on or standby cancellation, one arbitrary gate control signal of the plural gate control signals (GSEL_Φ0-GSEL_Φ5) generated by the phase selection signal generating circuit (103) is set at the predetermined signal level.

Figure 15:
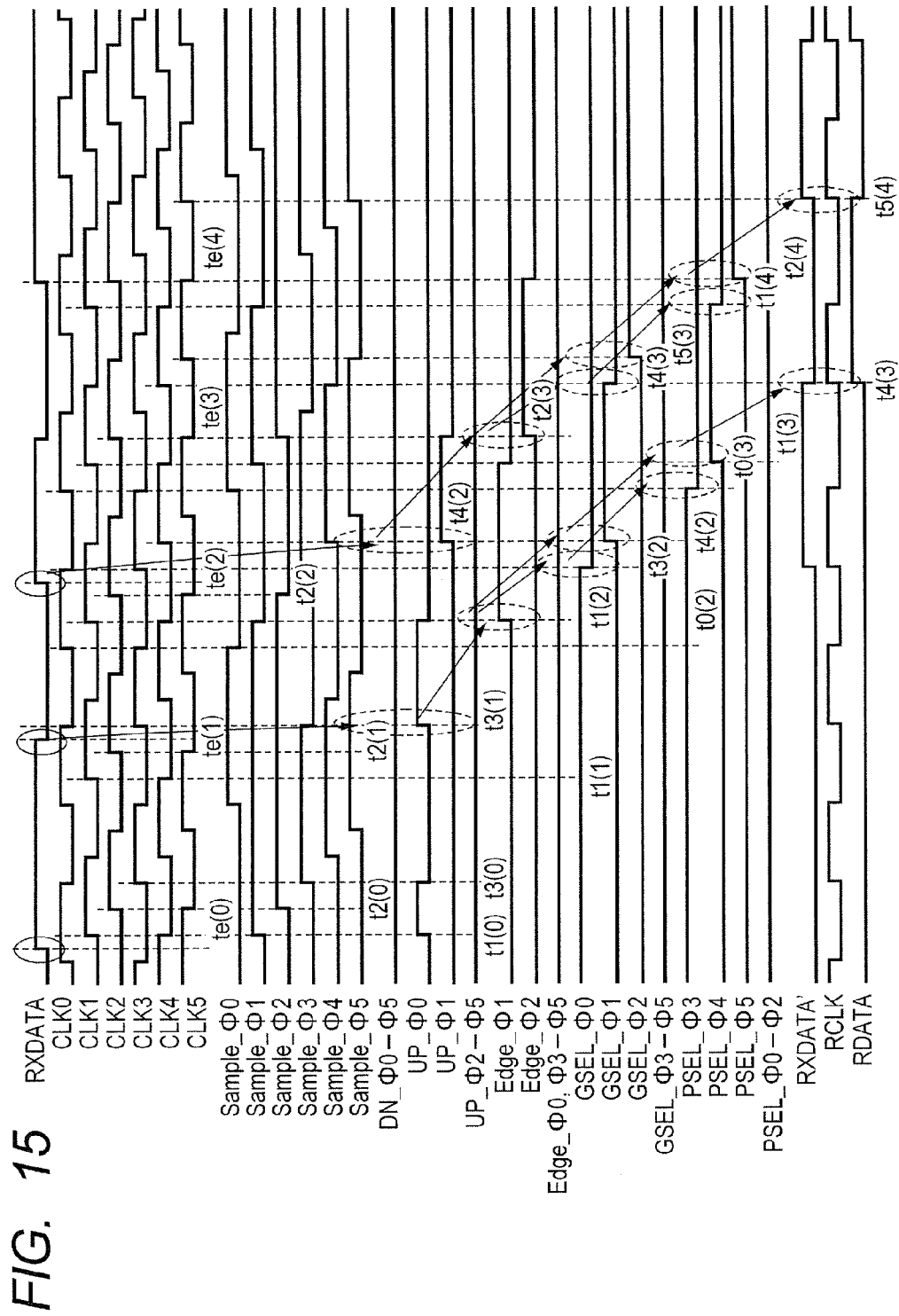
FIG. 15 is a timing chart illustrating operation of the clock data recovery circuit 1 according to Embodiment 1 of the present invention, explained with reference to FIGS. 1 through 14.

In the initializing operation, one phase selection signal which has a phase difference of 0.5 unit intervals substantially with the one arbitrary gate control signal, among the plural phase selection signals (PSEL_Φ0-PSEL_Φ5) generated by the phase selection signal generating circuit (103), is also set at the predetermined signal level (refer to FIG. 15).

In further another more preferred embodiment, when the data edge of the next received data signal shifts by the amount of at least 2 phases of the multi-phase clock signals as compared with the data edge of the received data signal supplied currently, the following follow-up operation is executed.

By the follow-up operation, the next edge detection phase of the edge detector (105) and the phase of the reproduction clock (RCLK) generated by the clock data generating circuit (104) follow the change of the data edge of the received data signal, by executing at least twice the state transition by the change for the amount of −1 phase or +1 phase from the edge detection phase, in response to the first edge detection output signal or the second edge detection output signal (refer to FIG. 15).

Figure 24:
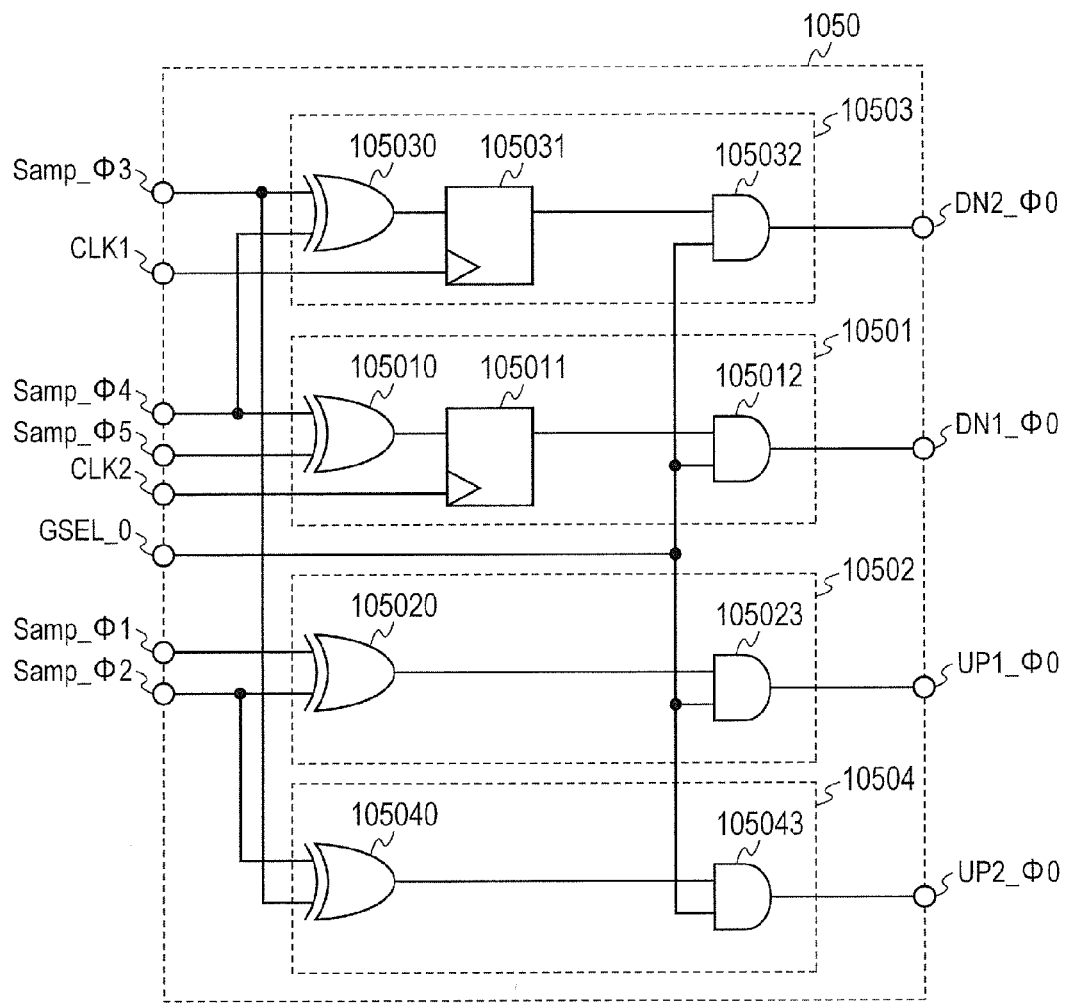
FIG. 24 is a drawing illustrating a configuration of a Φ0 edge detection circuit 1050 included in the edge detection circuit 105, according to Embodiment 2 of the present invention illustrated in FIG. 23.

In a yet another more preferred embodiment, the each edge detection circuit of the plural edge detection circuits (1050) further comprises a third edge detection circuit (10503) and a fourth edge detection circuit (10504) (refer to FIG. 24).

When the first edge detection circuit (10501) detects that the data edge of the received data signal supplied currently is leading between −1 phase and −2 phases of the multi-phase clock signals from the edge detection phase of one edge detection clock signal corresponding to the data edge detection phase of the each edge detection circuit among the multi-phase clock signals, the first edge detection circuit (10501) generates the first edge detection output signal (DN1_Φ0).

When the second edge detection circuit (10502) detects that the data edge of the received data signal supplied currently is lagging between +2 phases and +1 phase of the multi-phase clock signals from the edge detection phase of one edge detection clock signal corresponding to the data edge detection phase of the each edge detection circuit among the multi-phase clock signals, the second edge detection circuit (10502) generates the second edge detection output signal (UP1_Φ0).

In response to the first edge detection output signal (DN1_Φ0) or the second edge detection output signal (UP1_Φ0), a next edge detection phase of the edge detector (105) is changed by the amount of −1 phase or +1 phase from the edge detection phase of the one edge detection clock signal.

When the third edge detection circuit (10503) detects that the data edge of the received data signal supplied currently is leading between −2 phases and −3 phases of the multi-phase clock signals from the edge detection phase of one edge detection clock signal corresponding to the data edge detection phase of the each edge detection circuit among the multi-phase clock signals, the third edge detection circuit (10503) generates the third edge detection output signal (DN2_Φ0).

When the fourth edge detection circuit (10504) detects that the data edge of the received data signal supplied currently is lagging between +2 phases and +3 phases of the multi-phase clock signals from the edge detection phase of one edge detection clock signal corresponding to the data edge detection phase of the each edge detection circuit among the multi-phase clock signals, the fourth edge detection circuit (10504) generates the fourth edge detection output signal (UP2_Φ0).

Figure 28:
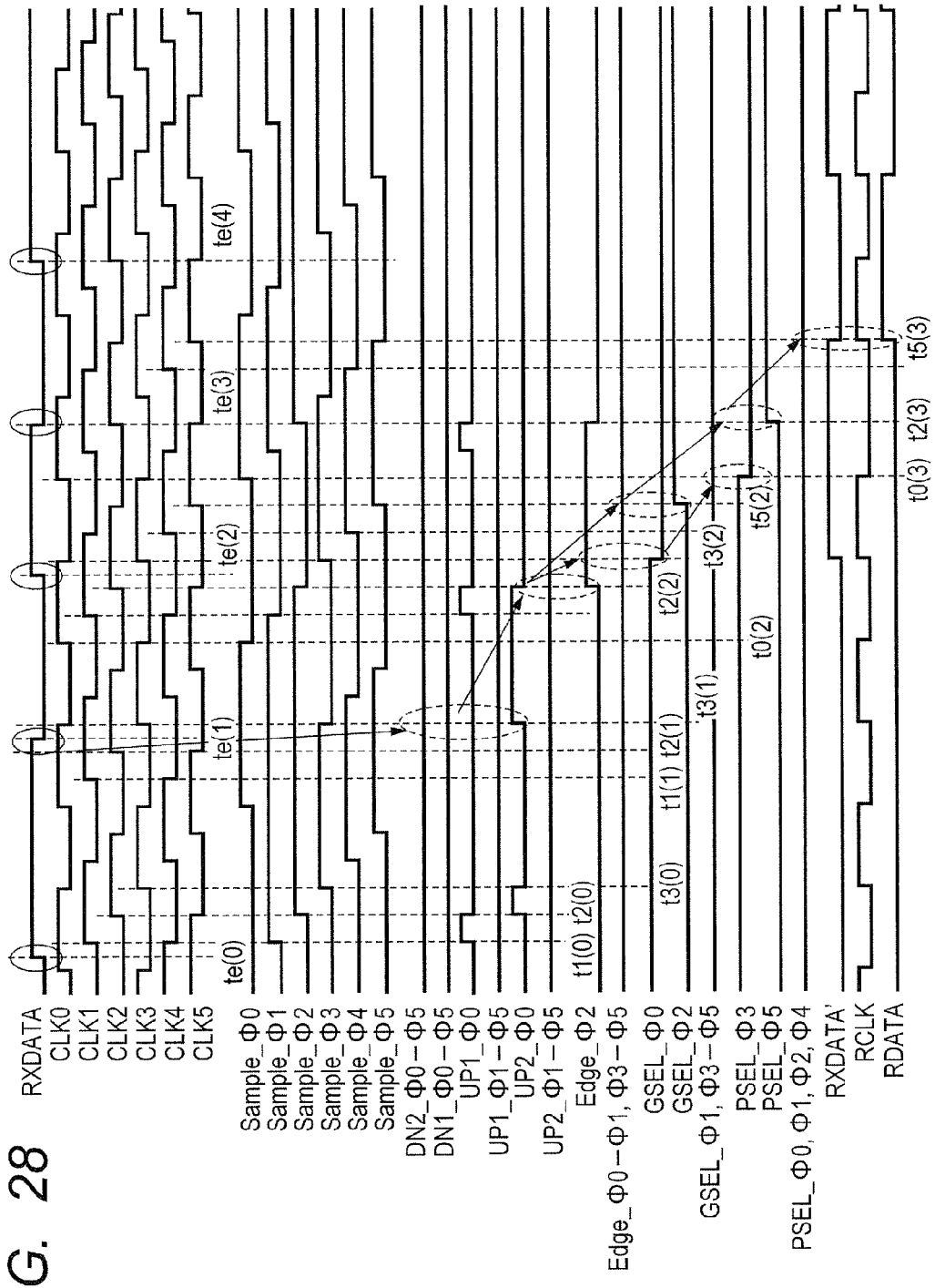
FIG. 28 is a timing chart illustrating operation of the clock data recovery circuit 1 according to Embodiment 2 of the present invention, explained with reference to FIGS. 22 through 27.

In response to the third edge detection output signal (DN2_Φ0) or the fourth edge detection output signal (UP2_Φ0), the next edge detection phase of the edge detector (105) is changed by the amount of −2 phases or +2 phases from the edge detection phase of the one edge detection clock signal (refer to FIG. 28).

In a further yet another more preferred embodiment, when the data edge of the next received data signal shifts by the amount of at least 2 phases of the multi-phase clock signals as compared with the data edge of the received data signal supplied currently, the following follow-up operation is executed.

By the follow-up operation, the next edge detection phase of the edge detector (105) and the phase of the reproduction clock (RCLK) generated by the clock data generating circuit (104) follow the change of the data edge of the received data signal, by executing once the state transition by the change for the amount of −2 phases or +2 phases from the edge detection phase in response to the third edge detection output signal or the fourth edge detection output signal (refer to FIG. 28).

In a specific embodiment, the edge detector (105) comprises plural integrators (105105-105155) coupled to plural output terminals of the plural edge detection circuits (1050-1055).

Figure 29:
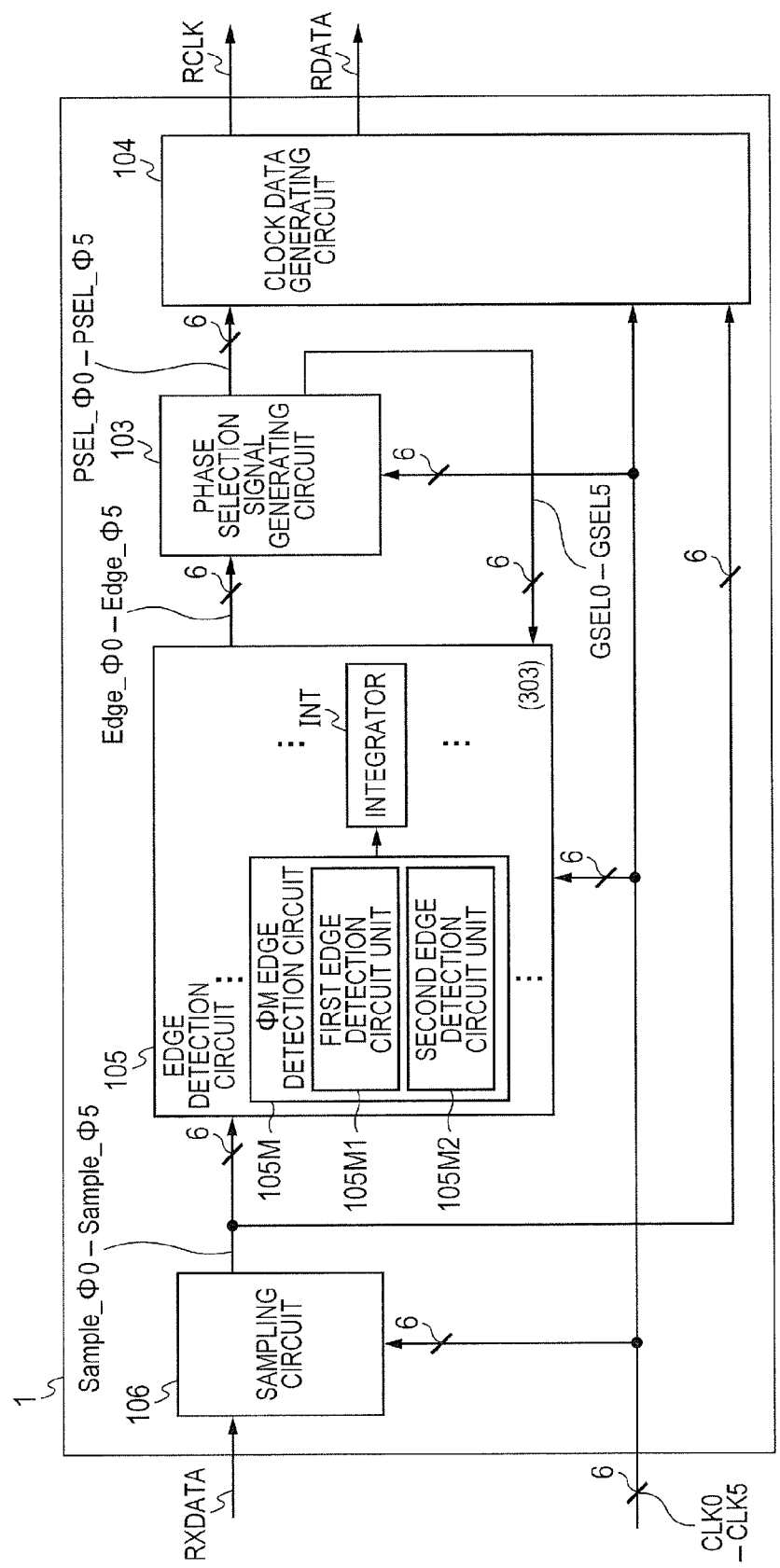
FIG. 29 is a drawing illustrating a configuration of a clock data recovery circuit 1 according to Embodiment 3 of the present invention.
Figure 30:
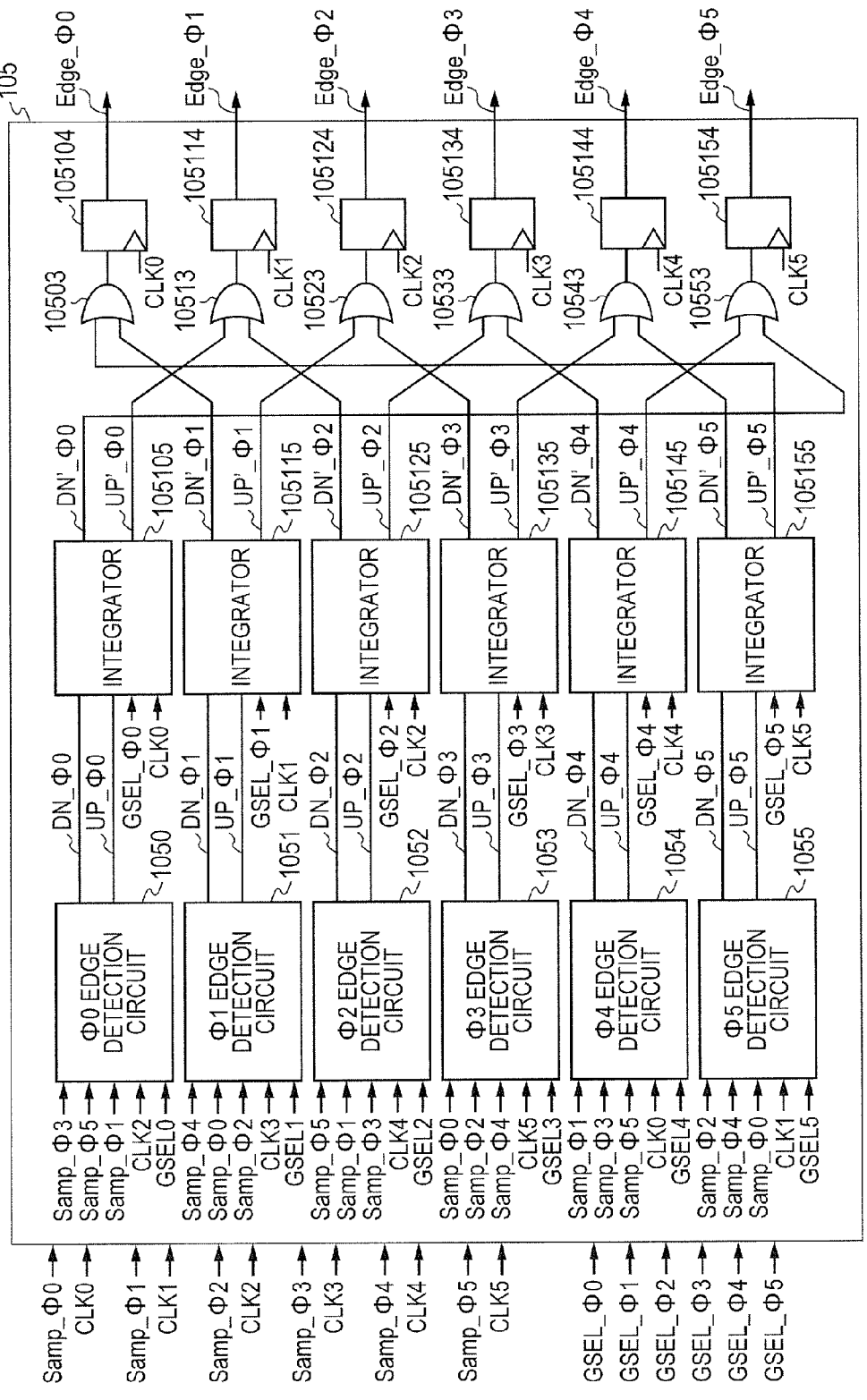
FIG. 30 is a drawing illustrating a configuration of an edge detection circuit 105 of the clock data recovery circuit 1, according to Embodiment 3 of the present invention illustrated in FIG. 29.

Each integrator of the plural integrators (105105-105155) executes averaging of the first edge detection result of the first edge detection circuit (105M1) and the second edge detection result of the second edge detection circuit (105M2), in each edge detection circuit of the plural edge detection circuits (1050-1055) (refer to FIG. 29 and FIG. 30).

In another specific embodiment, the clock data recovery circuit (1) further comprises a multi-phase clock generating circuit (107) which generates the multi-phase clock signals (CLK0-CLK5) in response to an external clock signal (CLKIN) supplied from the exterior of the clock data recovery circuit (1).

Figure 33:
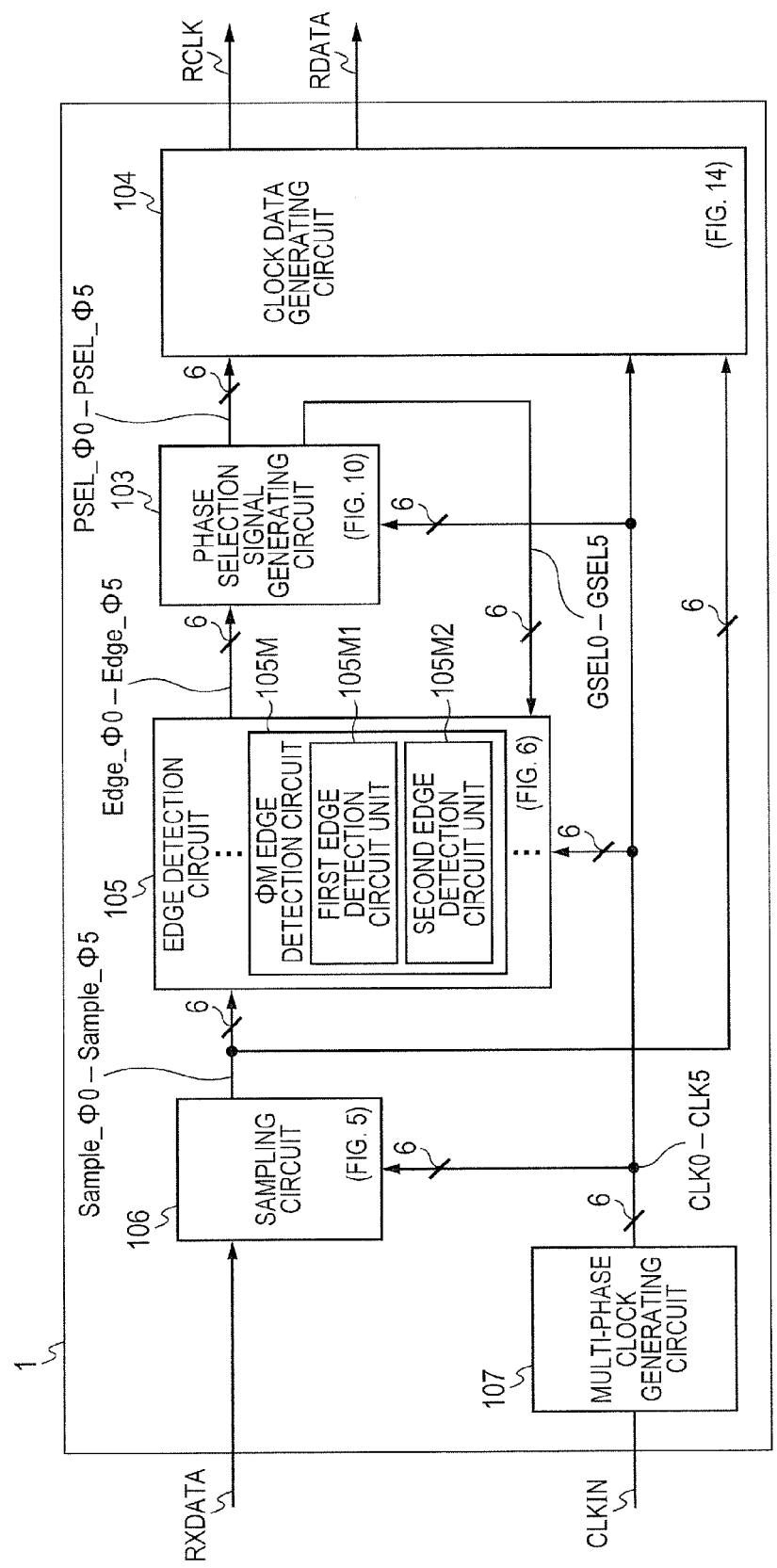
FIG. 33 is a drawing illustrating a configuration of a clock data recovery circuit 1 according to Embodiment 4 of the present invention.

Inside the clock data recovery circuit (1), the multi-phase clock signals (CLK0-CLK5) generated by the multi-phase clock generating circuit (107) is supplied to the sampling circuit (103), the edge detector (105), the phase selection signal generating circuit (103), and the clock data generating circuit (106) (refer to FIG. 33).

Figure 34:
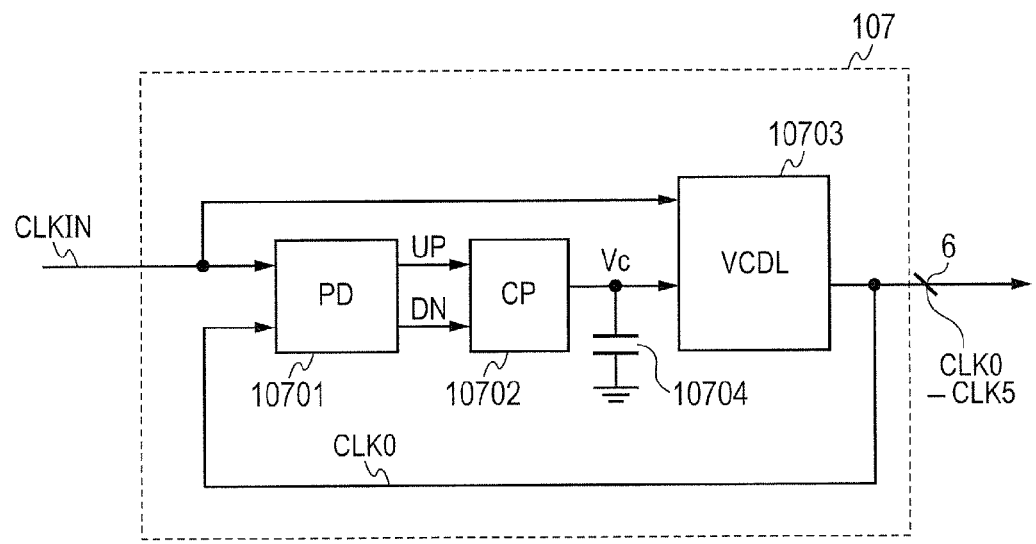
FIG. 34 is a drawing illustrating a configuration of a multi-phase clock generating circuit 107 of the clock data recovery circuit 1, according to Embodiment 4 of the present invention illustrated in FIG. 33.

In the most specific embodiment, the multi-phase clock generating circuit (107) for generating the multi-phase clock signals (CLK0-CLK5) is configured with a delayed locked loop (DLL) which comprises a phase comparator (10701), a charge pump (10702), a loop filter (10704), and a voltage-controlled delay line (10703) (refer to FIG. 34).

(2) A typical embodiment of another viewpoint of the present invention is a transceiver semiconductor integrated circuit (7) comprised of an interface unit (11) which comprises a clock data recovery circuit (1), a deserializer (15), a serializer (14), and a PLL circuit (13).

The serializer (14) as a parallel-to-serial converter generates a serial transmit signal (TXDATA) from a parallel transmit signal (DT) and the PLL clock generated from the PLL circuit (13).

The clock data recovery circuit (1) generates a reproduction clock (RCLK) and reproduction data (RDATA) in response to a received data signal (RXDATA) and the PLL clock generated by the PLL circuit (13).

Figure 36:
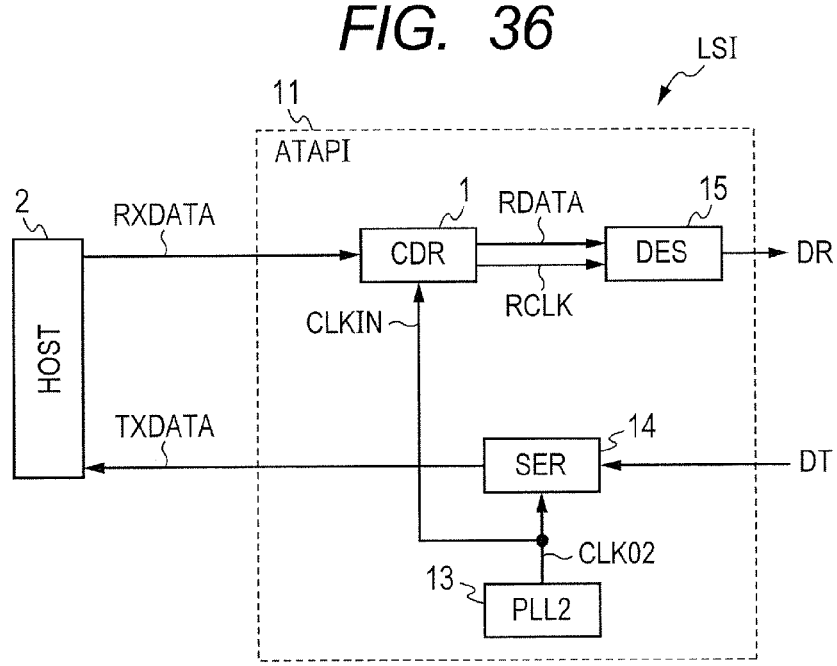
FIG. 36 is a drawing illustrating a configuration of an interface unit 11 of a transceiver LSI 7, according to Embodiment 5 of the present invention.
Figure 37:
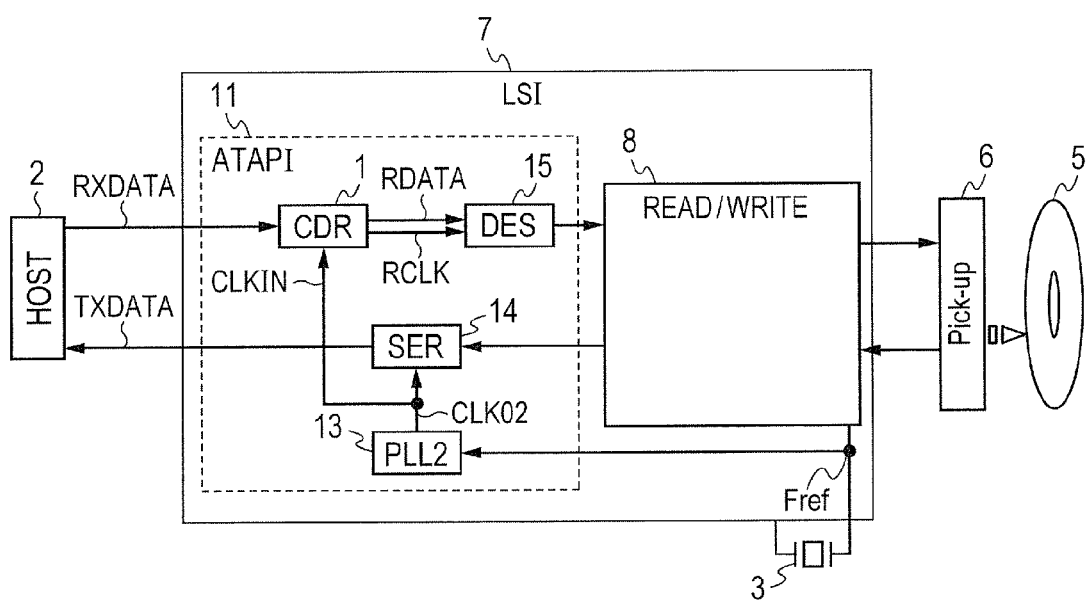
FIG. 37 is a drawing illustrating a configuration of a transceiver LSI 7 according to Embodiment 6 of the present invention.

The deserializer (15) as a serial-to-parallel converter generates parallel receive data (DR) from the reproduction data (RDATA) and the reproduction clock (RCLK) generated by the clock data recovery circuit (1) (refer to FIGS. 36 and 37).

The clock data recovery circuit (1) comprises a sampling circuit (106), an edge detector (105), a phase selection signal generating circuit (103), and a clock data generating circuit (104).

The sampling circuit (106) samples a received data signal (RXDATA) by multi-phase clock signals (CLK0-CLK5) and generates plural sampling signals (Sample_Φ0-Sample_Φ5).

The edge detector (105) responds to the sampling signals (Sample_Φ0-Sample_Φ5) and the multi-phase clock signals (CLK0-CLK5), and generates plural edge detection signals (Edge_Φ0-Edge_Φ5).

The phase selection signal generating circuit (103) responds to the edge detection signals (Edge_Φ0-Edge_Φ5)

and the multi-phase clock signals (CLK0-CLK5), and generates plural phase selection signals (PSEL_Φ0-PSEL_Φ5).

The clock data generating circuit (104) responds to the sampling signals (Sample_Φ0-Sample_Φ5), the phase selection signals (PSEL_Φ0-PSEL_Φ5), and the multi-phase clock signals (CLK0-CLK5), and generates a reproduction clock (RCLK) and a reproduction data (RDATA).

The edge detector (105) comprises plural edge detection circuits (105M: M=0-5). The plural edge detection circuits (105M) of the edge detector (105) responds to the sampling signals (Sample_Φ0-Sample_Φ5) and the multi-phase clock signals (CLK0-CLK5), and generates the plural edge detection signals (Edge_Φ0-Edge_Φ5).

Each edge detection circuit of the plural edge detection circuits (105M) comprises a first edge detection circuit (105M1) and a second edge detection circuit (105M2) (refer to FIG. 4).

When the first edge detection circuit (105M1) detects that an data edge of the received data signal supplied currently is leading more than −1 phase of the multi-phase clock signals from an edge detection phase of one edge detection clock signal corresponding to the data edge detection phase of the each edge detection circuit among the multi-phase clock signals, the first edge detection circuit (105M1) generates a first edge detection output signal (DN_ΦM).

When the second edge detection circuit (105M2) detects that the data edge of the received data signal supplied currently is lagging more than +1 phase of the multi-phase clock signals from the edge detection phase of one edge detection clock signal corresponding to the data edge detection phase of the each edge detection circuit among the multi-phase clock signals, the second edge detection circuit (105M2) generates a second edge detection output signal (UP_ΦM).

In response to the first edge detection output signal (DN_ΦM) or the second edge detection output signal (UP_ΦM), the next edge detection phase of the edge detector (105) is changed by the amount of −1 phase or +1 phase from the edge detection phase of the one edge detection clock signal.

The first edge detection circuit (105M1) and the second edge detection circuit (105M2) are able to detect that the data edge of the received data signal supplied currently lies in the range of ±1 phase of the multi-phase clock signals from the edge detection phase of one edge detection clock signal corresponding to the data edge detection phase of the each edge detection circuit among the multi-phase clock signals.

When the first edge detection circuit (105M1) and the second edge detection circuit (105M2) detect that the data edge of the received data signal supplied currently lies in the range of ±1 phase, the next edge detection phase of the edge detector (105) is maintained at the edge detection phase of the one edge detection clock signal (refer to FIG. 6).

According to the present embodiment, it is possible to provide an oversampling digital clock data recovery circuit which has a high degree of jitter tolerance and can alleviate increase in the phase number of the multi-phase clock, the power consumption, and the semiconductor chip area.

2. Details of Embodiments

Next, the embodiments are explained in full detail.

In the entire diagrams for explaining the embodiments of the present invention, the same symbol is attached to a component which possesses the same function, and the repeated explanation thereof is omitted.

(Embodiment 1)

<<A Configuration of a Clock Data Recovery Circuit>>

FIG. 4 illustrates a configuration of a clock data recovery circuit 1 according to Embodiment 1 of the present invention.

The clock data recovery circuit 1 according to Embodiment 1 of the present invention illustrated in FIG. 4 comprises a sampling circuit 106, an edge detection circuit 105, a phase selection signal generating circuit 103, and a clock data generating circuit 104.

The sampling circuit 106 performs the 6 times oversampling of the received data signal RXDATA supplied from a host (not shown) in response to six-phase clock signals CLK0-CLK5, and generates six sampling signals Sample_Φ0-Sample_Φ5.

The edge detection circuit 105 responds to the six-phase clock signals CLK0-CLK5, the sampling signals Sample_Φ0-Sample_Φ5 generated by the sampling circuit 106, and gate control signals GSEL_Φ0-GSEL_Φ5 generated by the phase selection signal generating circuit 103 to be described later, and generates plural edge detection signals Edge_Φ0-Edge_Φ5. That is, the edge detection circuit 105 comprises plural ΦM edge detection circuits (M=0-5) 105M, and each of the plural ΦM edge detection circuits 105M comprises a first edge detection circuit 105M1 and a second edge detection circuit 105M2.

Using the six-phase clock signals CLK0-CLK5, the edge detection circuit 105 generates an edge detection signal Edge_ΦX which indicates an edge detection phase CLKX of a received data signal RXDATA selected currently. In response to the edge detection signal Edge_ΦX, the phase selection signal generating circuit 103 generates a gate control signal GSEL_ΦX. Therefore, among the plural ΦM edge detection circuits 105M, only a ΦX edge detection circuit 105X, to which the gate control signal GSEL_ΦX is supplied is, controlled to an active state, and the other edge detection circuits are controlled to a non-active state.

In the ΦX edge detection circuit 105X controlled to the active state, a first edge detection circuit 105X1 detects whether the data edge of the received data signal RXDATA supplied currently is leading more than −1 phase from the edge detection phase CLKX of the received data signal RXDATA selected currently. On the other hand, a second edge detection circuit 105X2 detects whether the data edge of the received data signal RXDATA supplied currently is lagging more than +1 phase from the edge detection phase CLKX of the received data signal RXDATA selected currently.

The phase selection signal generating circuit 103 responds to the six-phase clock signals CLK0-CLK5 and the edge position detection signals Edge_Φ0-Edge_Φ5 generated by the edge detection circuit 105, and generates plural gate control signals GSEL_Φ0-GSEL_Φ5 and plural phase selection signals PSEL_Φ0-PSEL_Φ5. The plural gate control signals GSEL_Φ0-GSEL_Φ5 are supplied to the edge detection circuit 105, and the plural phase selection signals PSEL_Φ0-PSEL_Φ5 are supplied to the clock data generating circuit 104.

The clock data generating circuit 104 responds to the six-phase clock signals CLK0-CLK5, the sampling signals Sample_Φ0-Sample_Φ5 generated by the sampling circuit 106, and the plural phase selection signals PSEL_Φ0-PSEL_Φ5 generated by the phase selection signal generating circuit 103, and generates a reproduction clock RCLK and reproduction data RDATA.

<<The Sampling Circuit>>

Figure 5:
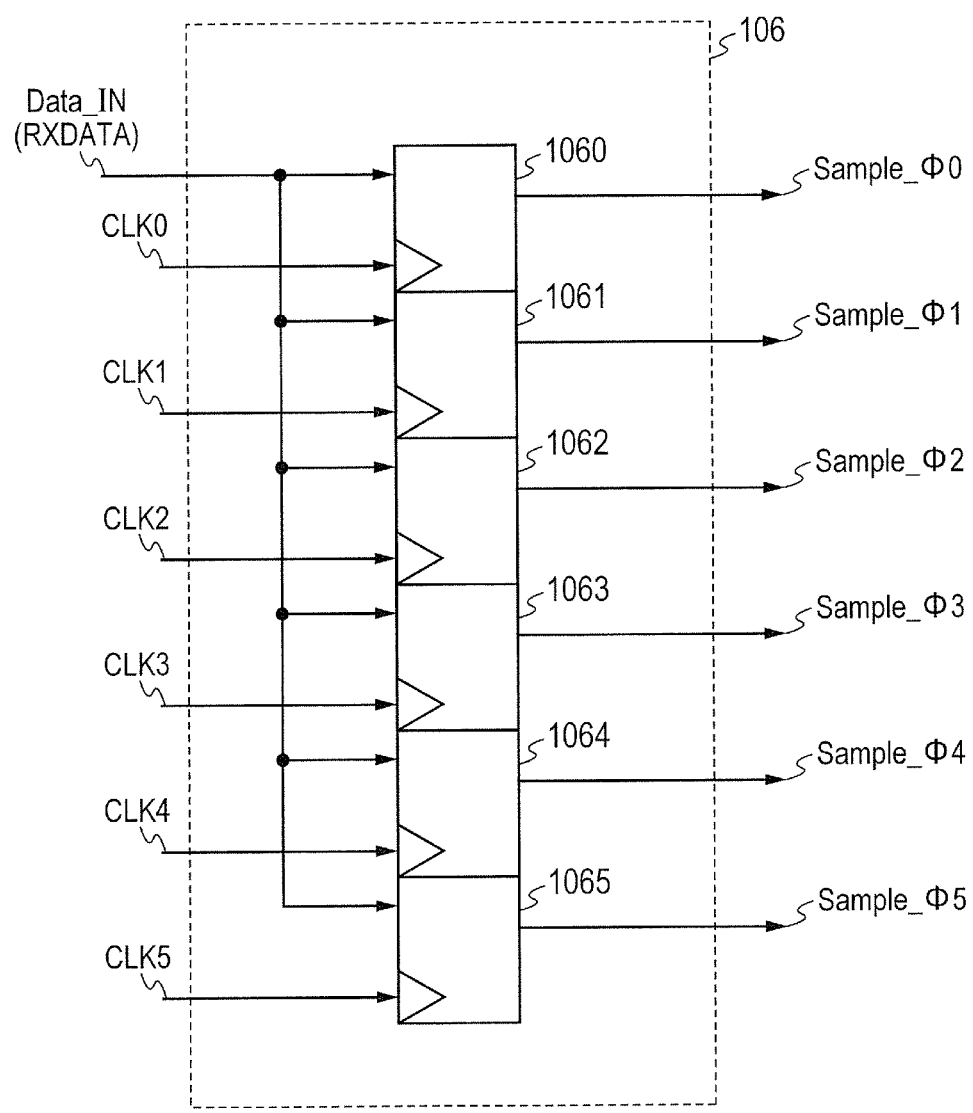
FIG. 5 is a drawing illustrating a configuration of a sampling circuit 106 of the clock data recovery circuit 1, according to Embodiment 1 of the present invention illustrated in FIG. 4.

FIG. 5 illustrates a configuration of the sampling circuit 106 of the clock data recovery circuit 1, according to Embodiment 1 of the present invention illustrated in FIG. 4.

The sampling circuit 106 illustrated in FIG. 5 comprises six delay flip-flop DFFs 1060-1065 which are the same number as the phase number of the multi-phase clock signals CLK0-CLK5.

The received data signal RXDATA is supplied from the host to a common input signal terminal Data_IN of the six delay flip-flop DFFs 1060-1065, and the six-phase clock signals CLK0-CLK5 are supplied to trigger input terminals of the six delay flip-flop DFFs 1060-1065, respectively. Accordingly, the 6 times oversampling is executed to generate six sampling signals Sample_Φ0-Sample_Φ5. For example, when the received data signal RXDATA is a high level and the delay flip-flop DFF 1060 samples at the rising of the first clock signal CLK0, the sampling signal output Sample_Φ0 becomes a high level. On the contrary, when the received data signal RXDATA is a low level and the delay flip-flop DFF 1060 samples at the rising of the first clock signal CLK0, the sampling signal output Sample_Φ0 becomes a low level. The other delay flip-flop DFFs 1061-1065 execute the sampling of the received data signal RXDATA at the rising of the second clock signal CLK1 through the sixth clock signal CLK5, respectively.

<<The Edge Detection Circuit>>

FIG. 6 illustrates a configuration of the edge detection circuit 105 of the clock data recovery circuit 1, according to Embodiment 1 of the present invention illustrated in FIG. 4.

The edge detection circuit 105 illustrated in FIG. 6 is comprised of six ΦM edge detection circuits 1050-1055 (M=0-5) which are the same number as the phase number of the multi-phase clock signals CLK0-CLK5, six two-input OR circuits 10503-10553, and six delay flip-flop DFFs 105104-105154. The six ΦM edge detection circuits 1050-1055 respond to the six-phase clock signals CLK0-CLK5, the six sampling signals Sample_Φ0-Sample_Φ5 generated by the sampling circuit 106, and the six gate control signals GSEL_Φ0-GSEL_Φ5 generated by the phase selection signal generating circuit 103. Accordingly, the six ΦM edge detection circuits 1050-1055 generate six "up" signals UP_Φ0-UP_Φ5 and six "down" signals DN_Φ0-DN_Φ5 which are determined by the six sampling signals Sample_Φ0-Sample_Φ5, and supply them to six two-input OR circuits 10503-10553.

The six two-input OR circuits 10503-10553 execute OR operation of the six "up" signals UP_Φ0-UP_Φ5 and the six "down" signals DN_Φ0-DN_Φ5, and generate six OR output signals.

The six delay flip-flop DFFs 105104-105154 latch the six OR output signals generated by the six two-input OR circuits 10503-10553, at the timing of the rising edge of the multi-phase clock signals CLK0-CLK5.

When explained in more detail, the Φ0 edge detection circuit 1050 is supplied with three sampling signals of the fourth sampling signal Sample_Φ3, the sixth sampling signal Sample_Φ5, and the second sampling signal Sample_Φ1, the third clock signal CLK2, and the first gate control signal GSEL_Φ0. Accordingly, the "down" signal DN_Φ0 and the "up" signal UP_Φ0, which are determined on the basis of three sampling signals of the fourth sampling signal Sample_Φ3, the sixth sampling signal Sample_Φ5, and the second sampling signal Sample_Φ1, are generated and supplied to the sixth two-input OR circuit 10553 and the second two-input OR circuit 10513, respectively. In what follows, each operation of the Φ1 edge detection circuit 1051 to the Φ5 edge detection circuit 1055 is the same as the operation of the Φ0 edge detection circuit 1050, but only each input signal and each output signal thereof are shifted by one phase per circuit, respectively. Accordingly, the explanation thereof is omitted.

When the edge detection phase CLKX of the received data signal RXDATA selected currently from the six-phase clock signals CLK0-CLK5 is phase 0 (the phase of the first clock signal CLK0), the Φ0 edge detection circuit 1050, to which the first gate control signal GSEL_Φ0 is supplied, is controlled to an active state. When the data edge of the received data signal RXDATA exists between the rising edge of the fourth clock signal CLK3 and the rising edge of the sixth clock signal CLK5, the fourth sampling signal Sample_Φ3 becomes a low level, and the sixth sampling signal Sample_Φ5 becomes a high level. In response to the fourth sampling signal Sample_Φ3 of a low level and the sixth sampling signal Sample_Φ5 of a high level, the first "down" signal DN_Φ0 of a high level is generated by the Φ0 edge detection circuit 1050, the edge detection phase CLKX of the received data signal RXDATA to be selected next time from the six-phase clock signals CLK0-CLK5 is advanced to phase 5 (the phase of the sixth clock signal CLK5). When the data edge of the received data signal RXDATA exists between the rising edge of the second clock signal CLK1 and the rising edge of the fourth clock signal CLK3, the second sampling signal Sample_Φ1 becomes a low level, and the fourth sampling signal Sample_Φ3 becomes a high level. In response to the second sampling signal Sample_Φ1 of a low level and the fourth sampling signal Sample_Φ3 of a high level, the first "up" signal UP_Φ0 of a high level is generated from the Φ0 edge detection circuit 1050, and the edge detection phase CLKX of the received data signal RXDATA to be selected next time from the six-phase clock signals CLK0-CLK5 is delayed to phase 1 (the phase of the second clock signal CLK1). Furthermore, when the data edge of the received data signal RXDATA exists between the rising edge of the sixth clock signal CLK5 and the rising edge of the second clock signal CLK1, the first "down" signal DN_Φ0 and the first "up" signal UP_Φ0 which are generated from the Φ0 edge detection circuit 1050 are both set to a low level, and the edge detection phase CLKX of the received data signal RXDATA to be selected next time is maintained at phase 0 (the phase of the first clock signal CLK0).

When the edge detection phase CLKX of the received data signal RXDATA selected currently from the six-phase clock signals CLK0-CLK5 is phase 1 (the phase of the second clock signal CLK1), the Φ1 edge detection circuit 1051, to which the second gate control signal GSEL_Φ1 is supplied, is controlled to an active state. When the data edge of the received data signal RXDATA exists between the rising edge of the fifth clock signal CLK4 and the rising edge of the first clock signal CLK0, the fifth sampling signal Sample_Φ4 becomes a low level and the first sampling signal Sample_Φ0 becomes a high level. In response to the fifth sampling signal Sample_Φ4 of a low level and the first sampling signal Sample_Φ0 of a high level, the second "down" signal DN_Φ1 of a high level is generated by the Φ1 edge detection circuit 1051, and the edge detection phase CLKX of the received data signal RXDATA to be selected next time from the six-phase clock signals CLK0-CLK5 is advanced to phase 0 (the phase of the first clock signal CLK0). When the data edge of the received data signal RXDATA exists between the rising edge of the third clock signal CLK2 and the rising edge of the fifth clock signal CLK4, the third sampling signal Sample_Φ2 becomes a low level and the fifth sampling signal Sample_Φ4 becomes a high level. In response to the third sampling signal Sample_Φ2 of a low level and the fifth sampling signal Sample_Φ4 of a high level, the second "up" signal UP_Φ1 of a high level is generated by the Φ1 edge detection circuit 1051, and the edge detection phase CLKX of the received data signal RXDATA to be selected next time from the six-phase clock signals CLK0-CLK5 is delayed to phase 2 (the phase of the third clock signal CLK2). Furthermore, when the data edge of the received data signal RXDATA is between the rising edge of the first clock signal CLK0 and the rising edge of the third clock signal CLK2, the second "down" signal DN_Φ1 and the second "up" signal UP_Φ1 which are generated by the Φ1 edge detection circuit 1051 are both set to a low level, and the edge detection phase CLKX of the received data signal RXDATA to be selected next time is maintained at phase 1 (the phase of the second clock signal CLK1).

When the edge detection phase CLKX of the received data signal RXDATA selected currently from the six-phase clock signals CLK0-CLK5 is phase 2 (the phase of the third clock signal CLK2), the Φ2 edge detection circuit 1052, to which the third gate control signal GSEL_Φ2 is supplied, is controlled to an active state. When the data edge of the received data signal RXDATA exists between the rising edge of the sixth clock signal CLK5 and the rising edge of the second clock signal CLK1, the sixth sampling signal Sample_Φ5 becomes a low level and the second sampling signal Sample_Φ1 becomes a high level. In response to the sixth sampling signal Sample_Φ5 of a low level and the second sampling signal Sample_Φ1 of a high level, the third "down" signal DN_Φ2 of a high level is generated by the Φ2 edge detection circuit 1052, and the edge detection phase CLKX of the received data signal RXDATA to be selected next time from the six-phase clock signals CLK0-CLK5 is advanced to phase 1 (the phase of the second clock signal CLK1). When the data edge of the received data signal RXDATA exists between the rising edge of the fourth clock signal CLK3 and the rising edge of the sixth clock signal CLK5, the fourth sampling signal Sample_Φ3 becomes a low level and the sixth sampling signal Sample_Φ5 becomes a high level. In response to the fourth sampling signal Sample_Φ3 of a low level and the sixth sampling signal Sample_Φ5 of a high level, the third "up" signal UP_Φ2 of a high level is generated by the Φ2 edge detection circuit 1052, and the edge detection phase CLKX of the received data signal RXDATA to be selected next time from the six-phase clock signals CLK0-CLK5 is delayed to phase 3 (the phase of the fourth clock signal CLK3). When the data edge of the received data signal RXDATA exists between the rising edge of the second clock signal CLK1 and the rising edge of the fourth clock signal CLK3, the third "down" signal DN_Φ2 and the third "up" signal UP_Φ2 which are generated by the Φ2 edge detection circuit 1052 are both set to a low level, and the edge detection phase CLKX of the received data signal RXDATA to be selected next time is maintained at phase 2 (the phase of the third clock signal CLK2).

When the edge detection phase CLKX of the received data signal RXDATA selected currently from the six-phase clock signals CLK0-CLK5 is phase 3 (the phase of the fourth clock signal CLK3), the Φ3 edge detection circuit 1053, to which the fourth gate control signal GSEL_Φ3 is supplied, is controlled to an active state. When the data edge of the received data signal RXDATA exists between the rising edge of the first clock signal CLK0 and the rising edge of the third clock signal CLK2, the first sampling signal Sample_Φ0 becomes a low level and the third sampling signal Sample_Φ2 becomes a high level. In response to the first sampling signal Sample_Φ0 of a low level and the third sampling signal Sample_Φ2 of a high level, the fourth "down" signal DN_Φ3 of a high level is generated by the Φ3 edge detection circuit 1053, and the edge detection phase CLKX of the received data signal RXDATA to be selected next time from the six-phase clock signals CLK0-CLK5 is advanced to phase 2 (the phase of the third clock signal CLK2). When the data edge of the received data signal RXDATA exists between the rising edge of the fifth clock signal CLK4 and the rising edge of the first clock signal CLK0, the fifth sampling signal Sample_Φ4 becomes a low level and the first sampling signal Sample_Φ0 becomes a high level. In response to the fifth sampling signal Sample_Φ4 of a low level and the first sampling signal Sample_Φ0 of a high level, the fourth "up" signal UP_Φ3 of a high level is generated from the Φ3 edge detection circuit 1053, the edge detection phase CLKX of the received data signal RXDATA to be selected next time from the six-phase clock signals CLK0-CLK5 is delayed to phase 4 (the phase of the fifth clock signal CLK4). When the data edge of the received data signal RXDATA exists between the rising edge of the third clock signal CLK2 and the rising edge of the fifth clock signal CLK4, the fourth "down" signal DN_Φ3 and the fourth "up" signal UP_Φ3 which are generated from Φ3 edge detection circuit 1053 are both set to a low level, and the edge detection phase CLKX of the received data signal RXDATA to be selected next time is maintained at phase 3 (the phase of the fourth clock signal CLK3).

When the edge detection phase CLKX of the received data signal RXDATA selected currently from the six-phase clock signals CLK0-CLK5 is phase 4 (the phase of the fifth clock signal CLK4), the Φ4 edge detection circuit 1054, to which the fifth gate control signal GSEL_Φ4 is supplied, is controlled to an active state. When the data edge of the received data signal RXDATA exists between the rising edge of the second clock signal CLK1 and the rising edge of the fourth clock signal CLK3, the second sampling signal Sample_Φ1 becomes a low level, and the fourth sampling signal Sample_Φ3 becomes a high level. In response to the second sampling signal Sample_Φ1 of a low level and the fourth sampling signal Sample_Φ3 of a high level, the fifth "down" signal DN_Φ4 of a high level is generated by the Φ4 edge detection circuit 1054, and the edge detection phase CLKX of the received data signal RXDATA to be selected next time from the six-phase clock signals CLK0-CLK5 is advanced to phase 3 (the phase of the fourth clock signal CLK3). When the data edge of the received data signal RXDATA exists between the rising edge of the sixth clock signal CLK5 and the rising edge of the second clock signal CLK1, the sixth sampling signal Sample_Φ5 becomes a low level and the second sampling signal Sample_Φ1 becomes a high level. In response to the sixth sampling signal Sample_Φ5 of a low level and the second sampling signal Sample_Φ1 of a high level, the fifth "up" signal UP_Φ4 of a high level is generated from the Φ4 edge detection circuit 1054, and the edge detection phase CLKX of the received data signal RXDATA to be selected next time from the six-phase clock signals CLK0-CLK5 is delayed to phase 5 (the phase of the sixth clock signal CLK5). Furthermore, when the data edge of the received data signal RXDATA exists between the rising edge of the fourth clock signal CLK3 and the rising edge of the sixth clock signal CLK5, the fifth "down" signal DN_Φ4 and the fifth "up" signal UP_Φ4 which are generated from the Φ4 edge detection circuit 1054 are both set to a low level, and the edge detection phase CLKX of the received data signal RXDATA to be selected next time is maintained at phase 4 (the phase of the fifth clock signal CLK4).

When the edge detection phase CLKX of the received data signal RXDATA selected currently from the six-phase clock signals CLK0-CLK5 is phase 5 (the phase of the sixth clock signal CLK5), the Φ5 edge detection circuit 1055, to which the sixth gate control signal GSEL_Φ5 is supplied, is controlled to an active state. When the data edge of the received data signal RXDATA exists between the rising edge of the third clock signal CLK2 and the rising edge of the fifth clock signal CLK4, the third sampling signal Sample_Φ2 becomes a low level and the fifth sampling signal Sample_Φ4 becomes a high level. In response to the third sampling signal Sample_Φ2 of a low level and the fifth sampling signal Sample_Φ4 of a high level, the sixth "down" signal DN_Φ5 of a high level is generated by the Φ5 edge detection circuit 1055, and the edge detection phase CLKX of the received data signal RXDATA to be selected next time from the six-phase clock signals CLK0-CLK5 is advanced to phase 4 (the phase of the fifth clock signal CLK4). When the data edge of the received data signal RXDATA exists between the rising edge of the first clock signal CLK0 and the rising edge of the third clock signal CLK2, the first sampling signal Sample_Φ0 becomes a low level and the third sampling signal Sample_Φ2 becomes a high level. In response to the first sampling signal Sample_Φ0 of a low level and the third sampling signal Sample_Φ2 of a high level, the sixth "up" signal UP_Φ5 of a high level is generated by the Φ5 edge detection circuit 1055, and the edge detection phase CLKX of the received data signal RXDATA to be selected next time from the six-phase clock signals CLK0-CLK5 is delayed to phase 0 (the phase of the first clock signal CLK0). Furthermore, when the data edge of the received data signal RXDATA exists between the rising edge of the fifth clock signal CLK4 and the rising edge of the first clock signal CLK0, the sixth "down" signal DN_Φ5 and the sixth "up" signal UP_Φ5 which are generated by the Φ5 edge detection circuit 1055 are both set to a low level, and the edge detection phase CLKX of the received data signal RXDATA to be selected next time is maintained at phase 5 (the phase of the sixth clock signal CLK5).

The six two-input OR circuits 10503-10553 of the edge detection circuit 105 illustrated in FIG. 6 respond to the high level of the six "up" signals UP_Φ0-UP_Φ5, and the high level of the six "down" signals DN_Φ0-DN_Φ5, which are the output signal of six pieces of the Φ0 edge detection circuit 1050 through the Φ2 edge detection circuit 1055 described above, and generate the output signal of a high level to supply them to the six delay flip-flop DFFs 105104-105154.

That is, the first two-input OR circuit 10503 responds to the sixth "up" signal UP_Φ5 from the Φ5 edge detection circuit 1055 and the second "down" signal DN_Φ1 from the Φ1 edge detection circuit 1051, and generates the first edge detection signal Edge_Φ0. When the state is as described in the following, for example, the first edge detection signal Edge_Φ0 is generated by the first two-input OR circuit 10503 and the first delay flip-flop DFF 105104.

That is, when the edge detection phase CLKX of the received data signal RXDATA selected currently from the six-phase clock signals CLK0-CLK5 is phase 5 (the phase of the sixth clock signal CLK5), the Φ5 edge detection circuit 1055, to which the sixth gate control signal GSEL_Φ5 is supplied, is controlled to an active state. When the data edge of the received data signal RXDATA exists between the rising edge of the first clock signal CLK0 and the rising edge of the third clock signal CLK2, the sixth "up" signal UP_Φ5 of a high level is generated by the Φ5 edge detection circuit 1055, as described above, and the edge detection phase CLKX of the received data signal RXDATA to be selected next time from the six-phase clock signals CLK0-CLK5 is delayed to phase (the phase of the first clock signal CLK0).

Except for the above, when the state is as described in the following, the first edge detection signal Edge_Φ0 is generated by the first two-input OR circuit 10503 and the first delay flip-flop DFF 105104.

That is, when the edge detection phase CLKX of the received data signal RXDATA selected currently from the six-phase clock signals CLK0-CLK5 is phase 1 (the phase of the second clock signal CLK1), and the Φ1 edge detection circuit 1051, to which the second gate control signal GSEL_Φ1 is supplied, is controlled to an active state. When the data edge of the received data signal RXDATA exists between the rising edges of the fifth clock signal CLK4 and the rising edges of the first clock signal CLK0, the second "down" signal DN_Φ1 of a high level is generated by the Φ1 edge detection circuit 1051, as described above, and the edge detection phase CLKX of the received data signal RXDATA to be selected next time from the six-phase clock signals CLK0-CLK5 is advanced to phase 0 (the phase of the first clock signal CLK0).

The other two-input OR circuits 10513-10553 and the other delay flip-flop DFFs 105114-10554 perform the same operation as the first two-input OR circuit 10503 and the first delay flip-flop DFF 105104, described above. Accordingly, the explanation thereof is omitted.

FIG. 7 illustrates a configuration of the Φ0 edge detection circuit 1050 included in the edge detection circuit 105, according to Embodiment 1 of the present invention illustrated in FIG. 6.

As illustrated in FIG. 7, the Φ0 edge detection circuit 1050 comprises a first edge detection circuit 10501 and a second edge detection circuit 10502. The first edge detection circuit 10501 comprises an exclusive OR circuit 105010, a delay flip-flop DFF 105011, and an AND circuit 105012. The second edge detection circuit 10502 comprises an exclusive OR circuit 105020, a NOT circuit 105021, and two AND circuits 105022 and 105023.

The first edge detection circuit 10501 is supplied with two sampling signals of the fourth sampling signal Sample_Φ3 and the sixth sampling signal Sample_Φ5, the third clock signal CLK2, and the first gate control signal GSEL_Φ0, and generates the first "down" signal DN_Φ0. On the other hand, the second edge detection circuit 10502 is supplied with two sampling signals of the fourth sampling signal Sample_Φ3 and the second sampling signal Sample_Φ1 and the first gate control signal GSEL_Φ0, and generates the first "up" signal UP_Φ0.

In the first edge detection circuit 10501, the sixth sampling signal Sample_Φ5 and the fourth sampling signal Sample_Φ3 are compared by the two-input exclusive OR circuit 105010. The sixth sampling signal Sample_Φ5 is a signal obtained by sampling the received data signal RXDATA at the rising edge of the sixth clock signal CLK5, existing in a position departed by one phase to the negative direction from phase 0, which is the phase of the first clock signal CLK0 as the own data edge detection phase of the first edge detection circuit 10501. The fourth sampling signal Sample_Φ3 is a signal obtained by sampling the received data signal RXDATA at the rising edge of the fourth clock signal CLK3, existing in a position departed by 0.5 UI to the negative direction from phase 0. When the edge of the received data signal RXDATA exists between the rising edge of the fourth clock signal CLK3 and the rising edge of the sixth clock signal CLK5, the output of the exclusive OR circuit 105010 becomes a high level. When the data edge of the received data signal RXDATA exists in the other position, or when no data edge comes in, the output of the exclusive OR circuit 105010 becomes a low level.

In the second edge detection circuit 10502, the second sampling signal Sample_Φ1 and the fourth sampling signal Sample_Φ3 are compared by the two-input exclusive OR circuit 105020. The second sampling signal Sample_Φ1 is a signal obtained by sampling the received data signal RXDATA at the rising edge of the second clock signal CLK1, existing in a position departed by one phase to the positive direction from phase 0, which is the phase of the first clock signal CLK0 as the own data edge detection phase of the second edge detection circuit 10502. The fourth sampling signal Sample_Φ3 is a signal obtained by sampling the received data signal RXDATA at the rising edge of the fourth clock signal CLK3, existing in a position departed by 0.5 UI to the positive direction from phase 0. When the edge of the received data signal RXDATA exists between the rising edge of the second clock signal CLK1 and the rising edge of the fourth clock signal CLK3, the output of the exclusive OR circuit 105020 becomes a high level. When the data edge of the received data signal RXDATA exists in the other position, or when no data edge comes in, the output of the exclusive OR circuit 105020 becomes a low level.

The following assumes the case where both of the two-input exclusive OR circuit 105010 of the first edge detection circuit 10501 and the two-input exclusive OR circuit 105020 of the second edge detection circuit 10502 have an output of a low level, even in the state where the data edge of the received data signal RXDATA has come. The present case indicates that the data edge of the received data signal RXDATA exists within the range of ±1 phase (between the rising edge of the sixth clock signal CLK5 and the rising edges of the second clock signal CLK1) from phase 0, which is the phase of the first clock signal CLK0 as the own data edge detection phase of the Φ0 edge detection circuit 1050.

Both of the first and the second edge detection circuits 10501 and 10502 execute the edge detection of the sixth sampling signal Sample_Φ5 and the edge detection of the second sampling signal Sample_Φ1, with reference to the fourth sampling signal Sample_Φ3. However, both of the first and the second edge detection circuits 10501 and 10502 refer to the fourth sampling signal Sample_Φ3 at the edge detection timing of the sixth sampling signal Sample_Φ5 and at the edge detection timing of the second sampling signal Sample_Φ1, which are different in timing as illustrated in FIG. 9.

Figure 9:
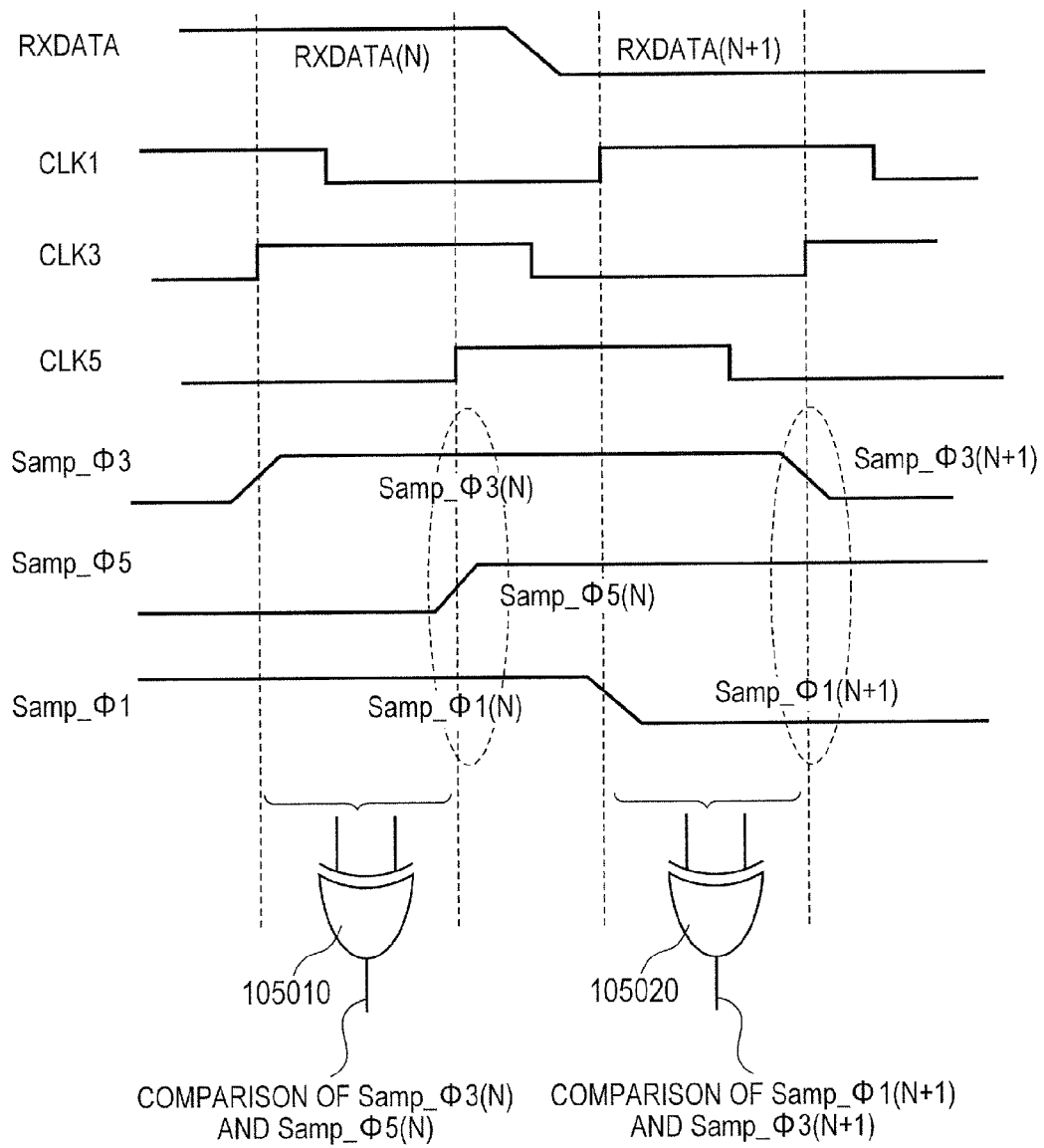
FIG. 9 is a drawing illustrating a manner that two-input exclusive OR circuits 105010 and 105020 of a first and a second edge detection circuits 10501 and 10502 of the Φ0 edge detection circuit 1050, included in the edge detection circuit 105 according to Embodiment 1 of the present invention illustrated in FIG. 7, execute edge detection of a sixth sampling signal Sample_Φ5 and edge detection of a second sampling signal Sample_Φ1, with reference to a fourth sampling signal Sample_Φ3.

FIG. 9 illustrates a manner that two-input exclusive OR circuits 105010 and 105020 of the first and the second edge detection circuits 10501 and 10502 of the Φ0 edge detection circuit 1050, included in the edge detection circuit 105 according to Embodiment 1 of the present invention illustrated in FIG. 7, execute edge detection of the sixth sampling signal Sample_Φ5 and edge detection of the second sampling signal Sample_Φ1, with reference to the fourth sampling signal Sample_Φ3.

When it is assumed that the data of the received data signal RXDATA at a certain time is RXDATA (N), as illustrated in FIG. 9, the first edge detection circuit 10501 illustrated in FIG. 7 compares the fourth sampling signal Sample_Φ3 (N) and the sixth sampling signal Sample_Φ5 (N) of the data RXDATA (N) by the two-input exclusive OR circuit 105010. On the other hand, the second edge detection circuit 10502 illustrated in FIG. 7 compares the second sampling signal Sample_Φ1 (N+1) and the fourth sampling signal Sample_Φ3 (N+1) of the data RXDATA (N+1) at the next timing, by the two-input exclusive OR circuit 105020. That is, the first and the second edge detection circuits 10501 and 10502 illustrated in FIG. 7 refer to two pieces of the fourth sampling signals Sample_Φ3 (N) and Sample_Φ3 (N+1), which are separated by 1 UI. The first edge detection circuit 10501 of the Φ0 edge detection circuit 1050 illustrated in FIG. 7 included in the edge detection circuit 105 according to Embodiment 1 of the present invention illustrated in FIG. 6, for example, refers to plural pieces of the fourth sampling signals Sample_Φ3 (N), Sample_Φ3 (N+1), Sample_Φ3 (N+2), . . . . Accordingly, it is understood that the first edge detection circuit 10501 keeps detecting plural edges of the sixth sampling signal Sample_Φ5, without omission, to the flow of the received data signal RXDATA.

On the other hand, when the edge detection phase CLKX of the received data signal RXDATA selected currently from the six-phase clock signals CLK0-CLK5 is phase 0 (the phase of the first clock signal CLK0), the Φ0 edge detection circuit 1050 according to Embodiment 1 of the present invention illustrated in FIG. 7 is controlled to an active state by the first gate control signal GSEL_Φ0 of a high level. Therefore, two output signals of two pieces of the two-input exclusive OR circuits 105010 and 105020 of the Φ0 edge detection circuit 1050 illustrated in FIG. 7 pass two pieces of the two-input AND circuits 105012 and 105023, and generate the first "down" signal DN_Φ0 and the first "up" signal UP_Φ0, respectively. When the data edge of the received data signal RXDATA exists between the rising edge of the fourth clock signal CLK3 and the rising edge of the sixth clock signal CLK5, the first "down" signal DN_Φ0 becomes a high level. When the data edge of the received data signal RXDATA exists between the rising edge of the second clock signal CLK1 and the rising edge of the fourth clock signal CLK3, the first "up" signal UP_Φ0 becomes a high level. The first "down" signal DN_Φ0 and the first "up" signal UP_Φ0 are supplied to the two-input OR circuit 10553 and the two-input OR circuit 10513 which are included in the edge detection circuit 105 illustrated in FIG. 6, respectively.

The delay flip-flop DFF 105011 of the Φ0 edge detection circuit 1050 illustrated in FIG. 7 possesses function of latching the output of the two-input exclusive OR circuit 105010 at the timing of the rising edge of the third clock signal CLK2, and of holding the output of the two-input exclusive OR circuit 105010 up to the time of the next rising edge of the third clock signal CLK2. That is, the delay flip-flop DFF 105011 of the Φ0 edge detection circuit 1050 possesses the following function. That is, the delay flip-flop DFF 105011 holds, for one clock period of the third clock signal CLK2, the output of the two-input exclusive OR circuit 105010 which are supplied with the fourth sampling signal Sample_Φ3 (N) by the fourth clock signal CLK3 and the sixth sampling signal Sample_Φ5(N) by the sixth clock signal CLK5, of the data RXDATA(N) at a certain time of the received data signal RXDATA. If the Φ0 edge detection circuit 1050 illustrated in FIG. 7 is not provided with the delay flip-flop DFF 105011, an undesirable output of the two-input exclusive OR circuit 105010 supplied with the fourth sampling signal Sample_Φ3 (N+1) and the sixth sampling signal Sample_Φ5 (N) will be generated, at the timing of the next rising edge of the fourth clock signal CLK3. On the other hand, the reason why the second edge detection circuit 10502 is not provided with a delay flip-flop DFF corresponding to the delay flip-flop DFF 105011 is as follows. Namely, it is because the second edge detection circuit 10502 terminates a series of the next processing before the arrival of the second sampling signal Sample_Φ1 (N+1) at the next timing, by plural gate control signals GSEL_Φ5-GSEL_Φ1 and plural phase selection signals PSEL_Φ5-PSEL_Φ1, generated by the phase selection signal generating circuit 103 described later. It means that the second edge detection circuit 10502 terminates a series of processing of the output of the two-input exclusive OR circuit 105020 inputted with the second sampling signal Sample_Φ1 by the second clock signal CLK1 (N) and the fourth sampling signal Sample_Φ3 by the fourth clock signal CLK3 (N).

The NOT circuit 105021 and the AND circuit 105022 of the Φ0 edge detection circuit 1050 illustrated in FIG. 7 possesses function to prevent that the first "up" signal UP_Φ0 is set to a high level under any circumstances, when the output of the two-input exclusive OR circuit 105010 of the first edge detection circuit 10501 is a high level. Namely, it is prevented that the first "down" signal DN_Φ0 (of which a high level sets the next edge detection phase as the phase of the sixth clock signal CLK5) generated by the Φ0 edge detection circuit 1050 illustrated in FIG. 7, and the first "up" signal UP_Φ0 (of which a high level sets the next edge detection phase as the phase of the second clock signal CLK1) become a high level concurrently.

By the above explanation, it is understood that the Φ0 edge detection circuit 1050 illustrated in FIG. 7 performs the following operation, when the data edge of the received data signal RXDATA exists between the rising edge of the fourth clock signal CLK3 and the rising edge of the sixth clock signal CLK5. Namely, the edge detection phase CLKX of the received data signal RXDATA in the currently selected state of phase 0 (the phase of the first clock signal CLK0) is advanced to the edge detection phase CLKX of the received data signal RXDATA in the state of phase 5 (the phase of the sixth clock signal CLK5) to be selected next time, by the first "down" signal DN_Φ0 of a high level. The following assumes the case where the data edge of the received data signal RXDATA exists between the rising edge of the second clock signal CLK1 and the rising edge of the fourth clock signal CLK3. In the present case, it is understood that the Φ0 edge detection circuit 1050 illustrated in FIG. 7 performs the following operation. Namely, the edge detection phase CLKX of the received data signal RXDATA in the currently selected state of phase 0 (the phase of the first clock signal CLK0) is delayed to the edge detection phase CLKX of the received data signal RXDATA in the state of phase 1 (the phase of the second clock signal CLK1) to be selected next time, by the first "up" signal UP_Φ0 of a high level. Furthermore, the following assumes the case where the data edge of the received data signal RXDATA exists between the rising edge of the sixth clock signal CLK5 and the rising edge of the second clock signal CLK1 and the case where the data edge of the received data signal RXDATA does not come. In the present cases, it is understood that the Φ0 edge detection circuit 1050 illustrated in FIG. 7 maintains the edge detection phase CLKX of the received data signal RXDATA to be selected next time to phase 0 (the phase of the first clock signal CLK0), by setting both the first "down" signal DN_Φ0 and the first "up" signal UP_Φ0 at a low level.

Figure 8:
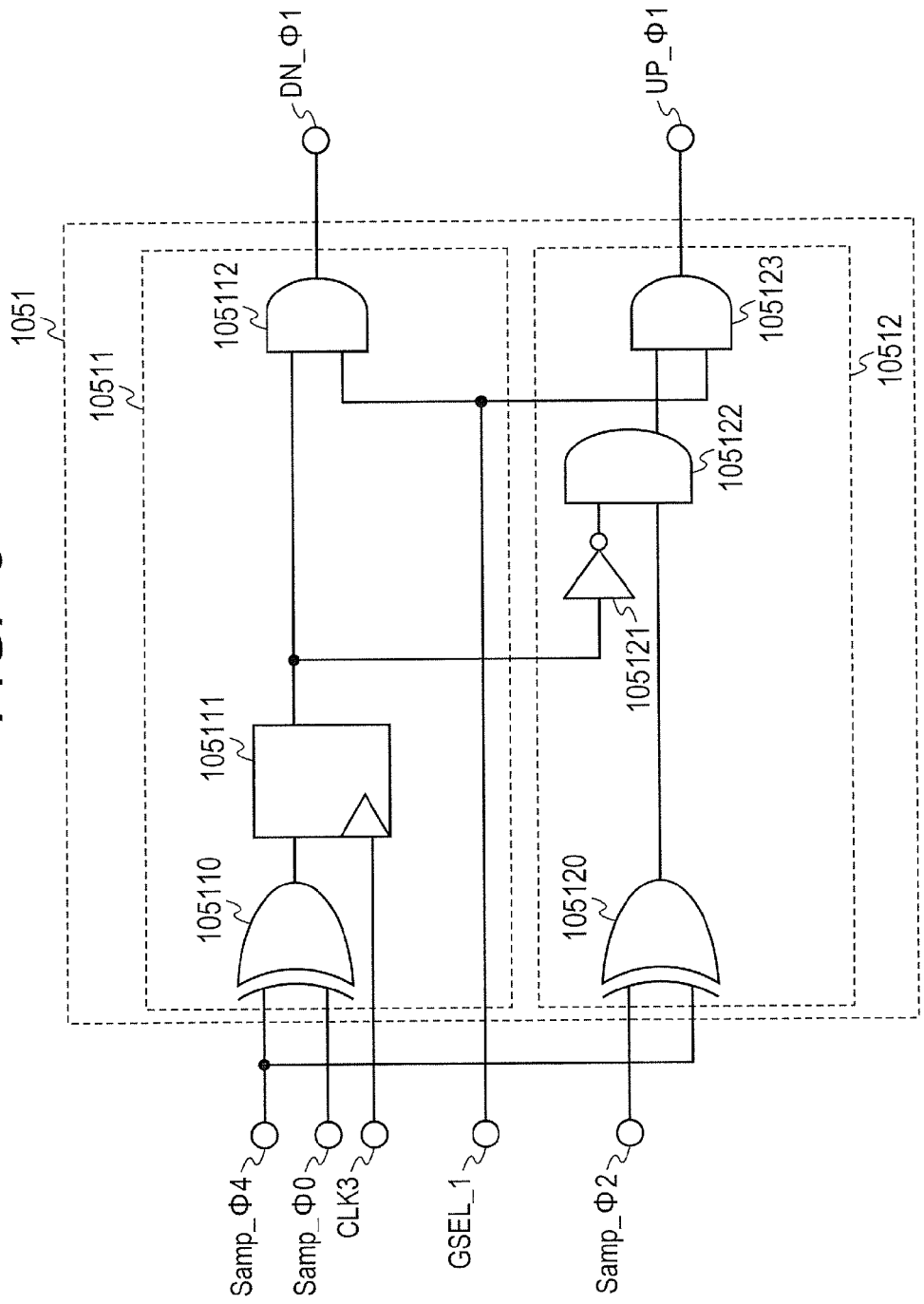
FIG. 8 is a drawing illustrating a configuration of a Φ1 edge detection circuit 1051 included in the edge detection circuit 105, according to Embodiment 1 of the present invention illustrated in FIG. 6.

FIG. 8 illustrates a configuration of the Φ1 edge detection circuit 1051 included in the edge detection circuit 105, according to Embodiment 1 of the present invention illustrated in FIG. 6.

As illustrated in FIG. 8, the Φ1 edge detection circuit 1051 comprises a first edge detection circuit 10511 and a second edge detection circuit 10512, as is the case with the Φ0 edge detection circuit 1050 illustrated in FIG. 7. The first edge detection circuit 10511 comprises an exclusive OR circuit 105110, a delay flip-flop DFF 105111, and an AND circuit 105112. The second edge detection circuit 10512 comprises an exclusive OR circuit 105120, a NOT circuit 105121, and two AND circuits 105122 and 105123.

The first edge detection circuit 10511 is supplied with two sampling signals Sample_Φ4 and Sample_Φ0, the fourth clock signal CLK3, and the second gate control signal GSEL_Φ1, and generates a second "down" signal DN_Φ1. On the other hand, the second edge detection circuit 10512 is supplied with two sampling signals Sample_Φ4 and Sample_Φ2, and the second gate control signal GSEL_Φ1, and generates a second "up" signal UP_Φ1.

Four other pieces of the Φ2 edge detection circuit 1052 through the Φ5 edge detection circuit 1055 other than the Φ0 edge detection circuit 1050 illustrated in FIG. 7 and the Φ1 edge detection circuit 1051 illustrated in FIG. 8 perform fundamental operation which is completely the same as that of the Φ0 edge detection circuit 1050 and the Φ1 edge detection circuit 1051, but they are only different in that the phase relation of the input signal and the output signal is shifted by one phase per circuit. Therefore, detailed explanation of the other edge detection circuits is omitted.

As described above, only one edge detection circuit selected from the six ΦM edge detection circuits 1050-1055, included in the edge detection circuit 105 according to Embodiment 1 of the present invention illustrated in FIG. 6, is controlled to an active state by the six gate control signals GSEL_Φ0-GSEL_Φ5 generated by the phase selection signal generating circuit 103, and the other five edge detection circuits are controlled to a non-active state. Therefore, it is possible to provide an oversampling digital clock data recovery circuit which can alleviate increase of the power consumption.

Furthermore, the six ΦM edge detection circuits 1050-1055 do not generate concurrently plural "up" signals of a high level among the six "up" signals UP_Φ0-UP_Φ5, nor generate concurrently plural "down" signals of a high level among the six "down" signals DN_Φ0-DN_Φ5. The six delay flip-flop DFFs 105104-105154 respond to six output signals of the six two-input OR circuits 10503-10553 and the six-phase clock signals CLK0-CLK5, and generate six edge detection signals Edge_Φ0-Edge_Φ5. In that case, plural edge detection signals of a high level are not concurrently generated among the six edge detection signals Edge_Φ0-Edge_Φ5.

<<The Phase Selection Signal Generating Circuit>>

FIG. 10 illustrates a configuration of the phase selection signal generating circuit 103 of the clock data recovery circuit 1, according to Embodiment 1 of the present invention illustrated in FIG. 4.

As illustrated in FIG. 10, the phase selection signal generating circuit 103 comprises six ΦM phase selection signal generating circuits 1030-1035 (M=0-5) which are the same number as the phase number of the multi-phase clock signals CLK0-CLK5. The phase selection signal generating circuit 103 illustrated in FIG. 10 responds to the six-phase clock signals CLK0-CLK5 and the six edge detection signals Edge_Φ0-Edge_Φ5 generated by the edge detection circuit 105 illustrated in FIG. 6, and generates six phase selection signals PSEL_Φ0-PSEL_Φ5 and six gate control signals GSEL_Φ0-GSEL_Φ5. The six gate control signals GSEL_Φ0-GSEL_Φ5 generated by the phase selection signal generating circuit 103 illustrated in FIG. 10 control the active state and non-active state of the six ΦM edge detection circuits 1050-1055 which configure the edge detection circuit 105 illustrated in FIG. 6. The six phase selection signals PSEL_Φ0-PSEL_Φ5 generated by the phase selection signal generating circuit 103 illustrated in FIG. 10 are supplied to the clock data generating circuit 104, which will be explained in full detail with reference to FIG. 14.

The phase selection signal generating circuit 103 illustrated in FIG. 10 is explained in more detail. The Φ0 phase selection signal generating circuit 1030 is supplied with three edge detection signals Edge_Φ5, Edge_Φ0, and Edge_Φ1, and two clock signals CLK0 and CLK3, and generates the fourth phase selection signal PSEL_Φ3 and the first gate control signal GSEL_Φ0. The first gate control signal GSEL_Φ0 is supplied to the Φ0 edge detection circuit 1050 included in the edge detection circuit 105 illustrated in FIG. 6.

The reason why the phase selection signal generated by the Φ0 phase selection signal generating circuit 1030 is allotted to the fourth phase selection signal PSEL_Φ3 is as follows.

Namely, this is because, when the detection phase of the data edge of the received data signal RXDATA is determined by the first edge detection signal Edge_Φ0 of a high level as phase 0 (the phase of the first clock signal CLK0), the clock data generating circuit 104 (to be explained fully with reference to FIG. 14) generates the fourth clock signal CLK3 which is a phase separated by 0.5 UI from phase 0 of the data edge detection phase, as a reproduction clock RCLK.

In the phase selection signal generating circuit 103 illustrated in FIG. 10, the phase of the input signal and the output signal of the Φ1 phase selection signal generating circuit 1031 through the Φ2 phase selection signal generating circuit 1035, other than the Φ0 phase selection signal generating circuit 1030 described above, is shifted only by one phase of the clock signal per circuit, as compared with the phase relation of the input signal and the output signal of the Φ0 phase selection signal generating circuit 1030. Accordingly, the detailed explanation thereof is omitted.

Figure 11:
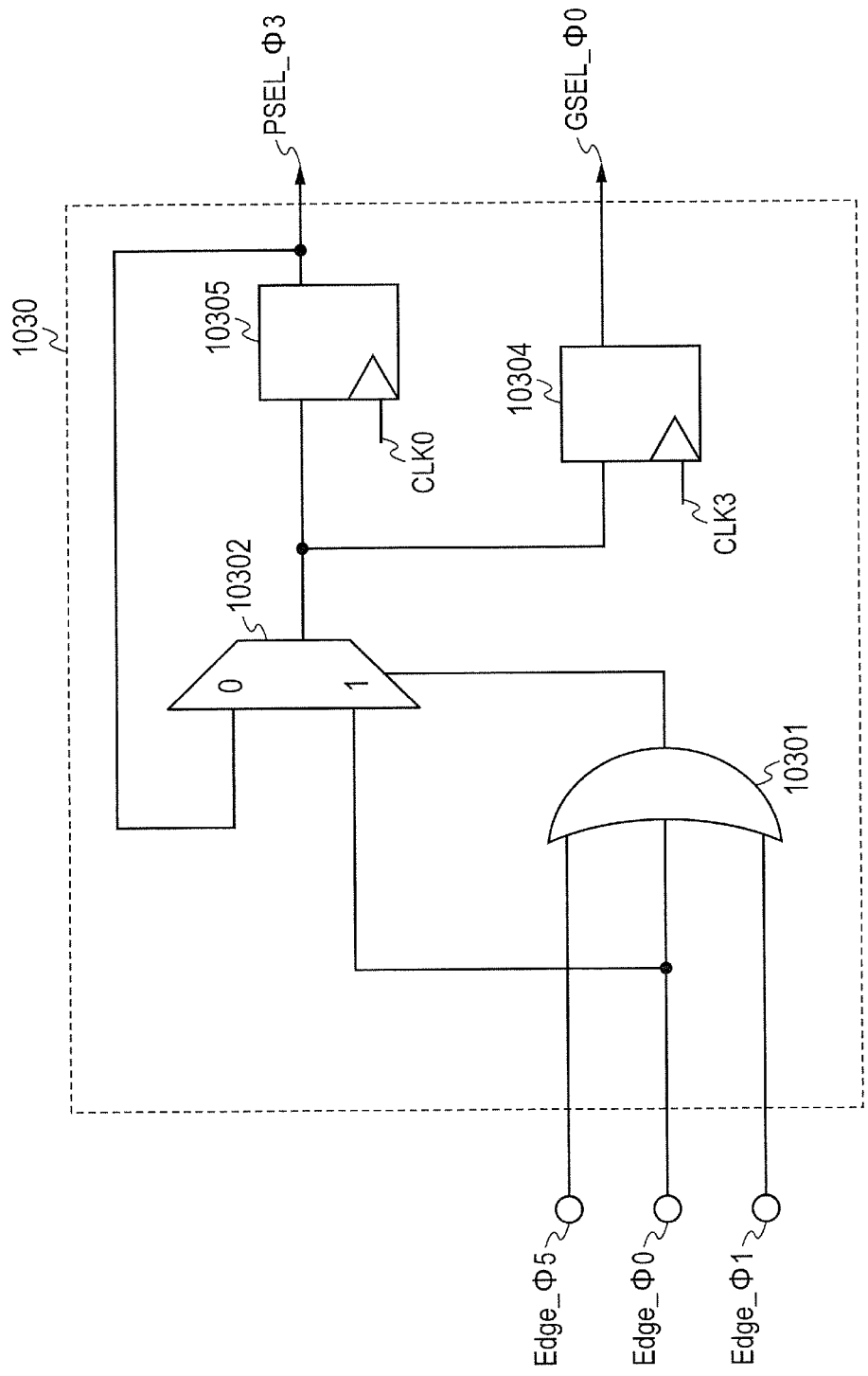
FIG. 11 is a drawing illustrating a configuration of a Φ0 phase selection signal generating circuit 1030 which is M=0 of six ΦM phase selection signal generating circuits 1030-1035 of the phase selection signal generating circuit 103, according to Embodiment 1 of the present invention illustrated in FIG. 10.

FIG. 11 illustrates a configuration of the Φ0 phase selection signal generating circuit 1030 which is M=0 among the six ΦM phase selection signal generating circuits 1030-1035 of the phase selection signal generating circuit 103, according to Embodiment 1 of the present invention illustrated in FIG. 10.

As illustrated in FIG. 11, the Φ0 phase selection signal generating circuit 1030 comprises a three-input OR circuit 10301, a two-input selector 10302, and two delay flip-flop DFFs 10304 and 10305. The three-input OR circuit 10301 is supplied with three edge detection signals Edge_Φ5, Edge_Φ0, and Edge_Φ1. When any one of three edge detection signals Edge_Φ5, Edge_Φ0, or Edge_Φ1 is a high level, the three-input OR circuit 10301 generates a high level output signal. Therefore, the three-input OR circuit 10301 operates as an edge existence determination circuit which determines the existence or nonexistence of the data edge of the received data signal RXDATA.

The two-input selector circuit 10302 outputs the input signal supplied to the input terminal on the side of a low level "0" when the output signal of the three-input OR circuit 10301 is a low level, and outputs the input signal supplied to the input terminal on the side of a high level "1" when the output signal of the three-input OR circuit 10301 is a high level. The input terminal on the side of a high level "1" and the input terminal on the side of a low level "0" of the two-input selector circuit 10302 are supplied respectively with the first edge detection signal Edge_Φ0 and the fourth phase selection signal PSEL_Φ3 generated by the delay flip-flop DFF 10305.

Namely, when any one of the three edge detection signals Edge_Φ5, Edge_Φ0, or Edge_Φ1, which are different in timing, becomes a high level signal, the two-input selector circuit 10302 generates the value of the first edge detection signal Edge_Φ0 of the middle timing which is the input signal on the side of a high level "1" of the selector input terminal, in order to update the edge detection phase. When none of the three edge detection signals Edge_Φ5, Edge_Φ0, and Edge_Φ1, which are different in timing, is a high level signal, the two-input selector circuit 10302 maintains the value of the fourth phase selection signal PSEL_Φ3 which is the phase selection signal generated one cycle earlier of the clock signal CLK.

Next, the following explains the reason why three edge detection signals Edge_Φ5, Edge_Φ0, and Edge_Φ1 which are different in timing are supplied to the three-input OR circuit 10301.

As for the six gate control signals GSEL_Φ0-GSEL_Φ5 generated by the phase selection signal generating circuit 103 illustrated in FIG. 10, during the selection period of the edge detection phase, only one of the six gate control signals is set to a high level, and the other signals are set to a low level. As for the six phase selection signals PSEL_Φ0-PSEL_Φ5 generated by the phase selection signal generating circuit 103 illustrated in FIG. 10, during the selection period of the selection clock phase of the reproduction clock RCLK by the clock data generating circuit 104 to be explained in full detail in FIG. 14, only one of the six phase selection signals is set to a high level, and the other signals are set to a low level.

Accordingly, for example, the Φ0 phase selection signal generating circuit 1030 of the phase selection signal generating circuit 103 illustrated in FIG. 10 is required to perform the operation which controls the first gate control signal GSEL_Φ0 and the fourth phase selection signal PSEL_Φ3 to a high level, and the operation which controls the first gate control signal GSEL_Φ0 and the fourth phase selection signal PSEL_Φ3 to a low level.

When the Φ0 phase selection signal generating circuit 1030 illustrated in FIG. 11 controls the first gate control signal GSEL_Φ0 and the fourth phase selection signal PSEL_Φ3 to a high level, the three-input OR circuit 10301 of the Φ0 phase selection signal generating circuit 1030 is supplied with the first edge detection signal Edge_Φ0 of a high level which is generated in response to the sixth "up" signal UP_Φ5 or the second "down" signal DN_Φ1 generated inside the edge detection circuit 105 illustrated in FIG. 6. Therefore, the three-input OR circuit 10301 of the Φ0 phase selection signal generating circuit 1030 illustrated in FIG. 11 generates a high level signal in response to the first edge detection signal Edge_Φ0 of a high level. Accordingly, the two-input selector 10302 of the Φ0 phase selection signal generating circuit 1030 supplies, to the delay flip-flop DFFs 10305 and 10304, the first edge detection signal Edge_Φ0 of a high level which is supplied to the input terminal on the side of a high level "1." Therefore, the delay flip-flop DFF 10305 latches the first edge detection signal Edge_Φ0 of a high level at the timing of the rising edge of the first clock signal CLK0, and updates the fourth phase selection signal PSEL_Φ3 from a low level to a high level. On the other hand, the delay flip-flop DFF 10304 latches the first edge detection signal Edge_Φ0 of a high level at the timing of the rising edge of the fourth clock signal CLK3, and updates the first gate control signal GSEL_Φ0 from a low level to a high level.

The following assumes the case where the Φ0 phase selection signal generating circuit 1030 illustrated in FIG. 11 controls the first gate control signal GSEL_Φ0 and the fourth phase selection signal PSEL_Φ3 to a low level on the contrary. In this case, the three-input OR circuit 10301 of the Φ0 phase selection signal generating circuit 1030 is supplied with the sixth edge detection signal Edge_Φ5 of a high level which is generated in response to the fifth "up" signal UP_Φ4 or the first "down" signal DN_Φ0 generated inside the edge detection circuit 105 illustrated in FIG. 6. The three-input OR circuit 10301 of the Φ0 phase selection signal generating circuit 1030 is supplied with the second edge detection signal Edge_Φ1 of a high level which is generated in response to the first "up" signal UP_Φ0 or the third "down" signal DN_Φ2 generated inside the edge detection circuit 105 illustrated in FIG. 6. Therefore, the three-input OR circuit 10301 of the Φ0 phase selection signal generating circuit 1030 illustrated in FIG. 11 generates a high level signal in response to the sixth edge detection signal Edge_Φ5 of a high level or the second edge detection signal Edge_Φ1 of a high level. However, in this case, the first edge detection signal Edge_Φ0 of the middle timing supplied to the three-input OR circuit 10301 is a low level. Accordingly, the first edge detection signal Edge_Φ0 of a low level is supplied to the delay flip-flop DFFs 10305 and 10304 via the input terminal on the side of a high level "1" of the two-input selector 10302 and the output terminal thereof. Therefore, the delay flip-flop DFF 10305 latches the first edge detection signal Edge_Φ0 of a low level at the timing of the rising edge of the first clock signal CLK0, and updates the fourth phase selection signal PSEL_Φ3 from a high level to a low level. The delay flip-flop DFF 10304 latches the first edge detection signal Edge_Φ0 of a low level at the timing of the fourth clock signal CLK3, and updates the first gate control signal GSEL_Φ0 from a high level to a low level.

Figure 12:
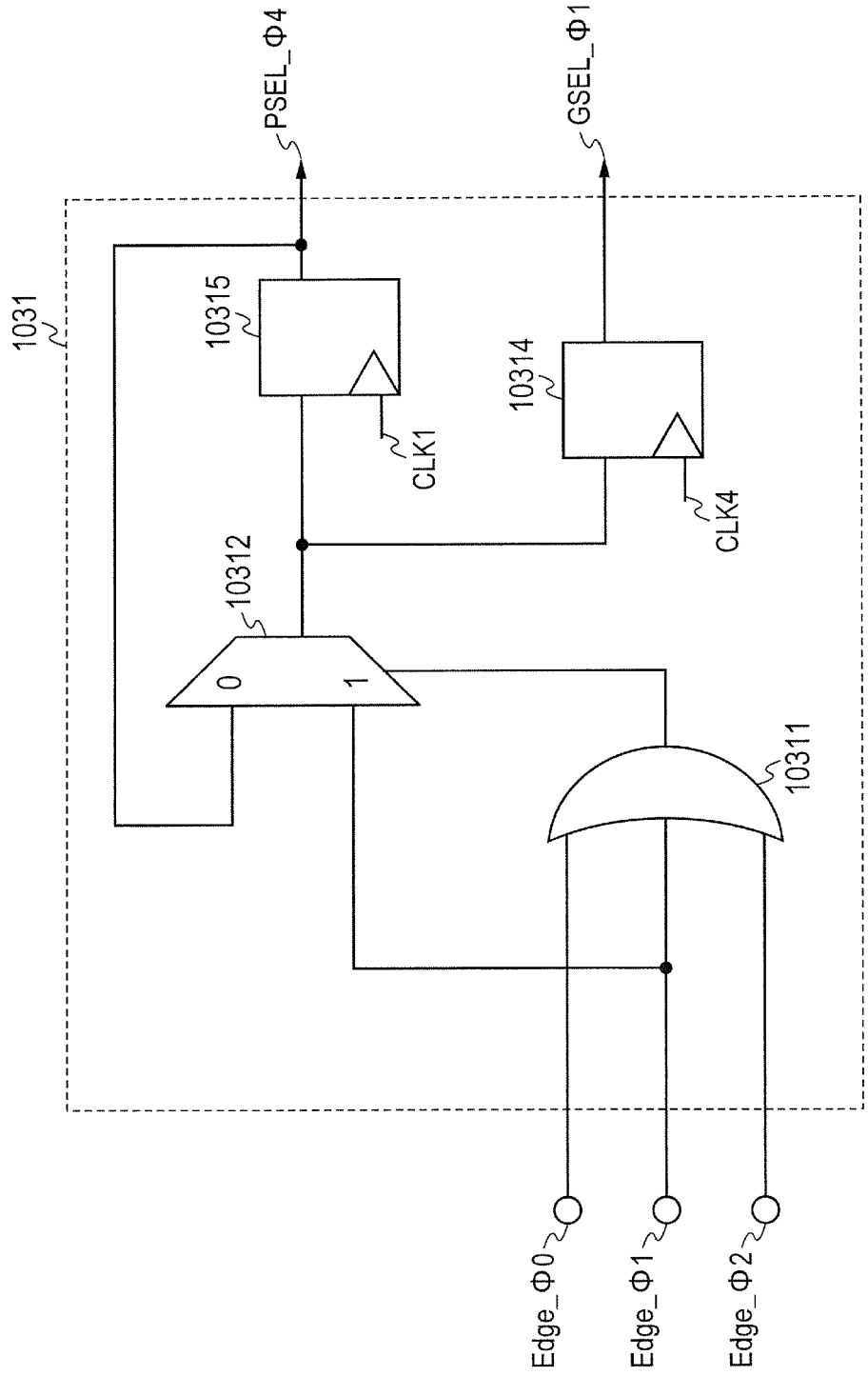
FIG. 12 is a drawing illustrating a configuration of a Φ1 phase selection signal generating circuit 1031 which is M=1 of the six ΦM phase selection signal generating circuits 1030-1035 of the phase selection signal generating circuit 103, according to Embodiment 1 of the present invention illustrated in FIG. 10.

FIG. 12 illustrates a configuration of the Φ1 phase selection signal generating circuit 1031 which is M=1 of the six ΦM phase selection signal generating circuits 1030-1035 of the phase selection signal generating circuit 103, according to Embodiment 1 of the present invention illustrated in FIG. 10.

As illustrated in FIG. 12, the Φ1 phase selection signal generating circuit 1031 comprises a three-input OR circuit 10311, a two-input selector 10312, and two delay flip-flop DFFs 10314 and 10315.

Figure 13:
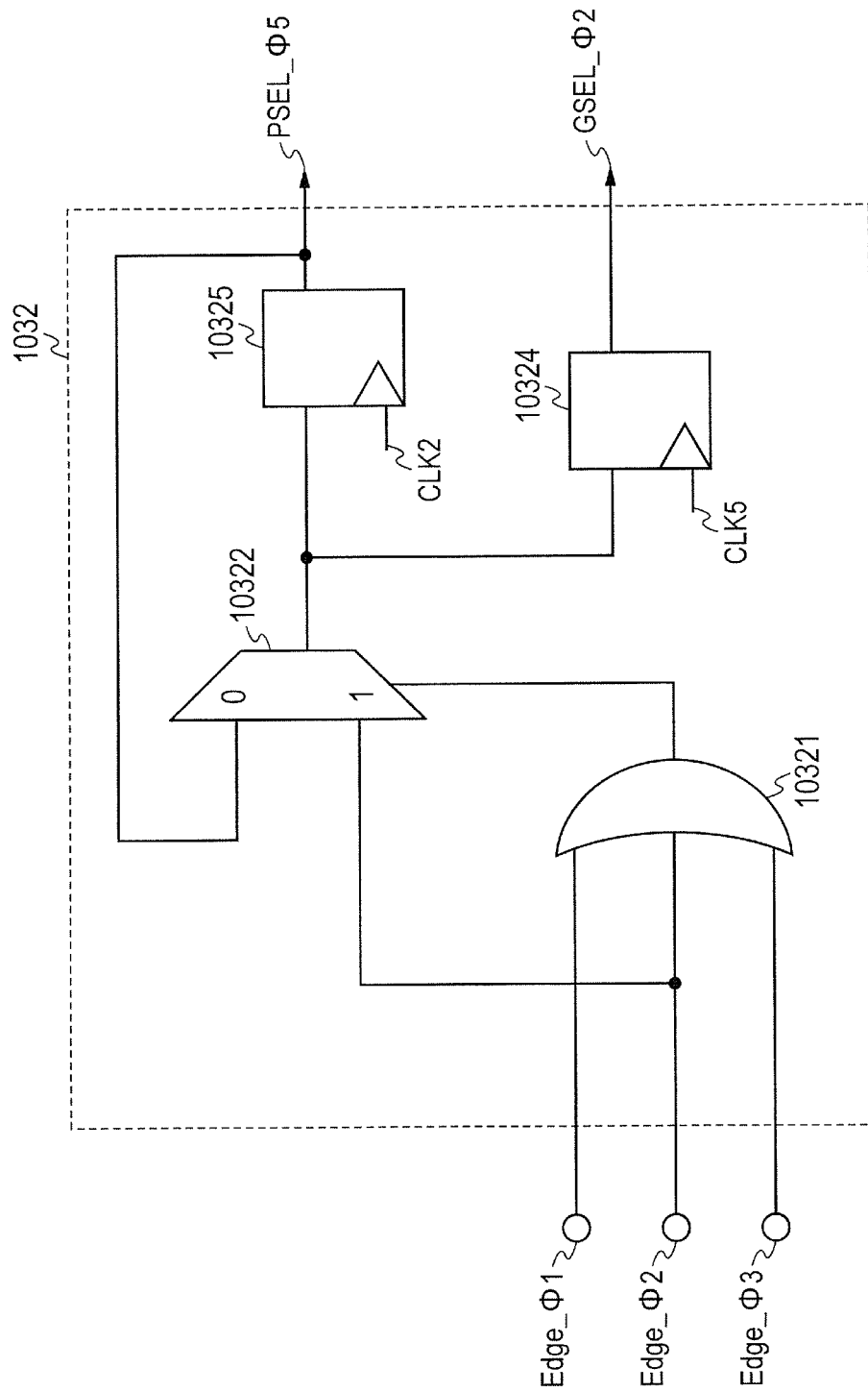
FIG. 13 is a drawing illustrating a configuration of a Φ2 phase selection signal generating circuit 1032 which is M=2 of the six ΦM phase selection signal generating circuits 1030-1035 of the phase selection signal generating circuit 103, according to Embodiment 1 of the present invention illustrated in FIG. 10.

FIG. 13 illustrates a configuration of the Φ2 phase selection signal generating circuit 1032 which is M=2 of the six ΦM phase selection signal generating circuits 1030-1035 of the phase selection signal generating circuit 103, according to Embodiment 1 of the present invention illustrated in FIG. 10.

As illustrated in FIG. 13, the Φ2 phase selection signal generating circuit 1032 comprises a three-input OR circuit 10321, a two-input selector 10322, and two delay flip-flop DFFs 10324 and 10325.

The circuit configurations of the Φ1 phase selection signal generating circuit 1031 and the Φ2 phase selection signal generating circuit 1032 illustrated in FIGS. 12 and 13 are the same as the circuit configuration of the Φ0 phase selection signal generating circuit 1030 illustrated in FIG. 11, and the phase relation of the input signal and the output signal is shifted only by one phase for each circuit. Accordingly, the explanation thereof is omitted.

In Embodiment 1 of the present invention, the change of the edge detection phase of the received data signal RXDATA at a time allows only the increase or decrease for one phase of the multi-phase clocks CLK0-CLK5. Accordingly, only three edge detection signals Edge_Φ5, Edge_Φ0, and Edge_Φ1 are supplied to the three-input OR circuit 10301 of the Φ0 phase selection signal generating circuit 1030 illustrated in FIG. 11.

However, in Embodiment 2 of the present invention to be described later, the change of the edge detection phase of the received data signal RXDATA at a time allows the increase or decrease up to two phases of the multi-phase clocks CLK0-CLK5. Accordingly, five edge detection signals Edge_Φ0, Edge_Φ1, Edge_Φ2, Edge_Φ4, and Edge_Φ5 are supplied to the Φ0 phase selection signal generating circuit 1030 illustrated in FIG. 26.

From the above explanation, it is understood that the following operation is executed in the clock data recovery circuit 1 according to Embodiment 1 of the present invention illustrated in FIG. 4. Namely, in response to the six-phase clock signals CLK0-CLK5 and the six edge detection signals Edge_Φ0-Edge_Φ5 generated by the edge detection circuit 105, the phase selection signal generating circuit 103 generates the six phase selection signals PSEL_Φ0-PSEL_Φ5 and the six gate control signals GSEL_Φ0-GSEL_Φ5. The six phase selection signals PSEL_Φ0-PSEL_Φ5 are supplied to the clock data generating circuit 104 to be explained in full detail with reference to FIG. 14. The six gate control signals GSEL_Φ0-GSEL_Φ5 control the active state and non-active state of the six ΦM edge detection circuits 1050-1055 which configure the edge detection circuit 105.

<<The Clock Data Generating Circuit>>

Figure 14:
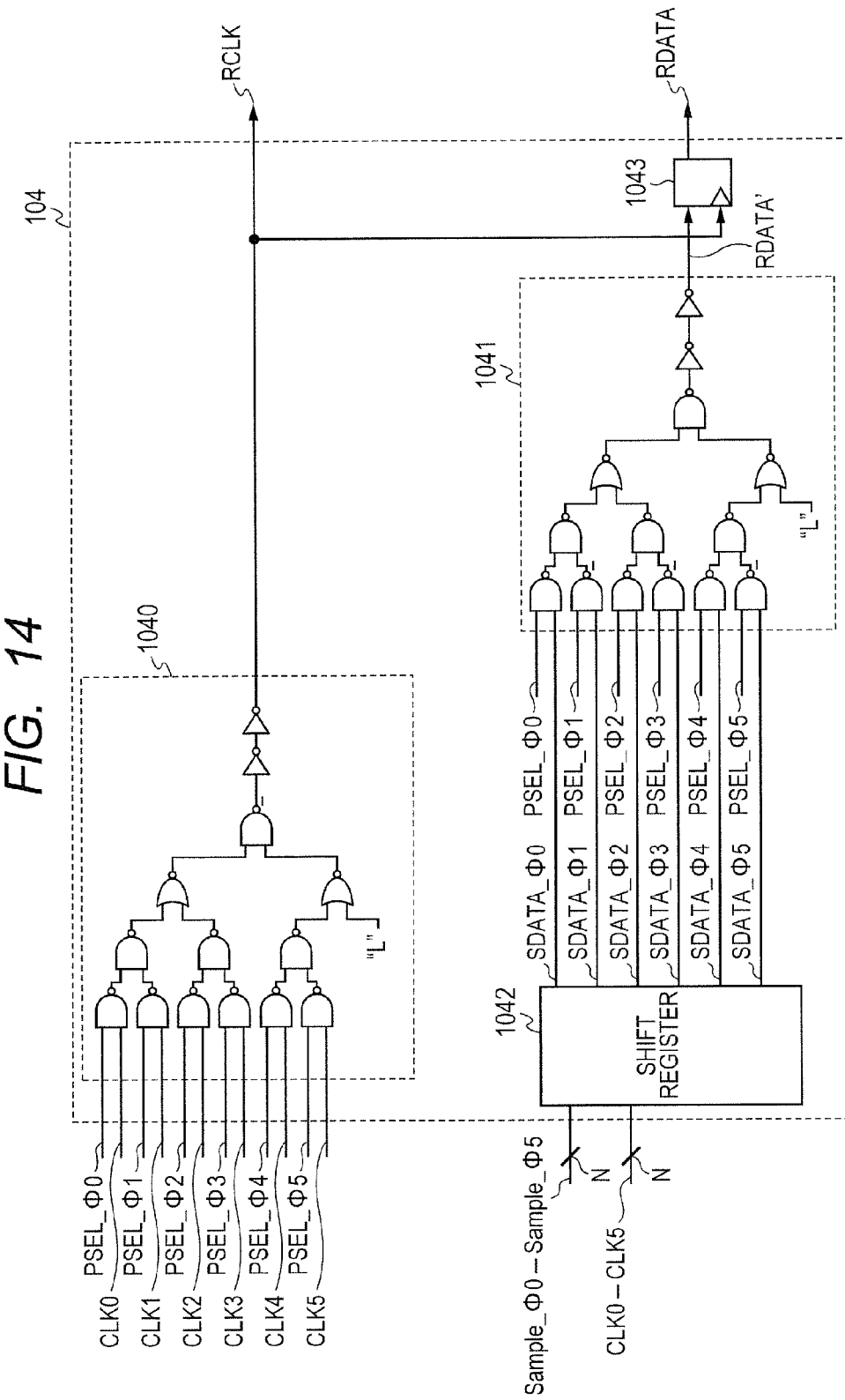
FIG. 14 is a drawing illustrating a configuration of a clock data generating circuit 104 of the clock data recovery circuit 1, according to Embodiment 1 of the present invention illustrated in FIG. 4.

FIG. 14 illustrates a configuration of the clock data generating circuit 104 of the clock data recovery circuit 1, according to Embodiment 1 of the present invention illustrated in FIG. 4.

The clock data generating circuit 104 illustrated in FIG. 14 comprises a clock generating circuit 1040, a data generating circuit 1041, a shift register 1042, and a delay flip-flop DFF 1043.

<<The Clock Generating Circuit of the Clock Data Generating Circuit>>

The clock generating circuit 1040 responds to the six-phase clock signals CLK0-CLK5 and the six phase selection signals PSEL_Φ0-PSEL_Φ5 generated by the phase selection signal generating circuit 103 illustrated in FIG. 10, and generates a reproduction clock RCLK. As described above, as for the six phase selection signals PSEL_Φ0-PSEL_Φ5 generated by the phase selection signal generating circuit 103 illustrated in FIG. 10, only one of the six phase selection signals is set to a high level and the other signals are set to a low level, in the selection period of the selection clock phase of the reproduction clock RCLK by the clock data generating circuit 104 illustrated in FIG. 14.

The clock generating circuit 1040 of the clock data generating circuit 104 illustrated in FIG. 14 comprises six two-input NAND circuits which function as the first stage of the logic circuit and are supplied respectively with six phase selection signals PSEL_Φ0-PSEL_Φ5 and six six-phase clock signals CLK0-CLK5. Six output signals from the first stage of the six two-input NAND circuits are supplied to three two-input NAND circuits which function as the second stage of the logic circuit of the clock generating circuit 1040. Three output signals from the three two-input NAND circuits as the second stage of the logic circuit are supplied to two two-input NOR circuits which function as the third stage of the logic circuit of the clock generating circuit 1040. Two output signals of the two two-input NOR circuits as the third stage of the logic circuit are supplied to one two-input NAND circuit which functions as the fourth stage of the logic circuit of the clock generating circuit 1040. One output signal of the one two-input NAND circuit as the fourth stage of the logic circuit is supplied to two series-coupled negative logic circuits which function as the fifth stage of the logic circuit of the clock generating circuit 1040. The reproduction clock RCLK is generated from the output terminal of the negative logic circuits.

Therefore, when only the first phase selection signal PSEL_Φ0 of the six phase selection signals PSEL_Φ0-PSEL_Φ5 is selected as a high level for example, the first clock signal CLK0 is selected by the first two-input NAND circuit in the first stage as the reproduction clock RCLK. Namely, the output clock signal of the first two-input NAND circuit in the first stage selected in this way is generated as the reproduction clock RCLK, via the first two-input NAND circuit in the second stage, the first two-input NOR circuit in the third stage, the first two-input NAND circuit in the fourth stage, and the two series-coupled negative logic circuits in the fifth stage.

<<The Shift Register of the Clock Data Generating Circuit>>

The shift register 1042 of the clock data generating circuit 104 illustrated in FIG. 14 responds to the six-phase clock signals CLK0-CLK5 and the six sampling signals Sample_Φ0-Sample_Φ5 generated by the sampling circuit 106 illustrated in FIG. 5, and generates six delay sampling data signals SDATA_Φ0-SDATA_Φ6.

The delay time between the six sampling signals Sample_Φ0-Sample_Φ5 supplied to the shift register 1042 and the six delay sampling data signals SDATA_Φ0-SDATA_Φ5 generated by the shift register 1042 is set as two cycles of the clock period of the six-phase clock signals CLK0-CLK5. The delay time of two cycles in the shift register 1042 is provided in consideration of the delay time to the selection change of the clock used as the reproduction clock RCLK from the six-phase clock signals CLK0-CLK5, as will be explained in full detail with reference to FIG. 15.

<<The Data Generating Circuit of the Clock Data Generating Circuit>>

The configuration of the data generating circuit 1041 of the clock data generating circuit 104 illustrated in FIG. 14 is the same as that of the clock generating circuit 1040 described above. However, the data generating circuit 1041 responds to the six phase selection signals PSEL_Φ0-PSEL_Φ5 generated by the phase selection signal generating circuit 103 illustrated in FIG. 10 and the six delay sampling data signals SDATA_Φ0-SDATA_Φ5 generated by the shift register 1042 described above, and generates a first reproduction data RDATA'.

Since the data generating circuit 1041 has the same configuration as the clock generating circuit 1040 described above, when only the fourth phase selection signal PSEL_Φ3 is selected as a high level among the six phase selection signals PSEL_Φ0-PSEL_Φ5, the fourth-output delay sampling data signal SDATA_Φ3 from the fourth two-input NAND circuit in the first stage is selected as the first reproduction data RDATA'.

As explained in the above, the data generating circuit 1041 generates one delay sampling data signal selected from the six delay sampling data signals SDATA_Φ0-SDATA_Φ5, corresponding to the phase selection signal selected as a high level among the six phase selection signals PSEL_Φ0-PSEL_Φ5, as the first reproduction data RDATA' via five stages of the logic gate delay. Also when one of the six delay sampling data signals SDATA_Φ0-SDATA_Φ5 is selected as the first reproduction data RDATA', the delay is always given by five stages of the same logic gate delay; therefore, glitch in the time of the selection change which may arise from the difference in the gate propagation delay time does not occur, and it is possible to generate stably the first reproduction data RDATA'.

The first reproduction data RDATA' generated in this way from the output terminal of the data generating circuit 1041 of FIG. 14 is supplied to the data input terminal of the delay flip-flop DFF 1043 coupled to the output terminal of the data generating circuit 1041. The reproduction clock RCLK generated by the clock generating circuit 1040 described above is supplied to the trigger input terminal of the delay flip-flop DFF 1043. Accordingly, it becomes possible to generate the final reproduction data RDATA of the clock data recovery circuit 1 from the output terminal of the delay flip-flop DFF 1043.

<<Operation of the Clock Data Recovery Circuit>>

FIG. 15 is a timing chart illustrating operation of the clock data recovery circuit 1 according to Embodiment 1 of the present invention, explained with reference to FIGS. 1 through 14.

The clock data recovery circuit 1 according to Embodiment 1 of the present invention performs the following operation as the initializing operation at the time of power-on or at the time of standby cancellation. Namely, the clock data recovery circuit 1 sets one arbitrary gate control signal, for example, the first gate control signal GSEL_Φ0, among the six gate control signals GSEL_Φ0-GSEL_Φ5, to the selection level of a high level, and further sets the fourth phase selection signal PSEL_Φ3, which is shifted from the one arbitrary selected gate control signal GSEL_Φ0 by +3 phases (0.5 UI), to the selection level of a high level.

In order to avoid complication of the following explanation, it is assumed that the description called an edge detection phase is the same phase as the selection phase of one gate control signal selected from the six gate control signals GSEL_Φ0-GSEL_Φ5, and is expressed as phase 0-phase 5. Therefore, it should be noted that the edge detection phase is distinguished from the phase selection signal of the reproduction clock RCLK (one phase selection signal selected from the six phase selection signals PSEL_Φ0-PSEL_Φ5) which is shifted from the edge detection phase (one selected gate control signal) by +3 phases (0.5 UI).

<<Initializing Operation>>

At timing t of t<te(0) illustrated in FIG. 15, in order to execute the initializing operation described above, among the six gate control signals GSEL_Φ0-GSEL_Φ5, the first gate control signal GSEL_Φ0 is set to the selection level of a high level and the other gate control signals GSEL_Φ1-GSEL_Φ5 are set to the non-selection level of a low level. At the same timing t, among the six phase selection signals PSEL_Φ0-Φ5, the fourth phase selection signal PSEL_Φ3 shifted from the selected first gate control signal GSEL_Φ0 by +3 phases (0.5 UI) is selected and set to the selection level of a high level, and the other phase selection signals PSEL_Φ0-PSEL_Φ2, PSEL_Φ4, and PSEL_Φ5 are set to the non-selection level of a low level. Namely, at timing t of t<te(0), only the Φ0 edge detection circuit 1050 is controlled to an active state among the six ΦM edge detection circuits 1050-1055 of the edge detection circuit 105 illustrated in FIG. 6, and the edge detection phase is defined as phase 0. At timing t of t<te(0), the clock data generating circuit 104 illustrated in FIG. 14 selects the fourth clock signal CLK3 out of the six-phase clock signals CLK0-CLK5 as the reproduction clock RCLK by the fourth phase selection signal PSEL_Φ3.

<<The Data Edge of the Received Data Signal>>

The following assumes the case where the received data signal RXDATA shifts from a low level to a high level at timing t=te(0), that is, the case where the data edge of the received data signal RXDATA has come between the rising edge of the first clock signal CLK0 and the rising edge of the second clock signal CLK1. In this case, by sampling the high level of the received data signal RXDATA at the rise timing t=t1(0) of the second clock signal CLK1, with the use of the delay flip-flop DFF 1061 of the sampling circuit 106 illustrated in FIG. 5, the second sampling signal Sample_Φ1 becomes a high level. On the other hand, at this timing t=te(0), the fourth sampling signal Sample_Φ3 is a low level.

Accordingly, in the period of timing te(0)<t1(0)≤t≤t3(0), the output signal of the exclusive OR circuit 105020 of the Φ0 edge detection circuit 1050 illustrated in FIG. 7, to which the second sampling signal Sample_Φ1 of a high level and the fourth sampling signal Sample_Φ3 of a low level are supplied, also becomes a high level. The sixth sampling signal Sample_Φ5 is also a low level in the present period of timing; accordingly, the output signal of the exclusive OR circuit 105010 of the Φ0 edge detection circuit 1050 illustrated in FIG. 7, to which the fourth sampling signal Sample_Φ3 of a low level and the sixth sampling signal Sample_Φ5 of a low level are supplied, is a low level. In the Φ0 edge detection circuit 1050 illustrated in FIG. 7, by sampling the low level output signal of the exclusive OR circuit 105010 at timing t=t2(0) of a rising edge of the third clock signal CLK2 with the use of the delay flip-flop DFF 105011, the output signal obtained from the delay flip-flop DFF 105011 is a low level. This low level output signal is supplied to the input of the inverter 105021, and the output of the inverter 105021 becomes a high level. The high level output signal of the inverter 105021 is held at least until timing t=t2(1) at which the next third clock signal CLK2 rises. Accordingly, the output of the AND circuit 105022, to which the high level output signal of the exclusive OR circuit 105020 and the high level output signal of the inverter 105021 are supplied, becomes a high level. At this timing, the first gate control signal GSEL_Φ0 is a high level. Accordingly, the output of the AND circuit 105023, to which the high level output of the AND circuit 105022 and the first gate control signal GSEL_Φ0 of a high level are supplied, becomes a high level; that is, the "up" output signal UP_Φ0 of the Φ0 edge detection circuit 1050 becomes a high level. However, the fourth sampling signal Sample_Φ3 also becomes a high level after the rise timing t=t3(0) of the fourth clock signal CLK3. The output of the exclusive OR circuit 105020 of the Φ0 edge detection circuit 1050 illustrated in FIG. 7, to which the second sampling signal Sample_Φ1 and the fourth sampling signal Sample_Φ3 are supplied at this timing, becomes a low level. At this timing, the output of the delay flip-flop DFF 105011 of the Φ0 edge detection circuit 1050 illustrated in FIG. 7 still maintains a low level, and the output of the inverter circuit 105021 also maintains a high level, reflecting the low level output of the delay flip-flop DFF 105011. Accordingly, the output of the AND circuit 105022, to which the low level output of the exclusive OR circuit 105020 and the high level output of the inverter 105021 are supplied, becomes a low level. Although the first gate control signal GSEL_Φ0 still maintains a high level at this timing, the output of the AND circuit 105022 is a low level. Therefore, the output of the AND circuit 105023, to which the low level output of the AND circuit 105022 and the first gate control signal GSEL_Φ0 of a high level is supplied, becomes a low level; that is, the "up" output signal UP_Φ0 of the Φ0 edge detection circuit 1050 illustrated in FIG. 7 becomes a low level. That is, at the rise timing t=t3(0) of the fourth clock signal CLK3, the "up" output signal UP_Φ0 of the Φ0 edge detection circuit 1050 illustrated in FIG. 7 becomes a low level again. In this way, the "up" output signal UP_Φ0 becomes a high level in the period of timing t1(0)<t<t3(0), and the second clock signal CLK1 is maintained at a high level in this period of timing. However, the "up" output signal UP_Φ0 of a high level is not sampled by the delay flip-flop DFF 10514 via the OR circuit 10513 in the edge detection circuit 105 illustrated in FIG. 6, and the second edge detection signal Edge_Φ1, which is the output of the delay flip-flop DFF 10514, is maintained at a low level.

At this timing t=t3(0), the Φ2 edge detection circuit 1052 included in the edge detection circuit 105 illustrated in FIG. 6 is still in a non-active state in response to the third gate control signal GSEL_Φ2 of a low level, and the "down" output signal DN_Φ2 thereof maintains a low level consistently. As a result, supplied with the "down" output signal DN_Φ2 of a low level, the value of the output of the OR circuit 10513 included in the edge detection circuit 105 illustrated in FIG. 6 becomes equal to the value of the "up" output signal UP_Φ0 of a low level of the Φ0 edge detection circuit 1050. Accordingly, even if the delay flip-flop DFF 105114 of the edge detection circuit 105 illustrated in FIG. 6 samples the low level output signal of the OR circuit 10513 at the timing of the rising edge of the second clock signal CLK1, the second edge detection signal Edge_Φ1 generated by the delay flip-flop DFF 105114 remains at a low level at the next rise timing t=t1(1) of the second clock signal CLK1.

At timing t≤t1(1), five pieces of the Φ1 edge detection circuit 1051 through the Φ5 edge detection circuit 1055, included in the edge detection circuit 105 illustrated in FIG. 6, are in a non-active state, in response to five gate control signals GSEL_Φ1-GSEL_Φ5 of a low level. Accordingly, five "up" output signals UP_Φ1-UP_Φ5, and five "down" output signals DN_Φ1-DN_Φ5 are all at a low level, and six edge detection signals Edge_Φ0-Edge_Φ5 also remain at a low level. As a result, the output of the three-input OR circuit 10301 included in the Φ0 phase selection signal generating circuit 1030 illustrated in FIG. 11 remains at a low level; accordingly, the selector 10302 continues selection of the input terminal on the side of a low level "0", and the fourth phase selection signal PSEL_Φ3 of a high level is supplied to the delay flip-flop DFFs 10305 and 10304 via the selector 10302. Then, the delay flip-flop DFF 10304 samples the high level output signal of the selector 10302 at the rise timing t=t3(1) of the fourth clock signal CLK3, and maintains continuously the high level of the first gate control signal GSEL_Φ0. Similarly, the delay flip-flop DFF 10305 samples the high level output signal of the selector 10302 at the rise timing t=t0(2) of the first clock signal CLK0, and maintains continuously the high level of the fourth phase selection signal PSEL_Φ3. Since the six edge detection signals Edge_Φ0-Edge_Φ5 are all at a low level, the other five pieces of the Φ1 phase selection signal generating circuit 1031 through the Φ2 phase selection signal generating circuit 1035 also maintain continuously the low level of the gate control signals GSEL_Φ1-GSEL_Φ5, and the low level of the five phase selection signals PSEL_Φ0-PSEL_Φ2, PSEL_Φ4, and PSEL_Φ5 is maintained continuously, except for the high level of the fourth phase selection signal PSEL_Φ3. As a result, the clock data generating circuit 104 illustrated in FIG. 14 continues selecting the fourth clock signal CLK3 out of the six-phase clock signals CLK0-CLK5 as the reproduction clock RCLK, in response to the fourth phase selection signal PSEL_Φ3 of the high level.

As explained in the above, the following assumes the case where the data edge position of the received data signal RXDATA exists within the range of ±1 phase from phase 0 of the first clock signal CLK0 which is the edge detection phase selected currently (in the example described above, the case where the data edge of the received data signal RXDATA has come between the rising edge of the sixth clock signal CLK5 and the rising edge of the second clock signal CLK1). It is understood that, in the present case, selection of phase 0 of the first clock signal CLK0 which is the current edge detection phase is held continuously.

Next, the following assumes the case where the received data signal RXDATA shifts from a high level to a low level at timing t=te(1), that is, the case where the data edge (falling edge) of the received data signal RXDATA has come between the rising edge of the third clock signal CLK2 and the rising edge of the fourth clock signal CLK3. In this case, at the rise timing t=t1(1) of the second clock signal CLK1, the received data signal RXDATA continues still to be a high level. Accordingly, the second sampling signal Sample_Φ1, as a sampling result of the second clock signal CLK1 of the received data signal RXDATA at the rise timing t=t1(1) by the delay flip-flop DFF 1061 of the sampling circuit 106 illustrated in FIG. 5, remains at a high level. At this timing t=t1(1), the sixth sampling signal Sample_Φ5 and the fourth sampling signal Sample_Φ3 are held at a high level. Accordingly, the exclusive OR circuit 105010 of the Φ0 edge detection circuit 1050 illustrated in FIG. 7 is supplied with the high level of the fourth sampling signal Sample_Φ3 and the high level of the sixth sampling signal Sample_Φ5 at the rise timing t=t2 of the third clock signal CLK2(1), and the output of the exclusive OR circuit 105010 holds a low level. Accordingly, the low level output of the exclusive OR circuit 105010 is sampled by the delay flip-flop DFF 105011 at the timing of the rising edge of the third clock signal CLK2. The low level output of the delay flip-flop DFF 105011 is inputted into the inverter 105021, and the output of the inverter 105021 holds a high level. The output of the inverter 105021 holds the high level at least until the timing t=t2(2) at which the next rising edge of the third clock signal CLK2 comes. On the other hand, at the rise timing t=t3(1) of the fourth clock signal CLK3, the received data signal RXDATA has become a low level; accordingly, the fourth sampling signal Sample_Φ3, as the sampling result of the received data signal RXDATA at the rise timing t=t3(1) of the fourth clock signal CLK3 by the delay flip-flop DFF 1063 of the sampling circuit 106 illustrated in FIG. 5, shifts from a high level to a low level. At this timing t=t3(1), the fourth sampling signal Sample_Φ3 is a low level, and the sixth sampling signal Sample_Φ5 is a high level; therefore, the output of the exclusive OR circuit 105010 of the Φ0 edge detection circuit 1050 illustrated in FIG. 7 becomes a high level. However, at timing t=t3(1), the third clock signal CLK2 which is a trigger input signal of the delay flip-flop DFF 10511 is maintained at a high level; accordingly, the delay flip-flop DFF 10511 prevents that the high level output signal of the exclusive OR circuit 105010 at this timing t=t3(1) is transferred to the latter stage circuit. This is the reason why the delay flip-flop DFF 10511 is coupled to the output terminal of the exclusive OR circuit 105010 of the Φ0 edge detection circuit 1050 illustrated in FIG. 7. Accordingly, also at timing t=t3(1), the output of the delay flip-flop DFF 105011 maintains a low level, and the low level output signal of the delay flip-flop DFF 105011 is inputted into the inverter 105021, and the output of the inverter 105021 maintains a high level. Namely, it is prevented by the delay flip-flop DFF 105011 that the shift to a low level of the fourth sampling signal Sample_Φ3 is transferred to the latter stage circuit of the delay flip-flop DFF 10511, and it is also prevented that the output of the inverter 105021 shifts to a low level in response to the shift to the low level of the sixth sampling signal Sample_Φ5. As known well, the delay flip-flop DFF has function of sampling and holding the input data at the time of the rising edge of an input CLK as a trigger input signal. Accordingly, the output of the exclusive OR circuit 105010 of the fourth sampling signal Sample_Φ3 and the sixth sampling signal Sample_Φ5 is updated inside the delay flip-flop DFF 10511 at the timing at which the rising edge of the third clock signal CLK2 is supplied to the trigger input terminal of the delay flip-flop DFF 10511. Namely, the output of the exclusive OR 105010 of the fourth sampling signal Sample_Φ3 and the sixth sampling signal Sample_Φ5 is updated inside the delay flip-flop DFF 10511 at timing t=t2(1), t2(2), t2(3), . . . .

In this way, it is prevented that the high level of the exclusive OR circuit 105010 by the low level of the fourth sampling signal Sample_Φ3 is transferred to the latter stage circuit of the delay flip-flop DFF 10511 at timing t=t3(1), and the output of the delay flip-flop DFF 10511 keeps a low level which is the sample result at timing t=t2(1). When it goes through timing t=t3(1) and arrives at the next update timing t=t2(2), the fourth sampling signal Sample_Φ3 and the sixth sampling signal Sample_Φ5 are both at a low level, and the output of the exclusive OR circuit 105010 is also a low level. Accordingly, even if the delay flip-flop DFF 10511 is updated by the third clock signal CLK2 as the trigger input signal at timing t=t2(2), the output signal of the delay flip-flop DFF 10511 becomes a low level. As a result, the output of the delay flip-flop DFF 10511 is a low level, and the output of the inverter 105021 maintains a high level. The following assumes a relation where, on the basis of the first clock signal CLK0 which is the own phase of the Φ0 edge detection circuit 1050 illustrated in FIG. 7, the data edge of the received data signal RXDATA does not exist between the edge of the sixth clock signal CLK5 leading by one phase and the edge of the fourth clock signal CLK3 leading by three phases. In this relation, at the update timing of t=t2(1), t2(2), t2(3), . . . , all the outputs of the exclusive OR circuit 105010 which has responded to the fourth sampling signal Sample_Φ3 and the sixth sampling signal Sample_Φ5 become a low level. Therefore, the output of the delay flip-flop DFF 105011 also always becomes a low level, and the output of inverter 105021 also is a high level continuously. That is, in the time range of the timing chart illustrated in FIG. 15, the inverter 105021 always generates a high level output. Accordingly, at timing t=t3(1), the output of the exclusive OR circuit 105020 of FIG. 7, to which the second sampling signal Sample_Φ1 of a high level and the fourth sampling signal Sample_Φ3 of a low level are supplied, shifts from a low level to a high level. Accordingly, the output of the AND circuit 105022, to which the high level output of the exclusive OR circuit 105020 and the high level output of the inverter 105021 are supplied, becomes a high level. At this time, the first gate control signal GSEL_Φ0 still maintains a high level, and the output of the AND circuit 105022 is a high level. Therefore, the output of the AND circuit 105023, to which the high level output of the AND circuit 105022 and the high level of the first gate control signal GSEL_Φ0 is supplied, shifts from a low level to a high level at timing t=t3(1), as well as the "up" output signal UP_Φ0 of the Φ0 edge detection circuit 1050. Accordingly, until the next rise timing t=t1(2) of the second clock signal CLK1 at which the second sampling signal Sample_Φ1 of the delay flip-flop DFF 1061 of the sampling circuit 106 illustrated in FIG. 5 shifts from a high level to a low level, that is, during the period t given by t3(1)≤t≤t1(2), the "up" output signal UP_Φ0 of the Φ0 edge detection circuit 1050 maintains a high level. Namely, the "up" output signal UP_Φ0 does not fall at the rising edge of the fourth clock signal CLK3 as at timing t3(0), but maintains a high level until the rising edge t1(2) of the second clock signal CLK1, and falls from a high level to a low level at timing t1(2) immediately after the rising of the second clock signal CLK1. At this time, the Φ2 edge detection circuit 1052 of the edge detection circuit 105 illustrated in FIG. 6 is still in a non-active state, in response to the third gate control signal GSEL_Φ2 of a low level. Accordingly, the "down" output signal DN_Φ2 of the Φ2 edge detection circuit 1052 maintains a low level. On the other hand, at timing t=t1(2) at which the second clock signal CLK1 rises from a low level to a high level, the delay flip-flop DFF 105114 illustrated in FIG. 6 samples the input signal, or equivalently, the "up" output signal UP_Φ0 of a high level of the Φ0 edge detection circuit 1050 supplied via the OR circuit 10513, at the rising edge of the second clock signal CLK1. Accordingly, the second edge detection signal Edge_Φ1 which is the output of the delay flip-flop DFF 105114 shifts from a low level to a high level. When the second edge detection signal Edge_Φ1 becomes a high level, in the Φ0 phase selection signal generating circuit 1030 illustrated in FIG. 11, the selector 10302 selects the input terminal on the side of a high level "1" and transfers the low level of the first edge detection signal Edge_Φ0 to two delay flip-flop DFFs 10305 and 10304 in the latter stage. Namely, at timing t=t3(2), the delay flip-flop DFF 10304 samples the input signal, or equivalently, the low level signal of the first edge detection signal Edge_Φ0 which is the output signal of the selector 10302, at the rising edge of the fourth clock signal CLK3. Accordingly, the first gate control signal GSEL_Φ0 as an output signal of the delay flip-flop DFF 10304 shifts from a high level to a low level. Accordingly, the Φ0 edge detection circuit 1050 of the edge detection circuit 105 illustrated in FIG. 6 shifts from an active state to a non-active state at timing t=t3(2), in response to the first gate control signal GSEL_Φ0 of a low level.

Next, at timing t=t0(3), in the Φ0 phase selection signal generating circuit 1030 illustrated in FIG. 11, the delay flip-flop DFF 10305 samples the low level signal of the first edge detection signal Edge_Φ0 generated from the selector 10302, in response to the rising edge of the first clock signal CLK0. Accordingly, the fourth phase selection signal PSEL_Φ3 which is an output signal of the delay flip-flop DFF 10305 shifts from a high level to a low level. As a result, the fourth phase selection signal PSEL_Φ3 shifts from a high level to a low level, and the phase selection signals PSEL_Φ0-PSEL_Φ2, PSEL_Φ4, and PSEL_Φ5 are at a low level; accordingly, the clock data generating circuit 104 illustrated in FIG. 14 enters in the cut-off state, that is, a not-selected state of the reproduction clock RCLK, and the reproduction clock RCLK becomes a low level.

In the Φ1 phase selection signal generating circuit 1031 illustrated in FIG. 12 on the other hand, the second edge detection signal Edge_Φ1 is a high level, and the selector 10312 selects the input terminal on the side of a high level "1", and transfers the high level signal of the second edge detection signal Edge_Φ1 to two delay flip-flop DFFs 10315 and 10314 in the latter stage circuit. Then, at timing t=t4(2), the delay flip-flop DFF 10314 samples the input signal, or equivalently, the high level signal of the second edge detection signal Edge_Φ1 which is the output signal of the selector 10312, at the rising edge of the fifth clock signal CLK4. Accordingly, the second gate control signal GSEL_Φ1 as the output signal of the delay flip-flop DFF 10314 shifts from a low level to a high level. Accordingly, the Φ1 edge detection circuit 1051 of the edge detection circuit 105 illustrated in FIG. 6 shifts from a non-active state to an active state at timing t=t4(2), in response to the second gate control signal GSEL_Φ1 of a high level, and the edge detection phase shifts from phase 0 to phase 1.

Next, at timing t=t1(3), the delay flip-flop DFF 10315 of the Φ1 phase selection signal generating circuit 1031 illustrated in FIG. 12 samples the input signal, or equivalently, the high level signal of the second edge detection signal Edge_Φ1 which is the output signal of the selector 10312, by the second clock signal CLK1. Accordingly, the fifth phase selection signal PSEL_Φ4 as the output signal of the delay flip-flop DFF 10315 shifts from a low level to a high level. Accordingly, at timing t=t1(3), as the reproduction clock RCLK to be generated by the clock data generating circuit 104 illustrated in FIG. 14, the fifth clock signal CLK4 is selected in lieu of the fourth clock signal CLK3 selected until then. It can be verified from the explanation of operation described above that the selection phase of the clock data generating circuit 104 illustrated in FIG. 14 has been changed from the fourth clock signal CLK3 to the fifth clock signal CLK4.

Next, turning back the clock, the following assumes the case where, at timing t=te(2), the received data signal RXDATA shifts from a low level to a high level, that is, the case where the data edge of the received data signal RXDATA arrives between the rising edge of the third clock signal CLK2 and the rising edge of the fourth clock signal CLK3. In the present case, at timing t=t3(2), the Φ0 edge detection circuit 1050 of the edge detection circuit 105 illustrated in FIG. 6 is already in a non-active state, in response to the first gate control signal GSEL_Φ0 of a low level, and, at timing t=t4(2), the Φ1 edge detection circuit 1051 of the edge detection circuit 105 illustrated in FIG. 6 is also in an active state, in response to the second gate control signal GSEL_Φ1 of a high level. The received data signal RXDATA is still a low level at the rise timing t=t2(2) of the third clock signal CLK2; accordingly, the third sampling signal Sample_Φ2 of the received data signal RXDATA sampled by the delay flip-flop DFF 1062 of the sampling circuit 106 illustrated in FIG. 5 becomes a low level. The first sampling signal Sample_Φ0 and the fifth sampling signal Sample_Φ4 become a low level at this time. Accordingly, at the rise timing t=t3(2) of the fourth clock signal CLK3, the output of the exclusive OR circuit 105110 of the Φ1 edge detection circuit 1051 illustrated in FIG. 8, to which the fifth sampling signal Sample_Φ4 of a low level and the first sampling signal Sample_Φ0 of a low level are supplied, holds a low level. Accordingly, the delay flip-flop DFF 105111 samples the low level output of the exclusive OR circuit 105110 at the rising edge of the third clock signal CLK2 and supplies the low level output to the input of the inverter 105121. The output of inverter 105121 holds a high level, at least until the timing t=t3(3) at which the next rising edge of the fourth clock signal CLK3 arrives. On the other hand, the received data signal RXDATA has already shifted from a low level to a high level at the rise timing t=t4(2) of the fifth clock signal CLK4; accordingly, the fifth sampling signal Sample_Φ4 of the received data signal RXDATA sampled by the delay flip-flop DFF 1064 of the sampling circuit 106 illustrated in FIG. 5 shifts from a low level to a high level. Accordingly, at timing t=t4(2), the output of the exclusive OR circuit 105120 of the Φ1 edge detection circuit 1051 illustrated in FIG. 8, to which the third sampling signal Sample_Φ2 of a low level and the fifth sampling signal Sample_Φ4 of a high level are supplied, shifts from a low level to a high level. At timing t=t4(2), the second gate control signal GSEL_Φ1 has changed from a low level to a high level, and the output of the OR circuit 105122 becomes a high level, by the high level output of the inverter circuit 105121 and the high level output of the exclusive OR circuit 105120. Accordingly, the output of the OR circuit 105123, to which the high level of the OR circuit 105122 and the high level of the second gate control signal GSEL_Φ1 are supplied, shifts from a low level to a high level at timing t=t4(2). That is, the second "up" output signal UP_Φ1 which is the output of the Φ1 edge detection circuit 1051 shifts from a low level to a high level at timing t=t4(2). Until the next rise timing t=t2(3) of the third clock signal CLK2 at which the third sampling signal Sample_Φ2 of the delay flip-flop DFF 1062 of the sampling circuit 106 illustrated in FIG. 5 shifts from a low level to a high level, that is, during the period t given by t4(2) t<t2(3), the "up" output signal UP_Φ1 of the Φ1 edge detection circuit 1051 maintains a high level. Namely, the "up" output signal UP_Φ1 does not fall at the rising edge of the fifth clock signal CLK4, but maintains a high level until the rise timing t=t2 of the third clock signal CLK2(3), and falls immediately after this timing t2(3). At timing t1(3), the Φ3 edge detection circuit 1053 of the edge detection circuit 105 illustrated in FIG. 6 is still in a non-active state, in response to the fourth gate control signal GSEL_Φ3 of a low level, and the "down" output signal DN_Φ3 maintains the low level. In the edge detection circuit 105 illustrated in FIG. 6, at timing t1(3), the output of the OR circuit 10523, to which the "up" output signal UP_Φ1 of a high level and the "down" output signal DN_Φ3 of a low level are supplied, is a high level. Next, at the rise timing t=t2(3) of the third clock signal CLK2, the delay flip-flop DFF 105124 of the edge detection circuit 105 illustrated in FIG. 6 samples the input signal, or equivalently, the high level output signal of the OR circuit 10523, at the rising edge of the third clock signal CLK2, and the third edge detection signal Edge_Φ2 which is the output of the delay flip-flop DFF 105124 shifts from a low level to a high level. In response to the third edge detection signal Edge_Φ2 becoming a high level, the selector 10312 of the Φ1 phase selection signal generating circuit 1031 illustrated in FIG. 12 selects the input terminal on the side of a high level "1", and transfers the second edge detection signal Edge_Φ1 of a low level to two delay flip-flop DFFs 10315 and 10314 in the latter stage circuit. That is, at timing t=t4(3), the delay flip-flop DFF 10314 samples the input signal, or equivalently, the low level signal of the second edge detection signal Edge_Φ1 which is the output signal of the selector 10312, at the rising edge of the fifth clock signal CLK4, and the second gate control signal GSEL_Φ1 as an output signal of the delay flip-flop DFF 10314 shifts from a high level to a low level. As a result, the Φ1 edge detection circuit 1051 illustrated in FIG. 8 shifts from an active state to a non-active state at timing t=t4(3), in response to the second gate control signal GSEL_Φ1 of a low level.

Next, at timing t=t1(4), in the Φ1 phase selection signal generating circuit 1031 illustrated in FIG. 12, the delay flip-flop DFF 10315 samples the low level signal of the second edge detection signal Edge_Φ1 generated from the selector 10312 at the rising edge of the second clock signal CLK1. Accordingly, the fifth phase selection signal PSEL_Φ4 as the output signal of the delay flip-flop DFF 10315 shifts from a high level to a low level. Accordingly, at timing t=t1(4), the fifth phase selection signal PSEL_Φ4 shifts from a high level to a low level, and the other phase selection signals PSEL_Φ0-PSEL_Φ3, and PSEL_Φ5 are at a low level; accordingly, the clock data generating circuit 104 illustrated in FIG. 14 enters in the cut-off state, that is a not-selected state of the reproduction clock RCLK, and the reproduction clock RCLK becomes a low level.

In the Φ2 phase selection signal generating circuit 1032 illustrated in FIG. 13 on the other hand, at timing t=t2(3), when the third edge detection signal Edge_Φ2 shifts from a low level to a high level, the selector 10322 selects the input terminal on the side of a high level "1", and transfers the high level signal of the third edge detection signal Edge_Φ2 to two delay flip-flop DFFs 10325 and 10324 in the latter stage circuit. That is, at timing t=t5(3), the delay flip-flop DFF 10324 samples the input signal, or equivalently, the high level signal of the third edge detection signal Edge_Φ2 which is the output signal of the selector 10322, at the rising edge of the sixth clock signal CLK5; accordingly, the third gate control signal GSEL_Φ2 as the output signal of the delay flip-flop DFF 10324 shifts from a low level to a high level. Accordingly, at timing t=t5(3), the Φ2 edge detection circuit 1052 of the edge detection circuit 105 illustrated in FIG. 6 shifts from a non-active state to an active state, in response to the third gate control signal GSEL_Φ2 of a high level, and the edge detection phase shifts from phase 1 to phase 2.

Next, at timing t=t2(4), in the Φ2 phase selection signal generating circuit 1032 illustrated in FIG. 13, the delay flip-flop DFF 10325 samples the input signal, or equivalently, the high level signal of the third edge detection signal Edge_Φ2 which is the output signal of the selector 10322, at the rising edge of the third clock signal CLK2. Accordingly, the sixth phase selection signal PSEL_Φ5 which is the output signal of the delay flip-flop DFF 10325 shifts from a low level to a high level. Accordingly, from timing t=t2(4), as the reproduction clock RCLK, the clock data generating circuit 104 illustrated in FIG. 14 selects the sixth clock signal CLK5 in lieu of the fifth clock signal CLK4 selected until then. It can be verified from the explanation of operation described above that the selection phase of the clock data generating circuit 104 illustrated in FIG. 14 has been changed from the fourth clock signal CLK3 of the beginning to the sixth clock signal CLK5 via the fifth clock signal CLK4.

As seen from the explanation of operation described above, in the clock data recovery circuit 1 according to Embodiment 1 of the present invention explained with reference to FIGS. 1 through 15, the selection phase which the clock data generating circuit 104 can shift at one time is restricted to one phase of the multi-phase clock signals CLK0-CLK5. Consequently, when the edge position of the received data signal RXDATA shifts by two or more phases at one time, by performing the state transition twice or more times, it becomes possible that the selection phase of the detection edge in the edge detection circuit 105 of the clock data recovery circuit 1 and the phase of the reproduction clock RCLK in the clock data generating circuit 104 are made to follow the change of the data edge of the received data signal RXDATA.

Furthermore, the following assumes the case where, at timing t=te(3) illustrated in FIG. 15, the data edge position of the received data signal RXDATA exists between the rising edge of the second clock signal CLK1 and the rising edge of the third clock signal CLK2, and where it exists extremely near the rising edge of the third clock signal CLK2. This case is understood as follows: that is, in order that the data edge position of the received data signal RXDATA exists within the range of ±1 phase from the rising edge of the third clock signal CLK2 which is phase 2 as the edge detection phase selected currently (between the rising edge of the second clock signal CLK1 and the rising edge of the fourth clock signal CLK3), the next edge detection phase is also set to phase 2 similarly.

The following assumes the case where, at timing t=te(4) illustrated in FIG. 15, the data edge position of the received data signal exists between the rising edge of the third clock signal CLK2 and the rising edge of the fourth clock signal CLK3, and where it exists extremely near the rising edge of the third clock signal CLK2. This case is also understood as follows: that is, in order that the data edge position of the received data signal RXDATA exists within ±1 phase from the rising edge of the third clock signal CLK2 which is phase 2 as the edge detection phase selected currently (between the rising edge of the second clock signal CLK1 and the rising edges of the fourth clock signal CLK3), the next edge detection phase is also set to phase 2 similarly.

In the clock data recovery circuit 1 according to Embodiment 1 of the present invention explained with reference to FIGS. 1 through 15, as described above, in initializing operation at the time of power-on or standby cancellation, a certain arbitrary edge detection phase, for example, the rising edge of the first clock signal CLK0 which is phase 0, is selected as an initial edge detection phase. The following assumes the case where, in the edge detection phase at the time of the initializing operation, with reference to the rising edge of the first clock signal CLK0, the position of the rising edge or the falling edge of the data of the received data signal RXDATA exists within the range of ±1 phase from phase 0 which is the phase of the first clock signal CLK0 (between the rising edge of the sixth clock signal CLK5 and the rising edges of the second clock signal CLK1). In the present case, the phase of the first clock signal CLK0 which is the edge detection phase selected currently is selected and held as the edge detection phase. On the other hand, the following assumes the case where the position of the rising edge or the falling edge of the data of the received data signal RXDATA exists between the rising edge of the fourth clock signal CLK3 and the rising edge of the sixth clock signal CLK5, or the case where it exists between the rising edge of the second clock signal CLK1 and the rising edge of the fourth clock signal CLK3. In this case, by passing two cycles of the transition period of the clock period of the six-phase clock signals CLK0-CLK5, as described above, it becomes possible that the selection phase of the detection edge in the detection edge circuit 105 and the phase of the reproduction clock RCLK in the clock data generating circuit 104 are made finally to follow the change of the data edge of the received data signal RXDATA.

As described above, it is understood that the clock data recovery circuit 1 according to Embodiment 1 of the present invention, explained with reference to FIGS. 1 through 15, does not require highly frequent switching operation of the selection phase, even in the case where the receive data edge exists near the arbitrary clock phase of the multi-phase clock; accordingly, the clock data recovery circuit 1 possesses a high degree of jitter tolerance.

<<The Effect of Embodiment 1 of the Present Invention>>

Before explaining the useful effect of the clock data recovery circuit 1 according to Embodiment 1 of the present invention explained with reference to FIGS. 1 through 15, the operation of the oversampling digital clock data recovery circuit 1, illustrated in FIG. 2, examined by the present inventors in advance of the present invention is examined.

Figure 2:
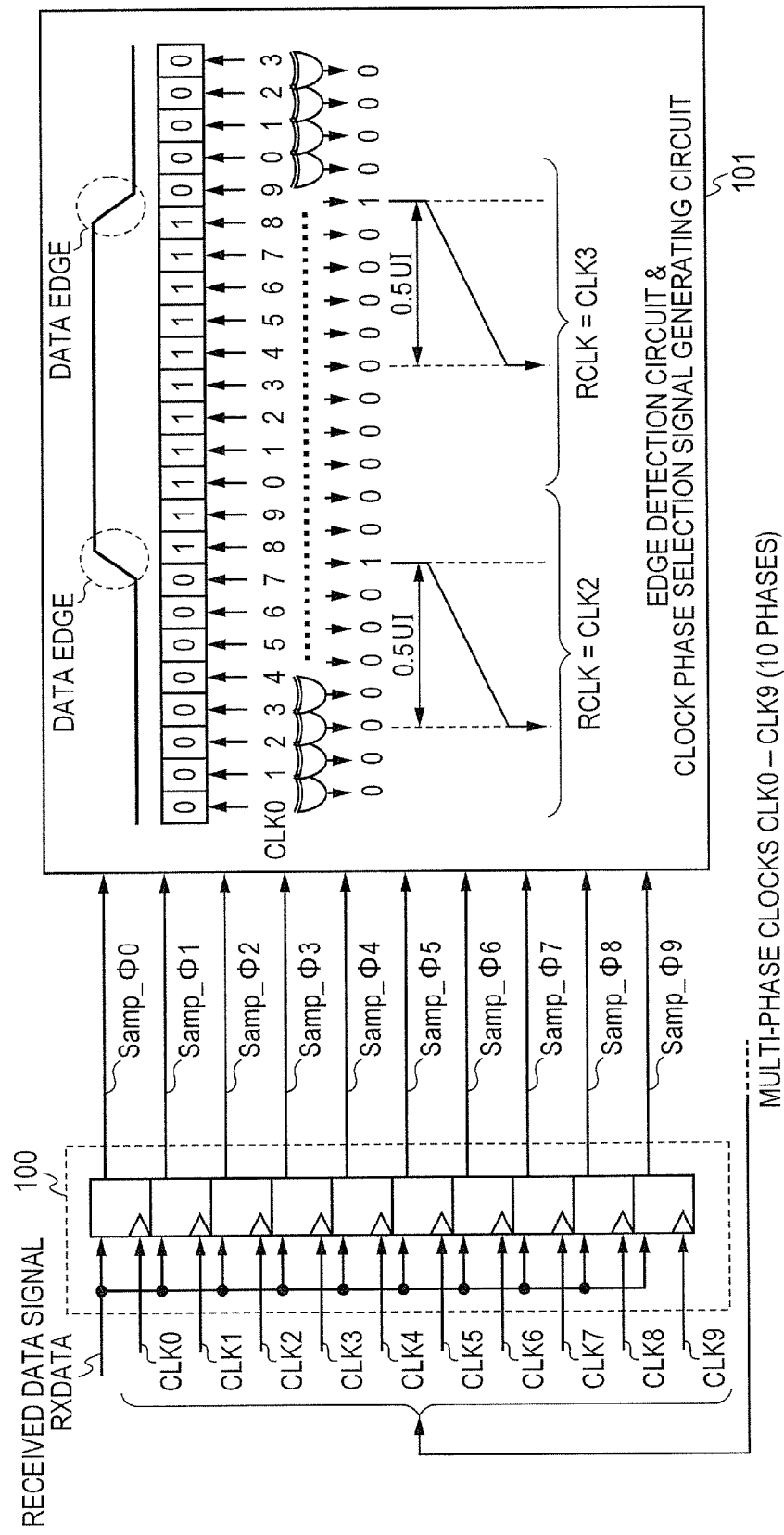
FIG. 2 is a drawing illustrating a configuration of an oversampling digital clock data recovery circuit, examined by the present inventors in advance of the present invention.
Figure 3:
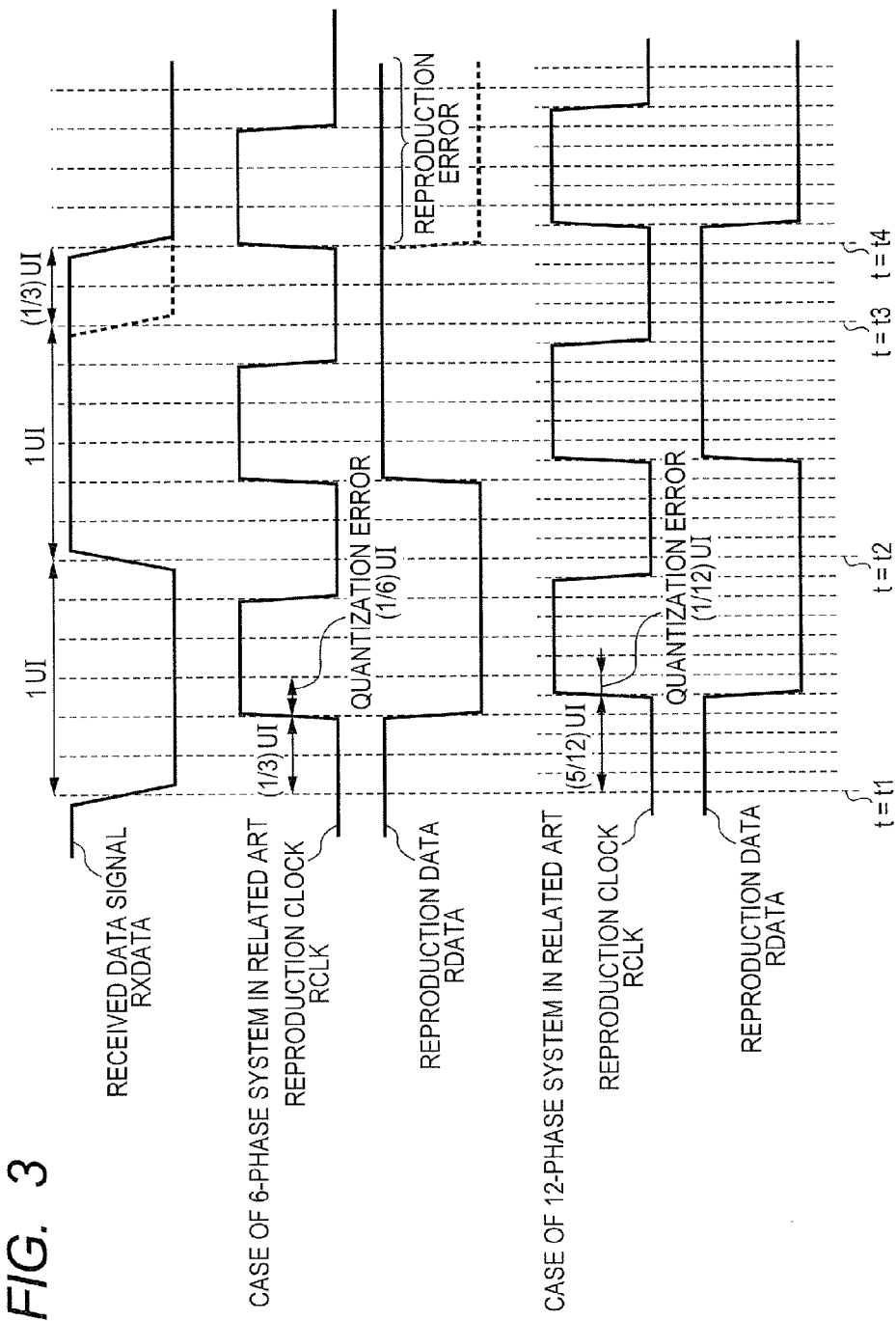
FIG. 3 is a drawing illustrating operation of the clock data recovery circuit in the case of setting the phase number of a multi-phase clock to six phases and 12 phases, in the oversampling digital clock data recovery circuit examined by the present inventors in advance of the present invention, as illustrated in FIG. 2.
Figure 16:
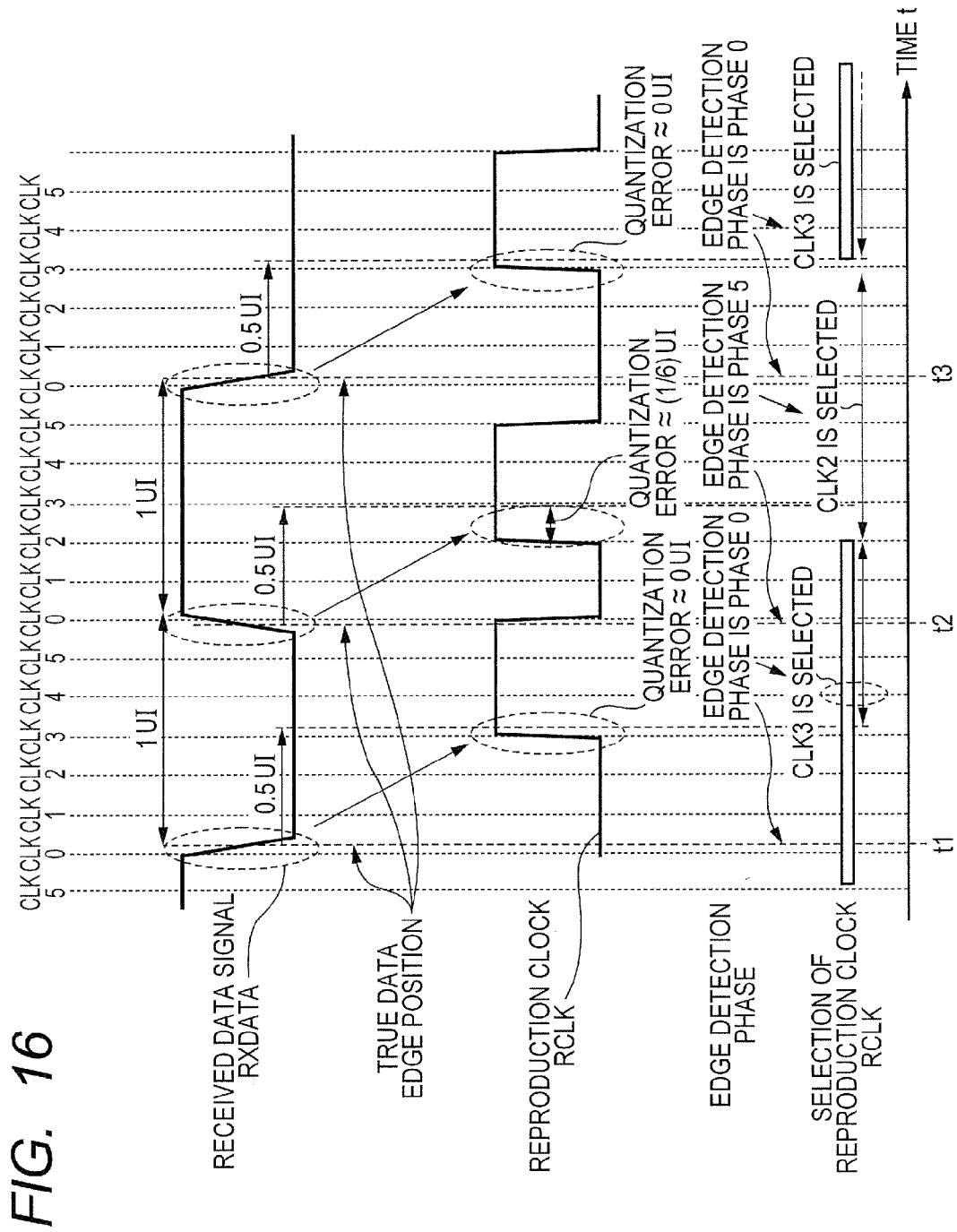
FIG. 16 is a drawing illustrating operation of the oversampling digital clock data recovery circuit 1 illustrated in FIG. 2, examined by the present inventors in advance of the present invention.

FIG. 16 illustrates the operation of the oversampling digital clock data recovery circuit 1 illustrated in FIG. 2, examined by the present inventors in advance of the present invention.

In the edge detection method of the oversampling digital clock data recovery circuit 1 examined by the present inventors in advance of the present invention illustrated in FIG. 2, the case where the data edge of the received data signal RXDATA exists between the rising edge of the sixth clock signal CLK5 and the rising edge of the first clock signal CLK0 as illustrated in the middle of FIG. 16 is assumed. In the present case, it is determined that the edge detection phase of the received data signal RXDATA exists in phase 5 (the phase of the sixth clock signal CLK5). Accordingly, the second clock signal CLK2 which is separated by 0.5 UI from the phase of the sixth clock signal CLK5 as the edge detection phase is selected as the reproduction clock RCLK.

On the other hand, as illustrated in the left of FIG. 16, when the data edge of the received data signal RXDATA exists between the rising edge of the first clock signal CLK0 and the rising edge of the second clock signal CLK1, it is determined that the data edge detection phase of the received data signal RXDATA exists in phase 0 (the phase of the first clock signal CLK0). Accordingly, the fourth clock signal CLK3 which is separated by 0.5 UI from the phase of the first clock signal CLK0 as the data edge detection phase is selected as the reproduction clock RCLK. In the present situation, when the edge of the data of the receive data signal RXDATA exists in the position which approximately overlaps the rising edge of the first clock signal CLK0, the edge detection phase determined by the edge detection circuit 101 repeats highly frequent switching between phase 5 of the sixth clock signal CLK5 and phase 0 of the first clock signal CLK0. Therefore, the selection clock of the reproduction clock RCLK also repeats highly frequent switching between the third clock signal CLK2 and the second clock signal CLK1.

The following assumes the case where, as illustrated in the left of FIG. 16, at timing t=t1, the data edge of the received data signal RXDATA exists between the rising edge of the first clock signal CLK0 and the rising edge of the second clock signal CLK1, and lies in the extreme neighborhood of the rising edge of the first clock signal CLK0. In the present case, the data edge detection phase is detected as phase 0 of the first clock signal CLK0, and the fourth clock signal CLK3 which is separated by 0.5 UI from phase 0 of the first clock signal CLK0 as the data edge detection phase is selected as the reproduction clock RCLK. In the present case, the true data edge position of the data of the received data signal RXDATA exists near the rising edge of the first clock signal CLK0, and the edge detection phase detected by the edge detection circuit is also phase 0 of the first clock signal CLK0. Therefore, the quantization error by the reproduction clock RCLK of the fourth clock signal CLK3 becomes 0 UI.

Next, the following assumes the case where, as illustrated in the middle of FIG. 16, at timing t=t2, the data edge of the received data signal RXDATA exists between the rising edge of the sixth clock signal CLK5 and the rising edge of the second clock signal CLK1, and lies in the extreme neighborhood of the rising edge of the first clock signal CLK0. In the present case, the data edge detection phase is detected to be phase 5 of the sixth clock signal CLK5, and the third clock signal CLK2, which is separated by 0.5 UI from phase 5 of the sixth clock signal CLK5 as the data edge detection phase, is selected as the reproduction clock RCLK. In the present case, the true data edge position of the data of the received data signal RXDATA exists near the rising edge of the first clock signal CLK0, and the data edge detection phase detected by the edge detection circuit is phase 5 of the sixth clock signal CLK5. Therefore, the quantization error by the reproduction clock RCLK of the third clock signal CLK2 becomes 1/6 UI.

Next, the following assumes the case where, as illustrated in the right of FIG. 16, at timing t=t3, the data edge of the received data signal RXDATA exists again between the rising edge of the first clock signal CLK0 and the rising edge of the second clock signal CLK1, and lies in the extreme neighborhood of the rising edge of the first clock signal CLK0. In the present case, the edge detection phase detected by the edge detection circuit is also phase 0 of the first clock signal CLK0, as is the case described above. Therefore, the quantization error by the reproduction clock RCLK of the fourth clock signal CLK3 becomes 0 UI.

Figure 17:
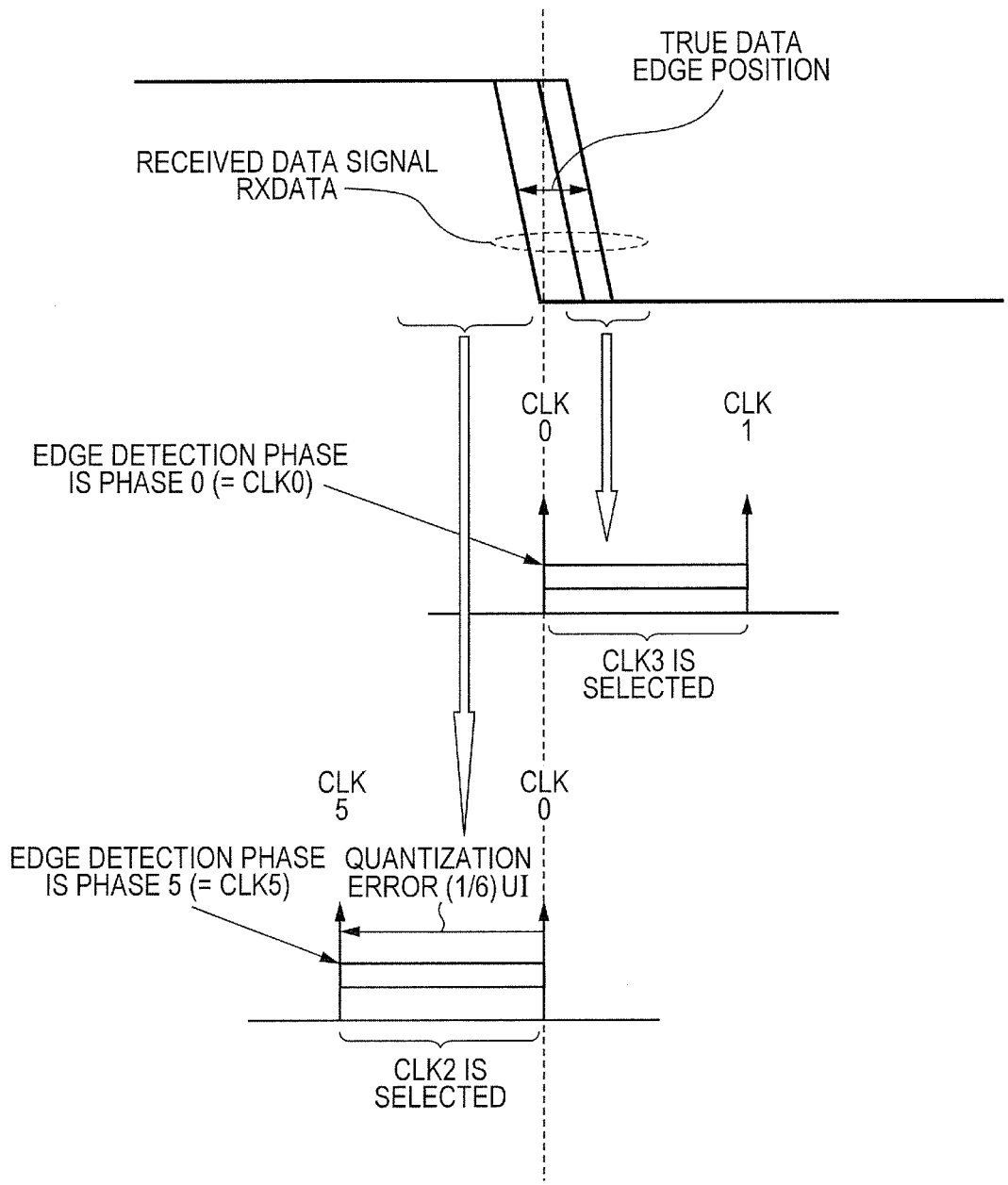
FIG. 17 is a drawing illustrating detecting operation of the data edge detection phase according to the operation illustrated in FIG. 16, examined by the present inventors in advance of the present invention, of the oversampling digital clock data recovery circuit 1 of FIG. 2.

FIG. 17 illustrates detecting operation of the data edge detection phase according to the operation illustrated in FIG. 16, examined by the present inventors in advance of the present invention, of the oversampling digital clock data recovery circuit 1 of FIG. 2.

The following assumes the case where, as illustrated in FIG. 17, the data edge of the received data signal RXDATA exists between the rising edge of the first clock signal CLK0 and the rising edge of the second clock signal CLK1, and lies in the extreme neighborhood of the rising edge of the first clock signal CLK0. In the present case, the data edge detection phase detected is phase 0 of the first clock signal CLK0, and the fourth clock signal CLK3, which is separated by 0.5 UI from phase 0 of the first clock signal CLK0 as the data edge detection phase, is selected as the reproduction clock RCLK, and the quantization error becomes 0 UI. Furthermore, the following assumes the case where, as illustrated in FIG. 17, the data edge of the received data signal RXDATA exists between the rising edge of the sixth clock signal CLK5 and the rising edge of the second clock signal CLK1, and lies in the extreme neighborhood of the rising edge of the first clock signal CLK0. In the present case, the data edge detection phase detected is phase 5 of the sixth clock signal CLK5, and the third clock signal CLK2, which is separated by 0.5 UI from phase 5 of the sixth clock signal CLK5 as the data edge detection phase, is selected as the reproduction clock RCLK, and the quantization error by the reproduction clock RCLK of the third clock signal CLK2 becomes 1/6 UI.

As it is understood from the explanation of operation described above, in the edge detection method of the oversampling digital clock data recovery circuit 1 examined by the present inventors in advance of the present invention illustrated in FIG. 2, when the receive data edge exists near the rising edge of an arbitrary phase of the multi-phase clock, there arises an issue that the frequency at which a quantization error becomes great increases, inducing vulnerability to a jitter.

Figure 18:
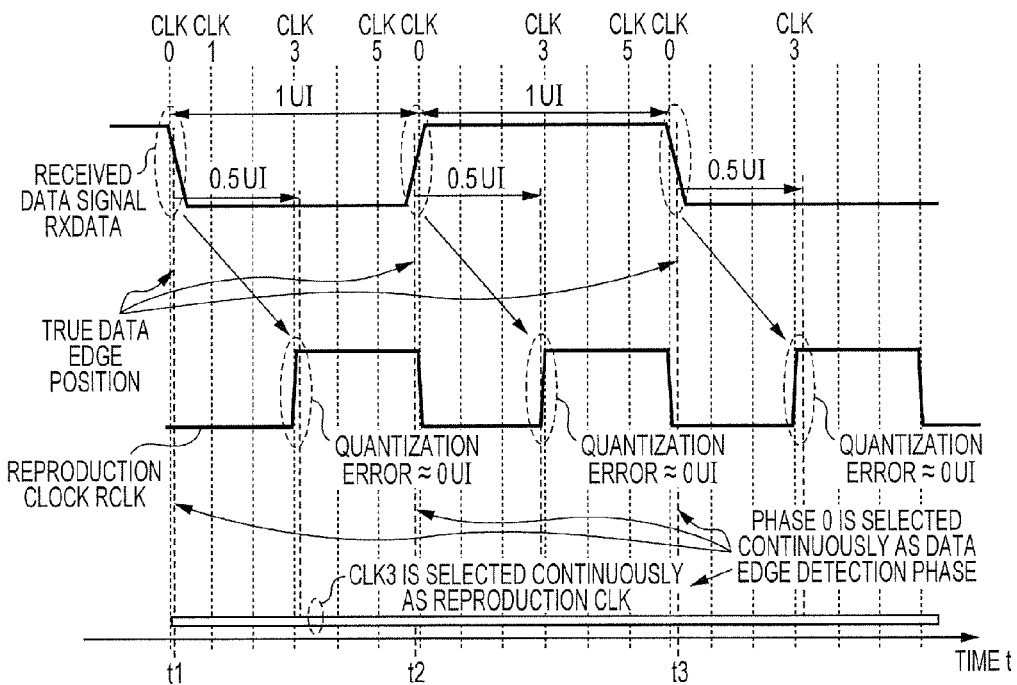
FIG. 18 is a drawing illustrating operation of the clock data recovery circuit 1 according to Embodiment 1 of the present invention, explained with reference to FIGS. 4 through 15.

FIG. 18 illustrates operation of the clock data recovery circuit 1 according to Embodiment 1 of the present invention, explained with reference to FIGS. 4 through 15.

The following assumes the case where, as illustrated in the left of FIG. 18, at timing t<t1, the edge detection phase selected currently is phase 0 of the first clock signal CLK0, and at timing t=t1, the data edge of the received data signal RXDATA exists between the rising edge of the first clock signal CLK0 and the rising edge of the second clock signal CLK1, and lies in the extreme neighborhood of the rising edge of the first clock signal CLK0. When the data edge of the received data signal RXDATA exists within the range of ±1 phase from phase 0 of the edge detection phase selected currently, the clock data recovery circuit 1 according to Embodiment 1 of the present invention, explained with reference to FIGS. 4 through 15, continues selection of phase 0 of the first clock signal CLK0 which is the current edge detection phase, and continues selection of the fourth clock signal CLK3, which is separated by 0.5 UI from phase 0 of the data edge detection phase, as the reproduction clock RCLK. At timing t=t1 illustrated in the left of FIG. 18, the true data edge position of the received data signal RXDATA lies near the rising edge of the first clock signal CLK0. Accordingly, the detection phase detected by the edge detection circuit is also phase 0 of the first clock signal CLK0, and hence, the quantization error by the reproduction clock RCLK of the fourth clock signal CLK3 becomes 0 UI.

As illustrated in FIG. 18, when, at the next timing t=t2, the data edge of the received data signal RXDATA exists between the rising edge of the sixth clock signal CLK5 and the rising edge of the first clock signal CLK0, and lies in the extreme neighborhood of the rising edge of the first clock signal CLK0, the data edge of the received data signal RXDATA exists within the range of ±1 phase from phase 0 of the edge detection phase selected currently. Consequently, in the next edge detection phase, the selection of phase 0 of the first clock signal CLK0 which is the edge detection phase selected currently is continued, and also the selection of the fourth clock signal CLK3 which is separated by 0.5 UI from phase 0 of the data edge detection phase is continued as the reproduction clock RCLK.

Figure 19:
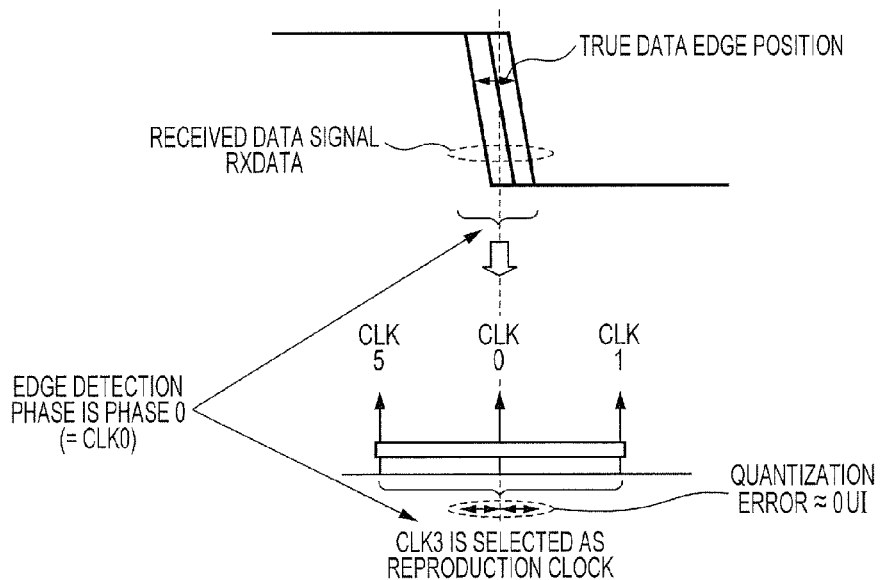
FIG. 19 is a drawing illustrating detecting operation of the data edge detection phase illustrated in FIG. 18, performed by the clock data recovery circuit 1 according to Embodiment 1 of the present invention, explained with reference to FIGS. 4 through 15.

FIG. 19 illustrates detecting operation of the data edge detection phase illustrated in FIG. 18, performed by the clock data recovery circuit 1 according to Embodiment 1 of the present invention, explained with reference to FIGS. 4 through 15.

As illustrated in FIG. 19, the following assumes the case where the data edge of the received data signal RXDATA exists within the range of ±1 phase from phase 0 of the edge detection phase selected currently, that is, the case where the data edge of the received data signal RXDATA exists between the rising edge of the sixth clock signal CLK5 and the rising edge of the second clock signal CLK1. In the present case, the selection of phase 0 of the first clock signal CLK0 which is the edge detection phase selected currently is also continued as the next edge detection phase, and the quantization error by the reproduction clock RCLK of the fourth clock signal CLK3 becomes 0 UI.

Figure 20:
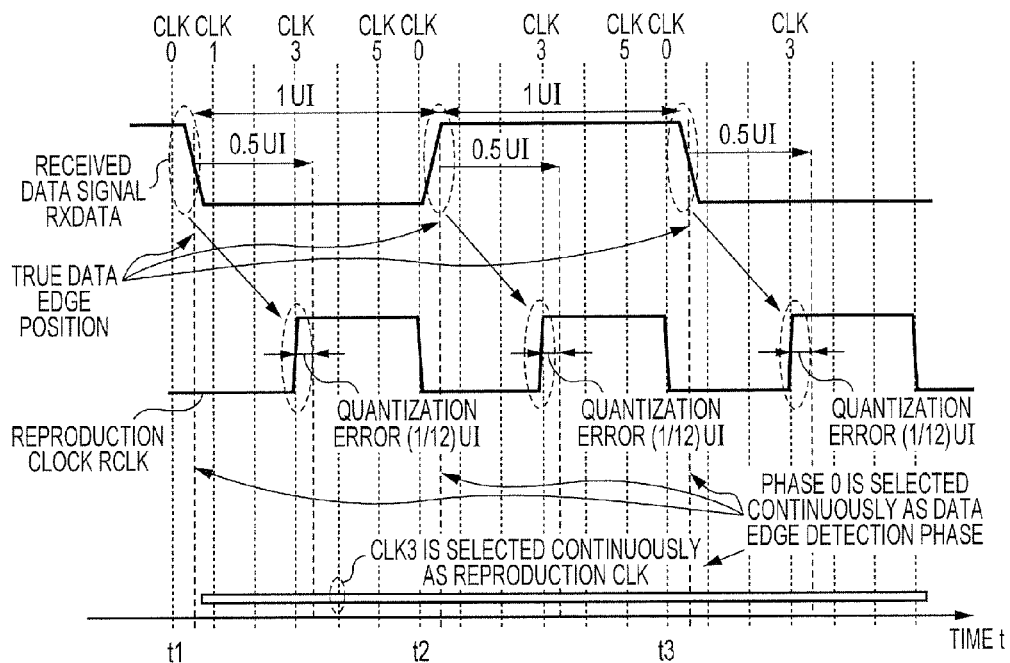
FIG. 20 is a drawing illustrating operation of the clock data recovery circuit 1 according to Embodiment 1 of the present invention, explained with reference to FIGS. 4 through 15.

FIG. 20 illustrates operation of the clock data recovery circuit 1 according to Embodiment 1 of the present invention, explained with reference to FIGS. 4 through 15.

The following assumes the case where, as illustrated in the left of FIG. 20, at timing t<t1, the edge detection phase selected currently is phase 0 of the first clock signal CLK0, and where, at timing t=t1, the data edge of the received data signal RXDATA lies approximately at the midpoint between the rising edge of the first clock signal CLK0 and the rising edge of the second clock signal CLK1. When the data edge of the received data signal RXDATA exists within the range of ±1 phase from phase 0 of the edge detection phase selected currently, the clock data recovery circuit 1 according to Embodiment 1 of the present invention, explained with reference to FIGS. 4 through 15, continues selection of phase 0 of the first clock signal CLK0 which is the current edge detection phase, and further continues selection of the fourth clock signal CLK3, which is separated by 0.5 UI from phase 0 of the data edge detection phase, as the reproduction clock RCLK. At timing t=t1 illustrated in the left of FIG. 20, the true data edge position of the received data signal RXDATA lies approximately at the midpoint between the rising edge of the first clock signal CLK0 and the rising edge of the second clock signal CLK1. Accordingly, the detection phase detected by the edge detection circuit is also phase 0 of the first clock signal CLK0, and hence, the quantization error by the reproduction clock RCLK of the fourth clock signal CLK3 becomes (1/12) UI.

The following assumes the case where, as illustrated in FIG. 20, at the next timing t=t2 and further at timing t=t3, the data edge of the received data signal RXDATA lies approximately at the midpoint between the rising edge of the first clock signal CLK0 and the rising edge of the second clock signal CLK1. Even in the present case, when the data edge of the received data signal RXDATA exists within the range of ±1 phase from phase 0 of the edge detection phase selected currently, the clock data recovery circuit 1 according to Embodiment 1 of the present invention, explained with reference to FIGS. 4 through 15, continues the selection of phase 0 of the first clock signal CLK0 which is the current edge detection phase. Furthermore, the clock data recovery circuit 1 according to Embodiment 1 of the present invention, explained with reference to FIGS. 4 through 15, continues the selection of the fourth clock signal CLK3, which is separated by 0.5 UI from phase 0 of the data edge detection phase, as the reproduction clock RCLK. At timing t=t2 and timing t=t3 illustrated in FIG. 20, the true data edge position of the received data signal RXDATA lies approximately at the midpoint between the rising edge of the first clock signal CLK0 and the rising edge of the second clock signal CLK1. Accordingly, the detection phase detected by the edge detection circuit is also phase 0 of the first clock signal CLK0, and hence, the quantization error by the reproduction clock RCLK of the fourth clock signal CLK3 becomes (1/12) UI.

Figure 21:
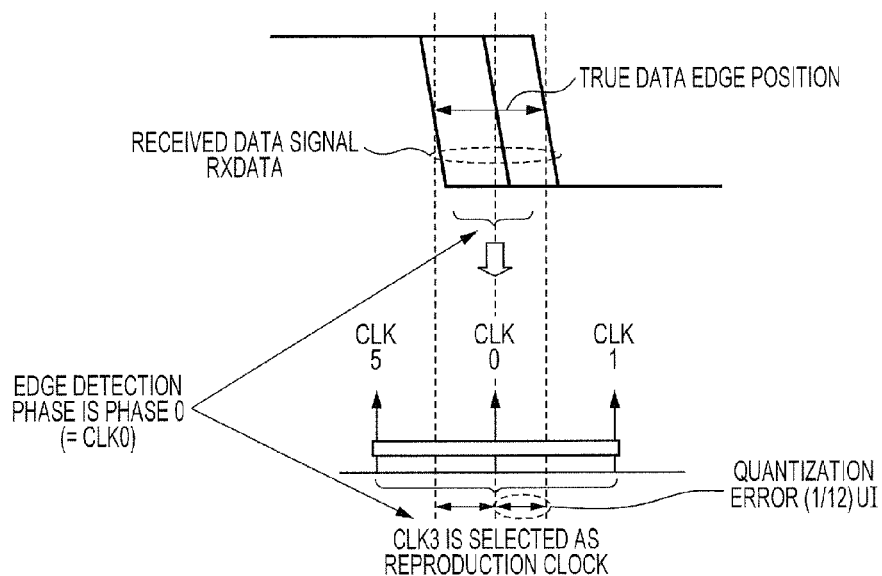
FIG. 21 is a drawing illustrating detecting operation of the data edge detection phase illustrated in FIG. 20, performed by the clock data recovery circuit 1 according to Embodiment 1 of the present invention, explained with reference to FIGS. 4 through 15.

FIG. 21 illustrates detecting operation of the data edge detection phase illustrated in FIG. 20 performed by the clock data recovery circuit 1, according to Embodiment 1 of the present invention explained with reference to FIGS. 4 through 15.

The following assumes the case where, as illustrated in FIG. 21, the data edge of the received data signal RXDATA exists within the range of ±1 phase from phase 0 of the edge detection phase selected currently. The present case corresponds to the case where the data edge of the received data signal RXDATA lies approximately at the midpoint between the rising edge of the first clock signal CLK0 and the rising edge of the second clock signal CLK1, or the case where the data edge of the received data signal RXDATA lies approximately at the midpoint between the rising edge of the sixth clock signal CLK5 and the rising edge of the first clock signal CLK0. In the present case, the selection of phase 0 of the first clock signal CLK0 which is the edge detection phase selected currently is also continued in the next edge detection phase, and the quantization error by the reproduction clock RCLK of the fourth clock signal CLK3 becomes (1/12) UI.

As it is understood from the explanation of operation described above, the clock data recovery circuit 1 according to Embodiment 1 of the present invention, explained with reference to FIGS. 4 through 15, does not require highly frequent switching operation of the selection phase even when the receive data edge lies near an arbitrary clock phase of the multi-phase clock; accordingly, the clock data recovery circuit 1 possesses a high degree of jitter tolerance.

(Embodiment 2)

<<The Configuration of a Clock Data Recovery Circuit>>

Figure 22:
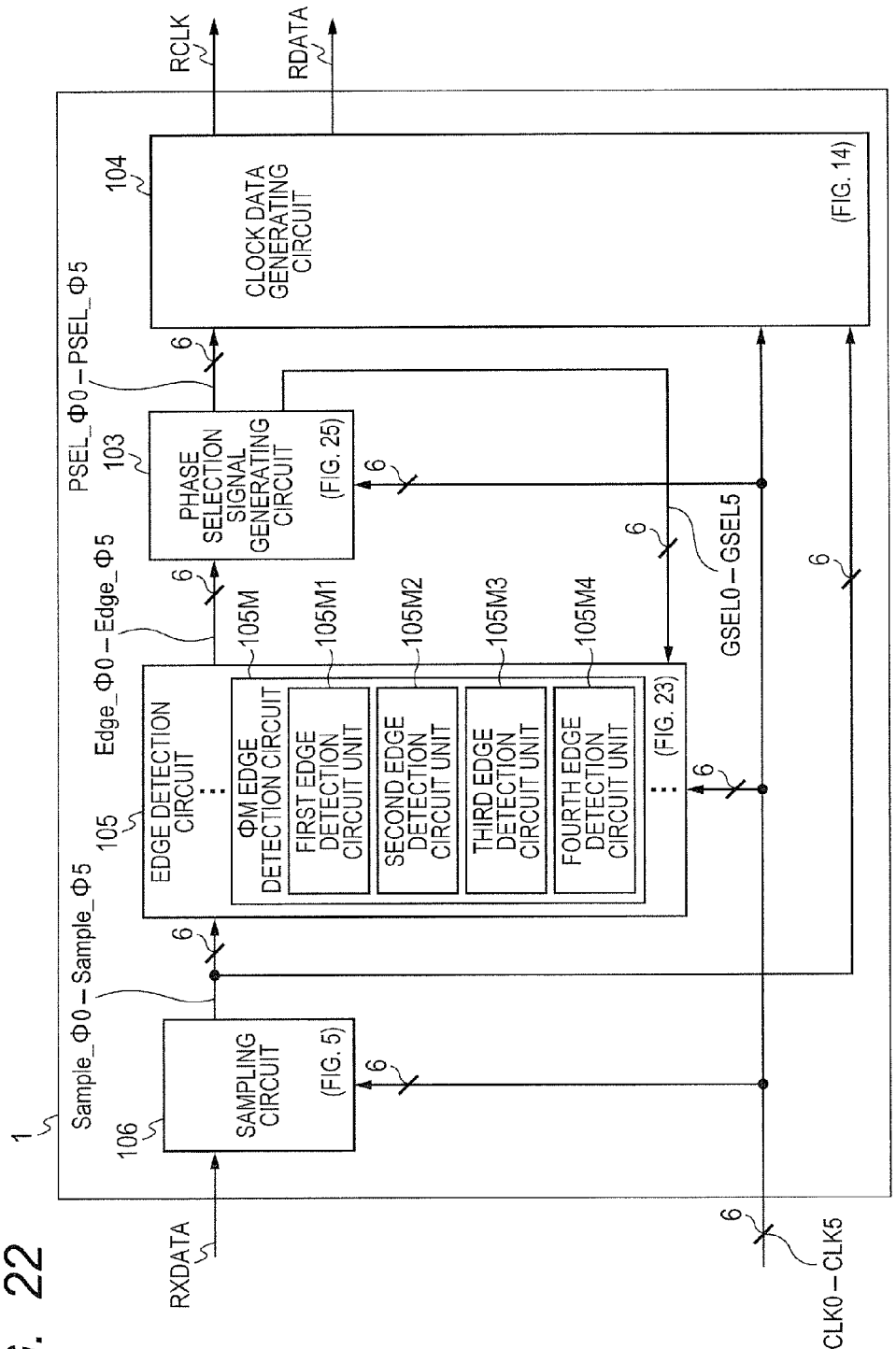
FIG. 22 is a drawing illustrating a configuration of a clock data recovery circuit 1, according to Embodiment 2 of the present invention.

FIG. 22 illustrates a configuration of the clock data recovery circuit 1 according to Embodiment 2 of the present invention.

The clock data recovery circuit 1 according to Embodiment 2 of the present invention illustrated in FIG. 22 comprises a sampling circuit 106, an edge detection circuit 105, a phase selection signal generating circuit 103, and a clock data generating circuit 104, as is the case with the clock data recovery circuit 1 according to Embodiment 1 of the present invention illustrated in FIG. 4.

In response to six-phase clock signals CLK0-CLK5, the sampling circuit 106 performs the 6 times oversampling of the received data signal RXDATA supplied from a host (not shown) and generates sampling signals Sample_Φ0 through Sample_Φ5. The sampling circuit 106 of the clock data recovery circuit 1 according to Embodiment 2 of the present invention illustrated in FIG. 22 has the circuit configuration illustrated in FIG. 5, as is the case with the sampling circuit 106 of the clock data recovery circuit 1 according to Embodiment 1 of the present invention illustrated in FIG. 1.

The edge detection circuit 105 responds to the six-phase clock signals CLK0-CLK5, sampling signals Sample_Φ0-Sample_Φ5 generated by the sampling circuit 106, and gate control signals GSEL_Φ0-GSEL_Φ5 generated by the phase selection signal generating circuit 103 to be described later, and generates plural edge detection signals Edge_Φ0-Edge_Φ5. Namely, the edge detection circuit 105 comprises plural ΦM edge detection circuits (M=0-5) 105M. The ΦM edge detection circuit 105M includes a first edge detection circuit 105M1, a second edge detection circuit 105M2, a third edge detection circuit 105M3, and a fourth edge detection circuit 105M4.

The edge detection circuit 105 generates an edge detection signal Edge_ΦX which indicates an edge detection phase CLKX of a received data signal RXDATA selected currently, from the six-phase clock signals CLK0-CLK5. In response to the edge detection signal Edge_ΦX, the phase selection signal generating circuit 103 generates a gate control signal GSEL_ΦX. Therefore, among plural ΦM edge detection circuits 105M, only a ΦX edge detection circuit 105X, to which the gate control signal GSEL_ΦX is supplied, is controlled to an active state, and the other edge detection circuits are controlled to a non-active state.

The ΦM edge detection circuit 105M includes the first edge detection circuit 105M1, the second edge detection circuit 105M2, the third edge detection circuit 105M3, and the fourth edge detection circuit 105M4, as described above.

The first edge detection circuit 105M1 detects whether the data edge of the received data signal RXDATA supplied currently exists in a leading position between −1 phase and −2 phases from the edge detection phase CLKX of the received data signal RXDATA selected currently. The second edge detection circuit 105M2 detect whether the data edge of the received data signal RXDATA supplied currently exists in a lagging position between +1 phase and +2 phases from the edge detection phase CLKX of the received data signal RXDATA selected currently.

The third edge detection circuit 105M3 detect whether the data edge of the received data signal RXDATA supplied currently exists in a leading position between −2 phases and −3 phases from the edge detection phase CLKX of the received data signal RXDATA selected currently. The fourth edge detection circuit 105M4 detect whether the data edge of the received data signal RXDATA supplied currently exists in a lagging position between +2 phases and +3 phases from the edge detection phase CLKX of the received data signal RXDATA selected currently. The edge detection circuit 105 of the clock data recovery circuit 1 according to Embodiment 2 of the present invention illustrated in FIG. 22 will be explained later in full detail with reference to FIG. 23.

The phase selection signal generating circuit 103 responds to the six-phase clock signals CLK0-CLK5 and the edge position detection signals Edge_Φ0-Edge_Φ5 generated by the edge detection circuit 105, and generates plural gate control signals GSEL_Φ0-GSEL_Φ5 and plural phase selection signals PSEL_Φ0-PSEL_Φ5. The plural gate control signals GSEL_Φ0-GSEL_Φ5 are supplied to the edge detection circuit 105, and the plural phase selection signal PSEL_Φ0-PSEL_Φ5 are supplied to the clock data generating circuit 104. The phase selection signal generating circuit 103 of the clock data recovery circuit 1 according to Embodiment 2 of the present invention illustrated in FIG. 22 will be explained later in full detail with reference to FIG. 25.

The clock data generating circuit 104 responds to the six-phase clock signals CLK0-CLK5, the sampling signals Sample_Φ0-Sample_Φ5 generated by the sampling circuit 106, and the phase selection signals PSEL_Φ0-PSEL_Φ5 generated by the phase selection signal generating circuit 103, and generates a reproduction clock RCLK and reproduction data RDATA. The clock data generating circuit 104 of the clock data recovery circuit 1 according to Embodiment 2 of the present invention illustrated in FIG. 22 has the circuit configuration illustrated in FIG. 14, as is the case with the clock data generating circuit 104 of the clock data recovery circuit 1 according to Embodiment 1 of the present invention illustrated in FIG. 1.

<<The Edge Detection Circuit>>

Figure 23:
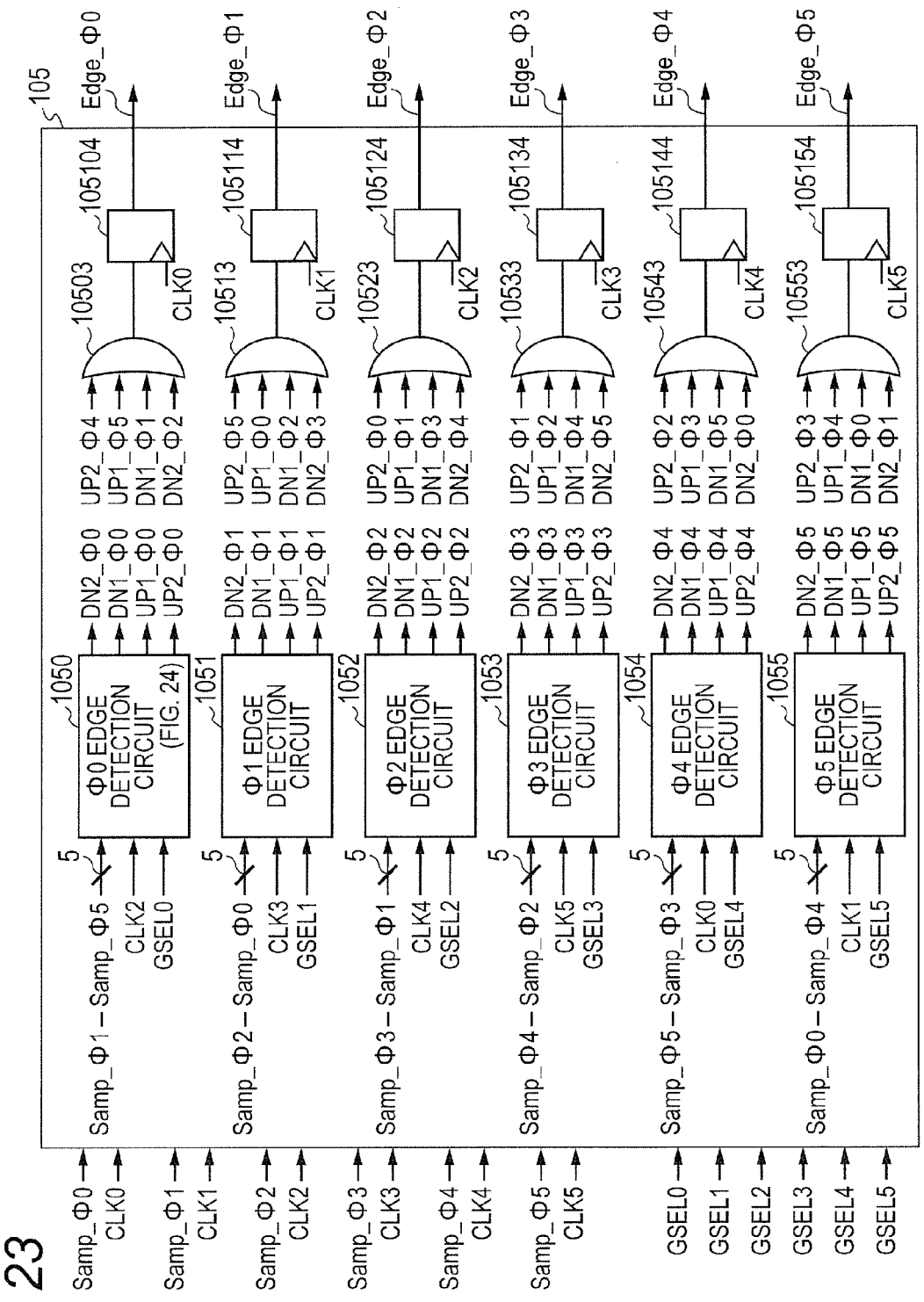
FIG. 23 is a drawing illustrating a configuration of an edge detection circuit 105 of the clock data recovery circuit 1, according to Embodiment 2 of the present invention illustrated in FIG. 22.

FIG. 23 illustrates a configuration of the edge detection circuit 105 of the clock data recovery circuit 1 according to Embodiment 2 of the present invention illustrated in FIG. 22.

The edge detection circuit 105 according to Embodiment 2 of the present invention illustrated in FIG. 23 comprises six ΦM edge detection circuits 1050-1055 (M=0-5) which are the same number as the phase number of the multi-phase clock signals CLK0-CLK5, six four-input OR circuits 10503-10553, and six delay flip-flop DFFs 105104-105154. The six ΦM edge detection circuits 1050-1055 are supplied with six sampling signals Sample_Φ0-Sample_Φ5 generated by the sampling circuit 106, the six-phase clock signals CLK0-CLK5, and six gate control signals GSEL_Φ0-GSEL_Φ5 generated by the phase selection signal generating circuit 103 to be described below. On the basis of the six sampling signals Sample_Φ0-Sample_Φ5, the six ΦM edge detection circuits 1050-1055 generate one-phase "up" signals UP1_Φ0-UP1_Φ5, two-phase "up" signals UP2_Φ0-UP2_Φ5, one-phase "down" signals DN1_Φ0-DN1_Φ5, and two-phase "down" signals DN2_Φ0-DN2_Φ5, and supplies them to the six four-input OR circuits 10503-10553.

When explained in more detail, the Φ0 edge detection circuit 1050 is supplied with the six sampling signals Sample_Φ1-Sample_Φ5, the third clock signal CLK2, and the first gate control signal GSEL_Φ0. On the basis of the six sampling signals Sample_Φ1-Sample_Φ5, the Φ0 edge detection circuit 1050 generates the one-phase "up" signal UP1_Φ0, the two-phase "up" signal UP2_Φ0, the one-phase "down" signal DN1_Φ0, and the two-phase "down" signal DN2_Φ0, and supplies them to the four-input OR circuits 10513, 10523, 10553, and 10543, respectively. The five other pieces of the Φ1 edge detection circuit 1051 through the Φ5 edge detection circuit 1055 other than the Φ0 edge detection circuit 1050 illustrated in FIG. 23 perform fundamental operation which is completely the same as that of the Φ0 edge detection circuit 1050, but they are only different in that the phase relation of the input signal and the output signal is shifted by one phase per circuit. Therefore, detailed explanation of the other edge detection circuits is omitted.

The four-input OR circuit 10503 is supplied with the two-phase "up" signal UP2_Φ4 of the Φ4 edge detection circuit 1054, the one-phase "up" signal UP1_Φ5 of the Φ5 edge detection circuit 1055, the one-phase "down" signal DN1_Φ1 of the Φ1 edge detection circuit 1051, and the two-phase "down" signal DN2_Φ2 of the Φ2 edge detection circuit 1052.

The five other four-input OR circuits 10513-10553 other than the four-input OR circuit 10503 illustrated in FIG. 23 perform fundamental operation which is completely the same as that of the four-input OR circuit 10503, but they are only different in that the phase relation of the input signal is shifted by one phase per circuit. Therefore, detailed explanation of the other four-input OR circuits is omitted.

The six delay flip-flop DFFs 105104-105154 latch the six OR output signals generated by the six four-input OR circuits 10503-10553 at the timing of the rising edge of the multi-phase clock signals CLK0-CLK5. The six four-input OR circuits 10503-10553 generate the six edge detection signals Edge_Φ0-Edge_Φ5.

FIG. 24 illustrates a configuration of the Φ0 edge detection circuit 1050 included in the edge detection circuit 105 according to Embodiment 2 of the present invention illustrated in FIG. 23.

As illustrated in FIG. 24, the Φ0 edge detection circuit 1050 comprises a first edge detection circuit 10501, a second edge detection circuit 10502, a third edge detection circuit 10503, and a fourth edge detection circuit 10504. The first edge detection circuit 10501 comprises an exclusive OR circuit 105010, a delay flip-flop DFF 105011, and an AND circuit 105012. The second edge detection circuit 10502 comprises an exclusive OR circuit 105020 and an AND circuit 105023. The third edge detection circuit 10503 comprises an exclusive OR circuit 105030, a delay flip-flop DFF 105031, and an AND circuit 105032. The fourth edge detection circuit 10504 comprises an exclusive OR circuit 105040 and an AND circuit 105043.

The first edge detection circuit 10501 is supplied with the fifth sampling signal Sample_Φ4, the sixth sampling signal Sample_Φ5, the third clock signal CLK2, and the first gate control signal GSEL_Φ0, and generates the one-phase "down" signal DN1_Φ0. The second edge detection circuit 10502 is supplied with the second sampling signal Sample_Φ1, the third sampling signal Sample_Φ2, and the first gate control signal GSEL_Φ0, and generates the one-phase "up" signal UP1_Φ0. The third edge detection circuit 10503 is supplied with the fourth sampling signal Sample_Φ3, the fifth sampling signal Sample_Φ4, the second clock signal CLK1, and the first gate control signal GSEL_Φ0, and generates the two-phase "down" signal DN2_Φ0. Finally, the fourth edge detection circuit 10504 is supplied with the third sampling signal Sample_Φ2, the fourth sampling signal Sample_Φ3, and the first gate control signal GSEL_Φ0, and generates the two-phase "up" signal UP2_Φ0.

In the first edge detection circuit 10501, the sixth sampling signal Sample_Φ5 and the fifth sampling signal Sample_Φ4 are supplied to the two-input exclusive OR circuit 105010. The sixth sampling signal Sample_Φ5 is a signal obtained by sampling the received data signal RXDATA at the rising edge of the sixth clock signal CLK5 existing in a position separated by one phase to the negative direction from phase 0 which is the phase of the first clock signal CLK0, that is, the own phase of the first edge detection circuit 10501. The fifth sampling signal Sample_Φ4 is a signal obtained by sampling the received data signal RXDATA at the rising edge of the fifth clock signal CLK4, existing in a position separated by two phases to the negative direction from phase 0. When the data edge of the received data signal RXDATA exists between the rising edge of the fifth clock signal CLK4 and the rising edge of the sixth clock signal CLK5, the output of the exclusive OR circuit 105010 becomes a high level, and when the data edge of the received data signal RXDATA exists in the other position, or when no data edge comes, the output of the exclusive OR circuit 105010 becomes a low level.

In the second edge detection circuit 10502, the second sampling signal Sample_Φ1 and the third sampling signal Sample_Φ2 are supplied to the two-input exclusive OR circuit 105020. The second sampling signal Sample_Φ1 is a signal obtained by sampling the received data signal RXDATA at the rising edge of the second clock signal CLK1, existing in a position separated by one phase to the positive direction from phase 0 which is the phase of the first clock signal CLK0, that is, the own phase of the second edge detection circuit 10502. The third sampling signal Sample_Φ2 is a signal obtained by sampling the received data signal RXDATA at the rising edge of the third clock signal CLK2, existing in a position separated by two phases to the positive direction from phase 0 which is the phase of the first clock signal CLK0, that is, the own phase of the second edge detection circuit 10502. When the data edge of the received data signal RXDATA exists between the rising edge of the second clock signal CLK1 and the rising edge of the third clock signal CLK2, the output of the exclusive OR circuit 105020 becomes a high level, and when the data edge exists in the other position or when no data edge comes in, the output of the exclusive OR circuit 105020 becomes a low level.

In the third edge detection circuit 10503, the fifth sampling signal Sample_Φ4 and the fourth sampling signal Sample_Φ3 are supplied to the two-input exclusive OR circuit 105030. The fifth sampling signal Sample_Φ4 is a signal obtained by sampling the received data signal RXDATA at the rising edge of the fifth clock signal CLK4, existing in a position separated by two phases to the negative direction from phase 0 which is the phase of the first clock signal CLK0, that is, the own phase of the third edge detection circuit 10503. The fourth sampling signal Sample_Φ3 is a signal obtained by sampling the received data signal RXDATA at the rising edge of the fourth clock signal CLK3, existing in a position separated by three phases to the negative direction from phase 0 which is the phase of the first clock signal CLK0, that is, the own phase of the third edge detection circuit 10503. When the data edge of the received data signal RXDATA exists between the rising edge of the fifth clock signal CLK4 and the rising edge of the fourth clock signal CLK3, the output of the exclusive OR circuit 105030 becomes a high level, and when the data edge exists in the other position or when no data edge comes in, the output of the exclusive OR circuit 105030 becomes a low level.

In the fourth edge detection circuit 10504, the third sampling signal Sample_Φ2 and the fourth sampling signal Sample_Φ3 are supplied to the two-input exclusive OR circuit 105040. The third sampling signal Sample_Φ2 is a signal obtained by sampling the received data signal RXDATA at the rising edge of the third clock signal CLK2, existing in a position separated by two phases to the positive direction from phase 0 which is the phase of the first clock signal CLK0, that is, the own phase of the fourth edge detection circuit 10504. The fourth sampling signal Sample_Φ3 is a signal obtained by sampling the received data signal RXDATA at the rising edge of the fourth clock signal CLK3, existing in a position separated by three phases to the positive direction from phase 0 which is the phase of the first clock signal CLK0, that is, the own phase of the fourth edge detection circuit 10504. When the data edge of the received data signal RXDATA exists between the rising edge of the third clock signal CLK2 and the rising edge of the fourth clock signal CLK3, the output of the exclusive OR circuit 105040 becomes a high level, and when the data edge exists in the other position or when no data edge comes in, the output of the exclusive OR circuit 105040 becomes a low level.

The following assumes the case where, in the state where the data edge of the received data signal RXDATA has come, all of the output of the two-input exclusive OR circuits 105010, 105020, 105030, and 105040 of the four edge detection circuits 10501, 10502, 10503, and 10504 are maintained at a low level. The present case shows that the data edge of the received data signal RXDATA exists within ±1 phase seen from phase 0 which is the phase of the first clock signal CLK0, that is, the own phase of the Φ0 edge detection circuit 1050 illustrates in FIG. 24. That is, the present case shows that the data edge of the received data signal RXDATA exists between the rising edge of the sixth clock signal CLK5 and the rising edge of the second clock signal CLK1. Both of the third edge detection circuit 10503 and the fourth edge detection circuit 10504 perform the edge detection with reference to the fourth sampling signal Sample_Φ3. However, as is the case with the explanation made above with reference to FIG. 9 of Embodiment 1 of the present invention, the third edge detection circuit 10503 and the fourth edge detection circuit 10504 refer to the fourth sampling signal Sample_Φ3 at respectively different timing. The detail explanation thereof is omitted, in order to avoid duplication with the explanation made in Embodiment 1 of the present invention.

In Φ0 edge detection circuit 1050 illustrated in FIG. 24, when the first gate control signal GSEL_Φ0 is a high level, the Φ0 edge detection circuit 1050 is controlled to an active state by the first gate control signal GSEL_Φ0 of the high level, and the outputs of four two-input exclusive OR circuits 105010, 105020, 105030, and 105040 pass through four two-input AND circuits 105012, 105023, 105032, and 105043. Accordingly, the one-phase "down" signal DN1_Φ0, the two-phase "down" signal DN2_Φ0, the one-phase "up" signal UP1_Φ0, and the two-phase "up" signal UP2_Φ0, generated respectively by the four two-input AND circuits 105012, 105032, 105023, and 105043, are supplied to four pieces of the four-input OR circuits 10513, 10523, 10543, and 10553 included in the edge detection circuit 105 illustrated in FIG. 23.

The delay flip-flop DFF 105011 included in the first edge detection circuit 10501 illustrated in FIG. 24 possesses function of latching the output of the two-input exclusive OR circuit 105010 at the timing of the rising edge of the third clock CLK2, and holding the output of the two-input exclusive OR circuit 105010 for one cycle of the clock until the next rising edge of the third clock CLK2 comes. Namely, the delay flip-flop DFF 105011 holds the output of the exclusive OR circuit 105010, as the result of exclusive OR of the fifth sampling signal Sample_Φ4(N) and the sixth sampling signal Sample_Φ5(N) of the received data signal RXDATA(N) at a certain arbitrary time, for one cycle of the clock at the timing of the rising edge of the third clock signal CLK2. If the first edge detection circuit 10501 illustrated in FIG. 24 is not provided with the delay flip-flop DFF 105011, the undesirable output of the exclusive OR circuit 105011 supplied with the fifth sampling signal Sample_Φ4(N+1) and the sixth sampling signal Sample_Φ5(N) will be generated, at the timing of the next rising edge of the fifth clock signal CLK4.

The delay flip-flop DFF 105031 included in the third edge detection circuit 10503 illustrated in FIG. 24 possesses function of latching the output of the two-input exclusive OR circuit 105030 at the timing of the rising edge of the second clock CLK1, and holding the output of the two-input exclusive OR circuit 105030 for one cycle of the clock until the next rising edge of the second clock CLK1 comes.

As described above, the Φ0 edge detection circuit 105 according to Embodiment 2 of the present invention illustrated in FIG. 24 executes the following operation.

Namely, when the data edge of the received data signal RXDATA exists between the rising edge of the sixth clock signal CLK5 and the rising edge of the fifth clock signal CLK4, the first edge detection circuit 10501 of the Φ0 edge detection circuit 105 generates the one-phase "down" signal DN1_Φ0 of a high level for advancing by one phase from phase 0 of the first clock signal CLK0 which is the current edge detection phase.

When the data edge of the received data signal RXDATA exists between the rising edge of the fifth clock signal CLK4 and the rising edge of the fourth clock signal CLK3, the third edge detection circuit 10505 of the Φ0 edge detection circuit 105 generates the two-phase "down" signal DN2_Φ0 of a high level for advancing by two phases from phase 0 of the first clock signal CLK0 which is the current edge detection phase.

Next, when the data edge of the received data signal RXDATA exists between the rising edge of the second clock signal CLK1 and the rising edge of the third clock signal CLK2, the second edge detection circuit 10502 of the Φ0 edge detection circuit 105 generates the one-phase "up" signal UP1_Φ0 of a high level for delaying by one phase from phase 0 of the first clock signal CLK0 which is the current edge detection phase.

When the data edge of the received data signal RXDATA exists between the rising edge of the third clock signal CLK2 and the rising edge of the fourth clock signal CLK3, the fourth edge detection circuit 10504 of the Φ0 edge detection circuit 105 generates the two-phase "up" signal UP2_Φ0 of a high level for delaying by two phases from phase 0 of the first clock signal CLK0 which is the current edge detection phase.

The following assumes the case where the data edge of the received data signal RXDATA does not arrive. In the present case, four edge detection circuits 10501, 10502, 10503, and 10504 of the Φ0 edge detection circuit 105 hold phase 0 of the first clock signal CLK0 which is the current edge detection phase, and hence, generate the one-phase "down" signal DN1_Φ0, the two-phase "down" signal DN2_Φ1, the one-phase "up" signal UP1_Φ0, and the two-phase "up" signal UP2_Φ0, all of a low level.

The other five pieces of the Φ1 edge detection circuit 1051 through the Φ5 edge detection circuit 1055 other than the Φ0 edge detection circuit 1050, illustrated in FIG. 24 and included in the edge detection circuit 105 according to Embodiment 2 of the present invention illustrated in FIG. 23, perform fundamental operation which is completely the same as that of the Φ0 edge detection circuit 1050, but they are only different in that the phase relation of the input signal and the output signal is shifted by one phase per circuit. Therefore, detailed explanation of the other edge detection circuits is omitted.

The four-input OR circuits 10503-10553 included in the edge detection circuit 105 according to Embodiment 2 of the present invention illustrated in FIG. 23 are supplied with plural input signals of six one-phase "up" signals UP1_Φ0-UP1_Φ5, six two-phase "up" signals UP2_Φ0-UP2_Φ5, six one-phase "down" signals DN1_Φ0-DN1_Φ5, and six two-phase "down" signals DN2_Φ0-DN2_Φ5. These plural input signals are generated by six pieces of the Φ0 edge detection circuit 1050 through the Φ5 edge detection circuit 1055. In response to the high level of at least one input signal of the plural input signals, the four-input OR circuits 10503-10553 generate a high level output signal, and supply it to six delay flip-flop DFFs 105104-105154.

When explained in more detail, the four-input OR circuit 10503, included in the edge detection circuit 105 according to Embodiment 2 of the present invention illustrated in FIG. 23, responds to the one-phase "up" signal UP1_Φ5, the one-phase "down" signal DN1_Φ1, the two-phase "up" signal UP2_Φ4, and the two-phase "down" signal DN2_Φ2, and generates the first edge detection signal Edge_Φ0 of a high level. The one-phase "up" signal UP1_Φ5 is generated by the Φ5 edge detection circuit 1055, the one-phase "down" signal DN1_Φ1 is generated by the Φ1 edge detection circuit 1051, the two-phase "up" signal UP2_Φ4 is generated by the Φ4 edge detection circuit 1054, and the two-phase "down" signal DN2_Φ2 is generated by the Φ2 edge detection circuit 1052. The other five four-input OR circuits 10513-10553 other than the four-input OR circuit 10503, included in the edge detection circuit 105 according to Embodiment 2 of the present invention illustrated in FIG. 23, respond similarly to the one-phase "up" signal, the one-phase "down" signal, the two-phase "up" signal, and the two-phase "down" signal, and generates the edge detection signal Edge ΦM. The one-phase "up" signal is the output signal of the ΦM edge detection circuit leading by one phase on the basis of each own phase of the four-input OR circuits 10513-10553, and the one-phase "down" signal is the output signal of the ΦM edge detection circuit lagging by one phase on the basis of each own phase of the four-input OR circuits 10513-10553. The two-phase "up" signal is the output signal of the ΦM edge detection circuit leading by two phases on the basis of each own phase of the four-input OR circuits 10513-10553, and the two-phase "down" signal is the output signal of the ΦM edge detection circuit lagging by two phases on the basis of each own phase of the four-input OR circuits 10513-10553.

That is, the ΦM edge detection circuit of each of six pieces of the Φ0 edge detection circuit 1050 through the Φ5 edge detection circuit 1055, included in the edge detection circuit 105 according to Embodiment 2 of the present invention illustrated in FIG. 23, executes the following operation.

First, when the data edge of the received data signal RXDATA exists within ±1 phase from the own phase ΦM of the ΦM edge detection circuit selected currently as the edge detection phase, all of the six edge detection signals Edge_Φ0-Edge_Φ5, including the own edge detection signal Edge ΦM, become a low level. Accordingly, the own phase ΦM of the ΦM edge detection circuit which is the current edge detection phase is held as in the current state.

Next, when the data edge of the received data signal RXDATA is leading by from −1 phase to −2 phases from the own phase ΦM of the ΦM edge detection circuit selected currently as the edge detection phase, a high level signal of the edge detection signal Edge_ΦM−1, which is in the position leading by one phase from the edge detection phase ΦM selected currently, is generated in order to advance the phase by one phase.

When the data edge of the received data signal RXDATA is lagging by from +1 phase to +2 phases from the own phase ΦM of the ΦM edge detection circuit selected currently as the edge detection phase, a high level signal of the edge detection signal Edge_ΦM+1, which is in the position lagging by one phase from the edge detection phase ΦM selected currently, is generated in order to delay the phase by one phase.

When the data edge of the received data signal RXDATA is leading more than −2 phases from the own phase ΦM of the ΦM edge detection circuit selected currently as the edge detection phase, a high level signal of the edge detection signal Edge_ΦM−2, which is in the position leading by two phases from the edge detection phase ΦM selected currently, is generated in order to advance the phase by two phases.

When the data edge of the received data signal RXDATA is lagging more than +2 phases from the own phase ΦM of the ΦM edge detection circuit selected currently as the edge detection phase, a high level signal of the edge detection signal Edge_ΦM+2, which is in the position lagging by two phases from the edge detection phase ΦM selected currently, is generated in order to delay the phase by two phases.

As described above, in the clock data recovery circuit 1 according to Embodiment 2 of the present invention illustrated in FIG. 22, only one of six pieces of the Φ0 edge detection circuit 1050 through the Φ5 edge detection circuit 1055, included in the edge detection circuit 105 illustrated in FIG. 23, is controlled to an active state by the six gate control signals GSEL_Φ0-GSEL_Φ5 generated by the phase selection signal generating circuit 103. Accordingly, the edge detection circuit 105 illustrated in FIG. 23 does not generate concurrently plural "up" signals of a high level, and does not generate concurrently the "up" signal of a high level and the "down" signal of a high level.

The six delay flip-flop DFFs 105104-105154, included in the edge detection circuit 105 illustrated in FIG. 23, respond to the six-phase clock signals CLK0-CLK5 and the output signals from the six four-input OR circuits 10503-10553, and generate six edge detection signals Edge_Φ0-Edge_Φ5.

Figure 25:
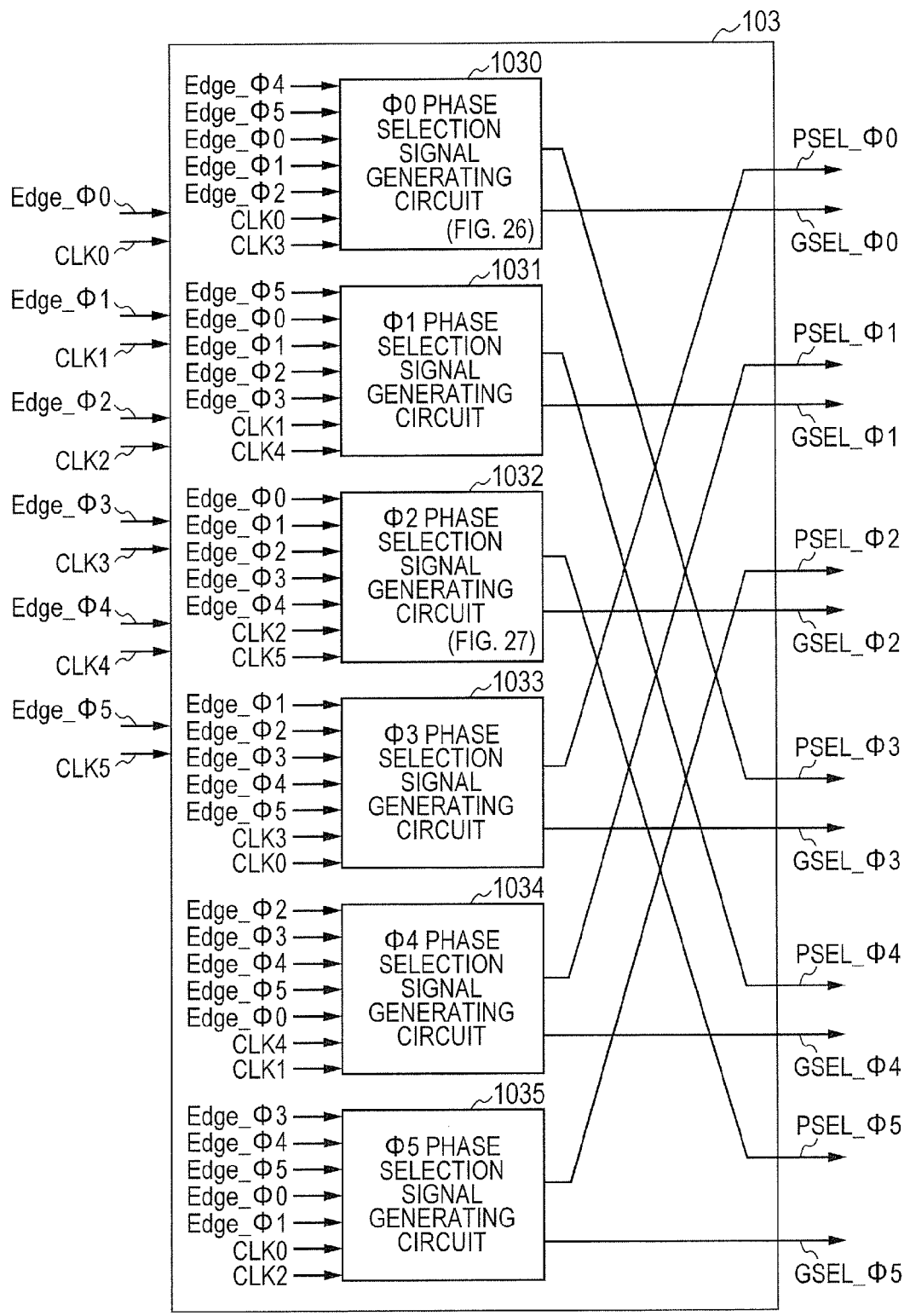
FIG. 25 is a drawing illustrating a configuration of a phase selection signal generating circuit 103 of the clock data recovery circuit 1, according to Embodiment 2 of the present invention illustrated in FIG. 22.

On the basis of the result of the edge detection phase of the data edge of the received data signal RXDATA detected one cycle earlier of the six-phase clock signals CLK0-CLK5, only one signal of the six gate control signals GSEL_Φ0-GSEL_Φ5, generated by the phase selection signal generating circuit 103 to be explained in full detail with reference to FIG. 25, is set to a high level. Accordingly, only one edge detection circuit selected from the six ΦM edge detection circuits 1050-1055, included in the edge detection circuit 105 according to Embodiment 2 of the present invention illustrated in FIG. 23, is controlled to an active state by the six gate control signals GSEL_Φ0-GSEL_Φ5 generated by the phase selection signal generating circuit 103 to be described in detail with reference to FIG. 25, and the other five edge detection circuits are controlled to a non-active state. Therefore, it is possible to provide an oversampling digital clock data recovery circuit which can alleviate increase of the power consumption.

<<Phase Selection Signal Generating Circuit>>

FIG. 25 illustrates a configuration of the phase selection signal generating circuit 103 of the clock data recovery circuit 1 according to Embodiment 2 of the present invention illustrated in FIG. 22.

As illustrated in FIG. 25, the phase selection signal generating circuit 103 comprises six ΦM phase selection signal generating circuits 1030-1035 (M=0-5) which are the same number as the phase number of the multi-phase clock signals CLK0-CLK5. The phase selection signal generating circuit 103 illustrated in FIG. 25 responds to the six-phase clock signals CLK0-CLK5 and the six edge detection signals Edge_Φ0-Edge_Φ5 generated by the edge detection circuit 105 illustrated in FIG. 23, and generates six phase selection signals PSEL_Φ0-PSEL_Φ5 and six gate control signals GSEL_Φ0-GSEL_Φ5. The six gate control signals GSEL_Φ0-GSEL_Φ5 control the active state and non-active state of the six ΦM edge detection circuits 1050-1055 included in the edge detection circuit 105 illustrated in FIG. 23.

When explained in more detail, the Φ0 phase selection signal generating circuit 1030 included in the phase selection signal generating circuit 103 illustrated in FIG. 25 is supplied with five edge detection signals Edge_Φ4, Edge_Φ5, Edge_Φ0-Edge_Φ2, the first clock signal CLK0, and the fourth clock signal CLK3, and generates the fourth phase selection signal PSEL_Φ3 and the first gate control signal GSEL_Φ0. The first gate control signal GSEL_Φ0 is supplied to the Φ0 edge detection circuit 1050 of the edge detection circuit 105 illustrated in FIG. 23. The reason why the phase selection signal generated by the Φ0 phase selection signal generating circuit 1030 is allotted to the fourth phase selection signal PSEL_Φ3 is as follows. When the data edge detection phase of the received data signal RXDATA is determined to be phase 0 by the Φ0 phase selection signal circuit 1030, the clock data generating circuit 104 selects the fourth clock signal CLK3 which is a phase separated by 0.5 UI from the phase 0 of the data edge detection phase, as a reproduction clock RCLK.

In the phase selection signal generating circuit 103 illustrated in FIG. 25, the phase of the input signal and the output signal of the Φ1 phase selection signal generating circuit 1031 through the Φ5 phase selection signal generating circuit 1035 other than the Φ0 phase selection signal generating circuit 1030 described above, only shifts by one phase of the clock signal per circuit, as compared with the phase relation of the input signal and the output signal of the Φ0 phase selection signal circuit 1030. Accordingly, the detailed explanation thereof is omitted.

Figure 26:
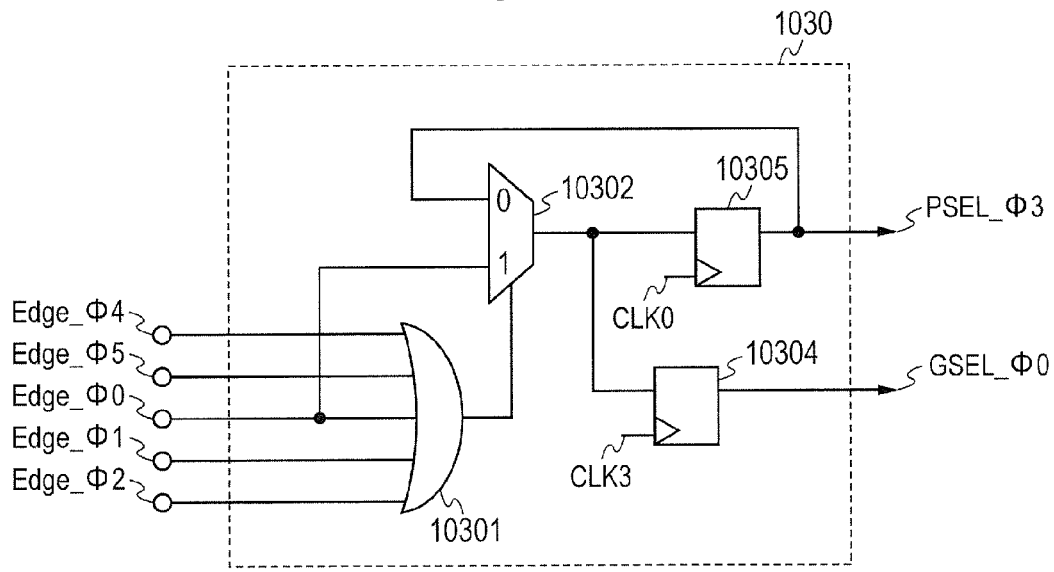
FIG. 26 is a drawing illustrating a configuration of a Φ0 phase selection signal generating circuit 1030 which is M=0 of six ΦM phase selection signal generating circuits 1030-1035 of the phase selection signal generating circuit 103, according to Embodiment 2 of the present invention illustrated in FIG. 25.

FIG. 26 illustrates a configuration of the Φ0 phase selection signal generating circuit 1030 which is M=0 of six ΦM phase selection signal generating circuits 1030-1035 of the phase selection signal generating circuit 103 according to Embodiment 2 of the present invention illustrated in FIG. 25.

The Φ0 phase selection signal generating circuit 1030 illustrated in FIG. 26 comprises a five-input OR circuit 10301, a two-input selector 10302, and two delay flip-flop DFFs 10304 and 10305.

Five edge detection signals Edge_Φ4, Edge_Φ5, Edge_Φ0-Edge_Φ2 are supplied to the input of the five-input OR circuit 10301. When any one of the five edge detection signals is a high level, the five-input OR circuit 10301 generates the output signal of a high level. Accordingly, the five-input OR circuit 10301 functions as an edge existence determination circuit which determines the existence or non-existence of the arrival of the data edge of the received data signal RXDATA.

Two-input selector circuit 10302 selects the input signal supplied to the input terminal on the side of a low level "0", when the output signal of the five-input OR circuit 10301 is a low level, and selects the input signal supplied to the input terminal on the side of a high level "1", on the contrary, when the output signal of the five-input OR circuit 10301 is a high level. Namely, the fourth phase selection signal PSEL_Φ3 of the output terminal of the delay flip-flop DFF 10305 is supplied to the input terminal on the side of a low level "0" of the two-input selector circuit 10302, and the first edge detection signal Edge_Φ0 is supplied to the input terminal on the side of a high level "1" of the two-input selector circuit 10302. Accordingly, when the data edge of the received data signal RXDATA comes, the selector circuit 10302 selects and outputs the value of the first edge detection signal Edge_Φ0 which is the input signal of the middle timing of the input terminal on the side of a high level "1", in order to update the edge detection phase. However, when the data edge of the received data signal RXDATA does not come, the selector circuit 10302 selects the value of the fourth phase selection signal PSEL_Φ3 of the output terminal of the delay flip-flop DFF 10305 as the phase selection signal selected one cycle earlier of the multi-phase clocks CLK0-CLK5, and holds it again in the delay flip-flop DFF 10305.

The reason why the five edge detection signals Edge_Φ4, Edge_Φ5, Edge_Φ0-Edge_Φ2 are supplied to the five-input OR circuit 10301 of the Φ0 phase selection signal generating circuit 1030 illustrated in FIG. 26 is as follows. Since this reason is analogous with the explanation made for the case where the three edge detection signals Edge_Φ5, Edge_Φ0, and Edge_Φ1 with different timing are supplied to the three-input OR circuit 10301 of the Φ0 phase selection signal generating circuit 1030 illustrated in FIG. 11 in Embodiment 1 of the present invention, the detailed explanation thereof is omitted. Instead, the simplified explanation thereof is made as follows.

Namely, this is because, when the data edge of the received data signal is detected at phase 0 which is the own phase of the Φ0 phase selection signal generating circuit 1030 illustrated in FIG. 26, in other words, when the first edge detection signal Edge_Φ0 is set to a high level, the fourth phase selection signal PSEL_Φ3 and the first gate control signal GSEL_Φ0 should be set to a high level. On the contrary, when any one of the other four edge detection signals Edge_Φ4, Edge_Φ5, Edge_Φ1, and Edge_Φ2 other than the first edge detection signal Edge_Φ0 is set to a high level, the fourth phase selection signal PSEL_Φ3 and the first gate control signal GSEL_Φ0 are set to a low level.

Figure 27:
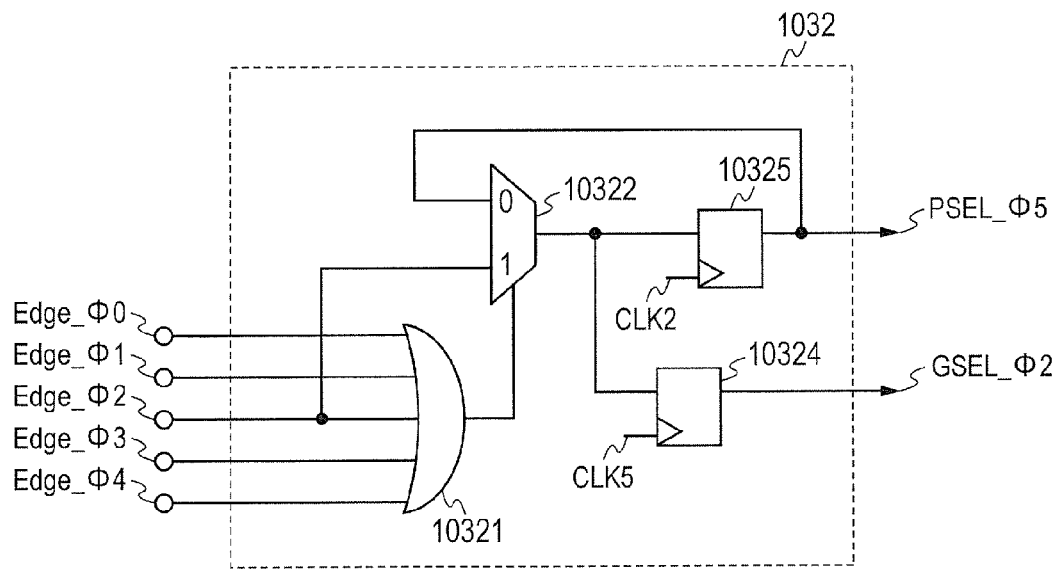
FIG. 27 is a drawing illustrating a configuration of a Φ2 phase selection signal generating circuit 1032 which is M=2 of the six ΦM phase selection signal generating circuits 1030-1035 of the phase selection signal generating circuit 103, according to Embodiment 2 of the present invention illustrated in FIG. 25.

FIG. 27 illustrates a configuration of the Φ2 phase selection signal generating circuit 1032 which is M=2 of the six ΦM phase selection signal generating circuits 1030-1035 of the phase selection signal generating circuit 103 according to Embodiment 2 of the present invention illustrated in FIG. 25.

The Φ2 phase selection signal generating circuit 1032 illustrated in FIG. 27 comprises a five-input OR circuit 10321, a two-input selector 10322, and two delay flip-flop DFFs 10324 and 10325.

The circuit configuration of the Φ2 phase selection signal generating circuit 1032 illustrated in FIG. 27 is the same as the circuit configuration of the Φ0 phase selection signal generating circuit 1030 illustrated in FIG. 26, but the relation of the input signal and the output signal only shifts by two phases respectively. Accordingly, the explanation thereof is omitted.

As clarified from the explanation of <<The edge detection circuit>> and the explanation of <<The phase selection signal generating circuit>> of Embodiment 2 of the present invention described above, the following operation is executed in Embodiment 2 of the present invention.

For example, in response to the two-phase "down" signal DN2_Φ2, the one-phase "down" signal DN1_Φ1, the two-phase "up" signal UP2_Φ4, and the one-phase "up" signal UP1_Φ5, the four-input OR circuit 10503 and the delay flip-flop DFF 105104 generate the first edge detection signal Edge_Φ0 of a high level. The two-phase "down" signal DN2_Φ2 and the one-phase "down" signal DN1_Φ1 are generated, respectively, by the Φ2 edge detection circuit 1052 lagging by two phases and the Φ1 edge detection circuit 1051 lagging by one phase, with reference to the own phase Φ0 of the Φ0 edge detection circuit 1050 selected currently as the edge detection phase. The two-phase "up" signal UP2_Φ4 and the one-phase "up" signal UP1_Φ5 are generated, respectively, by the Φ4 edge detection circuit 1054 leading by two phases and the Φ5 edge detection circuit 1055 leading by one phase, with reference to the own phase Φ0 of the Φ0 edge detection circuit 1050 selected currently as the edge detection phase. In response to the first edge detection signal Edge_Φ0 of a high level, it becomes possible that the Φ0 phase selection signal generating circuit 1030 of the phase selection signal generating circuit 103 shifts the first gate control signal GSEL_Φ0 and the fourth phase selection signal PSEL_Φ3 to a high level.

When the Φ0 edge detection circuit 1050 is in an active state by the first gate control signal GSEL_Φ0 of a high level, for example, the Φ0 edge detection circuit 1050 generates the two-phase "down" signal DN2_Φ0 of a high level, on the basis of the detection phase of the data edge of the received data signal RXDATA. Accordingly, in response to the two-phase "down" signal DN2_Φ0 of a high level, the four-input OR circuit 10543 and the delay flip-flop DFF 105144 generate the fifth edge detection signal Edge_Φ4 of a high level. Consequently, in response to the fifth edge detection signal Edge_Φ4 of a high level, the Φ2 phase selection signal generating circuit 1034 leading by two phases from phase 0 can shift the fifth gate control signal GSEL_Φ4 and the second phase selection signal PSEL_Φ1 from a low level to a high level.

Similarly, when the Φ0 edge detection circuit 1050 is in an active state by the first gate control signal GSEL_Φ0 of a high level, the Φ0 edge detection circuit 1050 generates the one-phase "down" signal DN1_Φ0 of a high level, on the basis of the detection phase of the data edge of the received data signal RXDATA. Accordingly, in response to the one-phase "down" signal DN1_Φ0 of a high level, the four-input OR circuit 10553 and the delay flip-flop DFF 105154 generate the sixth edge detection signal Edge_Φ5 of a high level. Consequently, in response to the sixth edge detection signal Edge_Φ5 of a high level, the Φ2 phase selection signal generating circuit 1035 leading by one phase from phase 0 can shift the sixth gate control signal GSEL_Φ5 and the third phase selection signal PSEL_Φ2 from a low level to a high level.

Furthermore, when the Φ0 edge detection circuit 1050 is in an active state by the first gate control signal GSEL_Φ0 of a high level, the Φ0 edge detection circuit 1050 generates the one-phase "up" signal UP1_Φ0 of a high level, on the basis of the detection phase of the data edge of the received data signal RXDATA. Accordingly, in response to the one-phase "up" signal UP1_Φ0 of a high level, the four-input OR circuit 10513 and the delay flip-flop DFF 105114 generate the second edge detection signal Edge_Φ1 of a high level. Consequently, in response to the second edge detection signal Edge_Φ1 of a high level, the Φ1 phase selection signal generating circuit 1031 lagging by one phase from phase 0 can shift the second gate control signal GSEL_Φ1 and the fifth phase selection signal PSEL_Φ4 from a low level to a high level.

Furthermore, when the Φ0 edge detection circuit 1050 is in an active state by the first gate control signal GSEL_Φ0 of a high level, the Φ0 edge detection circuit 1050 generates the two-phase "up" signal UP2_Φ0 of a high level, on the basis of the detection phase of the data edge of the received data signal RXDATA. Accordingly, in response to the two-phase "up" signal UP2_Φ0 of a high level, the four-input OR circuit 10523 and the delay flip-flop DFF 105124 generate the third edge detection signal Edge_Φ2 of a high level. Consequently, in response to the third edge detection signal Edge_Φ2 of a high level, the Φ2 phase selection signal generating circuit 1032 lagging by two phases from phase 0 can shift the third gate control signal GSEL_Φ2 and the sixth phase selection signal PSEL_Φ5 from a low level to a high level.

<<Operation of the Clock Data Recovery Circuit>>

FIG. 28 is a timing chart illustrating operation of the clock data recovery circuit 1 according to Embodiment 2 of the present invention, explained with reference to FIGS. 22 through 27.

The clock data recovery circuit 1 according to Embodiment 2 of the present invention performs the following operation as the initializing operation at the time of power-on or at the time of standby cancellation. Namely, one arbitrary gate control signal of the six gate control signals GSEL_Φ0-GSEL_Φ5, for example, the first gate control signal GSEL_Φ0, is set to the selection level of a high level, and the fourth phase selection signal PSEL_Φ3 shifted by +3 phases (0.5 UI) from the one arbitrary selected gate control signal GSEL_Φ0 is set to the selection level of a high level.

In order to avoid complication of the following explanation, it is assume that the description called an edge detection phase is the same phase as the selection phase of one gate control signal selected from the six gate control signals GSEL_Φ0-GSEL_Φ5, and is expressed as phase 0-phase 5. Therefore, it should be noted that the edge detection phase is distinguished from the phase selection signal (one phase selection signal selected from the six phase selection signals PSEL_Φ0-PSEL_Φ5) of the reproduction clock RCLK which is shifted from the edge detection phase (one selected gate control signal) by +3 phases (0.5 UI).

<<Initializing Operation>>

At timing t of t<te(0) illustrated in FIG. 28, in order to execute the initializing operation described above, the first gate control signal GSEL_Φ0 is set to the selection level of a high level among the six gate control signals GSEL_Φ0-GSEL_Φ5, and the other gate control signals GSEL_Φ1-GSEL_Φ5 are set to the non-selection level of a low level. At the same timing t, the fourth phase selection signal PSEL_Φ3 shifted by +3 phases (0.5 UI) from the selected first gate control signal GSEL_Φ0 is selected from the six phase selection signals PSEL_Φ0-PSEL_Φ5 and is set to the selection level of a high level, and the other phase selection signals PSEL_Φ0-PSEL_Φ2, PSEL_Φ4, and PSEL_Φ5 are set to the non-selection level of a low level. Namely, at timing t of t<te(0), only the Φ0 edge detection circuit 1050 is controlled to the active state among the six ΦM edge detection circuits 1050-1055 of the edge detection circuit 105 illustrated in FIG. 6, and the edge detection phase is defined as phase 0. Furthermore, the clock data generating circuit 104 illustrated in FIG. 14 selects the fourth clock signal CLK3 out of the six-phase clock signals CLK0-CLK5 as the reproduction clock RCLK by the fourth phase selection signal PSEL_Φ3.

<<The Data Edge of the Received Data Signal>>

The following assumes the case where the received data signal RXDATA shifts from a low level to a high level at timing t=te(0), that is, the case where the data edge of the received data signal RXDATA has come between the rising edge of the first clock signal CLK0 and the rising edge of the second clock signal CLK1. In the present case, by sampling the high level of the received data signal RXDATA at the rise timing t=t1(0) of the second clock signal CLK1, with the use of the delay flip-flop DFF 1061 of the sampling circuit 106 illustrated in FIG. 5, the second sampling signal Sample_Φ1 becomes a high level. On the other hand, at this timing t=t1(0), both of the fourth sampling signal Sample_Φ3 and the fifth sampling signal Sample_Φ4 are at a low level; accordingly, the output signal of the exclusive OR circuit 105030 of the first edge detection circuit 10501 of the Φ0 edge detection circuit 1050 illustrated in FIG. 24, to which the fourth sampling signal Sample_Φ3 and the fifth sampling signal Sample_Φ4 of a low level are supplied, becomes a low level. The delay flip-flop DFF 105031 samples the present output signal of a low level of the exclusive OR circuit 105030 at the timing of the rising edge of the second clock signal CLK1; accordingly, the output signal of a low level is generated by the output of the delay flip-flop DFF 103031.

At timing t=t1(0), the first gate control signal GSEL_Φ0 is a high level. Accordingly, the output of the AND circuit 105032 to which the low level output signal of the delay flip-flop DFF 103031 and the high level signal of the first gate control signal GSEL_Φ0 are supplied, that is, the two-phase "down" signal DN2_Φ0 of the third edge detection circuit 10503 of the Φ0 edge detection circuit 1050 illustrated in FIG. 24, maintains a low level at least until timing t=t1(1) when the second clock signal CLK1 rises next time. On the other hand, at this timing t=t1(0), the third sampling signal Sample_Φ2 is a low level. Accordingly, in the period of timing te(0)<t1(0)≤t≤t2(0), the output of the exclusive OR circuit 105020 of the second edge detection circuit 10502 of the Φ0 edge detection circuit 1050 illustrated in FIG. 24, to which the second sampling signal Sample_Φ1 of a high level and the third sampling signal Sample_Φ2 of a low level are supplied, also becomes a high level. Consequently, in the second edge detection circuit 10502 of the Φ0 edge detection circuit 1050 illustrated in FIG. 24, the output of the AND circuit 105023, to which the high level output signal of the exclusive OR circuit 105020 and the first gate control signal GSEL_Φ0 of a high level are supplied, becomes a high level. That is, the one-phase "up" signal UP1_Φ0 of the Φ0 edge detection circuit 1050 becomes a high level.

After that, the third sampling signal Sample_Φ2 also becomes a high level after the rise timing t=t2(0) of the third clock signal CLK2. Therefore, the one-phase "up" signal UP1_Φ0 of the Φ0 edge detection circuit 1050 illustrated in FIG. 24 becomes a low level again. At the rise timing t=t2(0) of the third clock signal CLK2, the fifth sampling signal Sample_Φ4 and the sixth sampling signal Sample_Φ5 are low levels. Accordingly, the output signal of the exclusive OR circuit 105010 of the first edge detection circuit 10501 of the Φ0 edge detection circuit 1050 illustrated in FIG. 24, to which the fifth sampling signal Sample_Φ4 and the sixth sampling signal Sample_Φ5 of a low level are supplied, becomes a low level. Consequently, in the first edge detection circuit 10501 of the Φ0 edge detection circuit 1050 illustrated in FIG. 24, the low level output signal of the exclusive OR circuit 105010 is sampled by the delay flip-flop DFF 105011 at the timing of the rising edge of the third clock signal CLK2. Therefore, the output signal generated by the output of the delay flip-flop DFF 105011 is a low level. At timing t=t2(0), the first gate control signal GSEL_Φ0 maintains a high level. Accordingly, the output of the AND circuit 105012 to which the low level output of the delay flip-flop DFF 105011 and the first gate control signal GSEL_Φ0 of a high level are supplied, that is, the output of the one-phase "down" signal DN1_Φ0 of the Φ0 edge detection circuit 1050, maintains a low level at least until the next rise timing t=t2(1) of the third clock signal CLK2. At this timing t=t2(0), the fourth sampling signal Sample_Φ3 is a low level. Accordingly, in the period of timing te(0)<t2(0)<t<t3(0), the output of the exclusive OR circuit 105040 of the fourth edge detection circuit 10504 of the Φ0 edge detection circuit 1050 illustrated in FIG. 24, to which the third sampling signal Sample_Φ2 of a high level and the fourth sampling signal Sample_Φ3 of a low level are supplied, becomes a high level. Consequently, the output of the AND circuit 105043, to which the output signal of a high level of the exclusive OR circuit 105040 and the first gate control signal GSEL_Φ0 of a high level are supplied, become a high level. Therefore, the two-phase "up" signal UP2_Φ0 of the Φ0 edge detection circuit 1050 becomes a high level.

After that, after the rise timing t=t3(0) of the fourth clock signal CLK3, the fourth sampling signal Sample_Φ3 also becomes a high level, and the two-phase "up" signal UP2_Φ0 of the Φ0 edge detection circuit 1050 illustrated in FIG. 24 becomes a low level again. At this timing t=t3(0), the Φ1 edge detection circuit 1051 of the edge detection circuit 105 illustrated in FIG. 23 is still controlled in the non-active state by the second gate control signal GSEL_Φ1 of a low level; accordingly, the one-phase "up" signal UP1_Φ1 from the Φ1 edge detection circuit 1051 maintains a low level consistently. Similarly, in the edge detection circuit 105 illustrated in FIG. 23, the one-phase "down" signal DN1_Φ3 from the Φ3 edge detection circuit 1053, controlled by the fourth gate control signal GSEL_Φ3 of a low level, maintains a low level, and the two-phase "down" signal DN2_Φ4 from the Φ4 edge detection circuit 1054, controlled by the fifth gate control signal GSEL_Φ4 of a low level, also maintains a low level.

Accordingly, after timing t=t3(0), the four-input OR circuit 10523 of the edge detection circuit 105 illustrated in FIG. 23 responds the two-phase "up" signal UP2_Φ0 of a low level, the one-phase "up" signal UP1_Φ1 of a low level, the one-phase "down" signal DN1_Φ3 of a low level, and the two-phase "down" signal DN2_Φ4 of a low level, and generates the output signal of a low level. Next, at the rise timing t=t2(1) of the third clock CLK2, in the edge detection circuit 105 illustrated in FIG. 23, the delay flip-flop DFF 105124 samples the output signal of the four-input OR circuit 10523; accordingly, the third edge detection signal Edge_Φ2 which is the output of the delay flip-flop DFF 105124 is maintained at a low level.

At timing t≤t1(1), five pieces of the Φ1 edge detection circuit 1051 through the Φ5 edge detection circuit 1055 of the edge detection circuit 105 illustrated in FIG. 23 are in a non-active state by five gate control signals GSEL_Φ1-GSEL_Φ5 of a low level. Accordingly, the edge detection signals Edge_Φ0, Edge_Φ1-Edge_Φ5 are maintained at a low level. Accordingly, the output of the five-input OR circuit 10301 of the Φ0 phase selection signal generating circuit 1030 illustrated in FIG. 26 is maintained at a low level, and the selector 10302 continues selecting the input terminal on the side of "0." Consequently, the high level signal of the fourth phase selection signal PSEL_Φ3 as the edge detection phase outputted currently from the delay flip-flop DFF 10305 is supplied to the two delay flip-flop DFFs 10305 and 10304, via the input terminal on the side of "0" and the output terminal of the selector 10302. Namely, at the rise timing t=t3(1) of the fourth clock signal CLK3, the delay flip-flop DFF 10304 samples the high level output of the selector 10302; accordingly, the first gate control signal GSEL_Φ0 as the output thereof is maintained at a high level. Similarly, at the rise timing t=t0(2) of the first clock signal CLK0, the delay flip-flop DFF 10305 samples the high level output of the selector 10302, and the fourth phase selection signal PSEL_Φ3 as the output thereof is maintained at a high level.

The other five pieces of the Φ1 phase selection signal generating circuit 1031 through the Φ5 phase selection signal generating circuit 1035, included in the phase selection signal generating circuit 103 illustrated in FIG. 25, respond to the edge detection signals Edge_Φ0-Edge_Φ5 of a low level supplied to the input, and output the five gate control signals GSEL_Φ1-GSEL_Φ5, and the five phase selection signals PSEL_Φ4, PSEL_Φ5, and PSEL_Φ0-PSEL_Φ2 which are maintained at a low level. As a result, the clock data generating circuit 104 illustrated in FIG. 14 continues selecting the fourth clock signal CLK3 out of the six-phase clock signals CLK0-CLK5 as the reproduction clock RCLK, in response to the fourth phase selection signal PSEL_Φ3 of a high level.

As explained in the above, the following assumes the case where the data edge position of the received data signal RXDATA exists within the range of ±1 phase from phase 0 of the first clock signal CLK0 which is the edge detection phase selected currently (in the example described above, the case where the data edge of the received data signal RXDATA has come between the rising edge of the sixth clock signal CLK5 and the rising edge of the second clock signal CLK1). It is understood that, in the present case, the selection of phase 0 of the first clock signal CLK0 as the current edge detection phase is held continuously.

Next, the following assumes the case where the received data signal RXDATA shifts from a high level to a low level at timing t=te(1), that is, the case where the data edge (falling edge) of the received data signal RXDATA has come between the rising edge of the third clock signal CLK2 and the rising edge of the fourth clock signal CLK3. In this case, at the rise timing t=t1(1) of the second clock signal CLK1, the received data signal RXDATA continues still to be a high level. Accordingly, the fourth sampling signal Sample_Φ3 and the fifth sampling signal Sample_Φ4, as the sampling result at the rise timing t=t1(1) of the second clock signal CLK1 of the received data signal RXDATA by the delay flip-flop DFF 1063 and the delay flip-flop DFF 1064 of the sampling circuit 106 illustrated in FIG. 5, are held at a high level. Accordingly, the output of the exclusive OR circuit 105030 of the third edge detection circuit 10503 of the Φ0 edge detection circuit 1050 illustrated in FIG. 24, to which the fourth sampling signal Sample_Φ3 of a high level and the fifth sampling signal Sample_Φ4 of a high level are supplied, becomes a low level. The delay flip-flop DFF 105031 samples the present output signal of a low level of the exclusive OR circuit 105030 at the timing of the rising edge of the second clock signal CLK1; accordingly, the output signal of a low level is generated by the delay flip-flop DFF 105031. At this time, the first gate control signal GSEL_Φ0 is a high level; accordingly, the output of the AND circuit 105032 to which the low level output signal of the delay flip-flop DFF 105031 and the first gate control signal GSEL_Φ0 of a high level are supplied, that is, the two-phase "down" signal DN2_Φ0 of the Φ0 edge detection circuit 1050, is maintained at a low level at least until the next rise timing t=t1(2) of the second clock signal CLK1. Next, at the rise timing t=t2(1) of the third clock signal CLK2, the received data signal RXDATA is still at a high level; accordingly, when the received data signal RXDATA is sampled by the delay flip-flop DFF 1062 of the sampling circuit 106 illustrated in FIG. 5, the third sampling signal Sample_Φ2 remains at a high level. At the rise timing t=t2(1) of the third clock signal CLK2, the fifth sampling signal Sample_Φ4 and the sixth sampling signal Sample_Φ5 are high levels. Accordingly, the output of the exclusive OR circuit 105010 of the first edge detection circuit 10501 of the Φ0 edge detection circuit 1050 illustrated in FIG. 24, to which the fifth sampling signal Sample_Φ4 and the sixth sampling signal Sample_Φ5 of a high level are supplied, becomes a low level. The delay flip-flop DFF 105011 samples the present output signal of a low level of the exclusive OR circuit 105010 at the timing of the rising edge of the third clock signal CLK2; accordingly, the output signal of a low level is generated by the delay flip-flop DFF 105011. At this time, the first gate control signal GSEL_Φ0 maintains a high level; accordingly, the output of the AND circuit 105012 to which the low level output of the delay flip-flop DFF 105011 and the first gate control signal GSEL_Φ0 of a high level are supplied, that is, the one-phase "down" signal DN1_Φ0 of the Φ0 edge detection circuit 1050, is maintained at a low level at least until the next rise timing t=t2(2) of the third clock signal CLK2.

On the other hand, at the rise timing t=t3(1) of the fourth clock signal CLK3, the received data signal RXDATA is a low level, and when the received data signal RXDATA is sampled by the delay flip-flop DFF 1063 of the sampling circuit 106 illustrated in FIG. 5, the fourth sampling signal Sample_Φ3 shifts from a high level to a low level. Accordingly, at this timing t=t3(1), the output of the exclusive OR circuit 105040 of the fourth edge detection circuit 10504 of the Φ0 edge detection circuit 1050 illustrated in FIG. 24, to which the third sampling signal Sample_Φ2 of a high level and the fourth sampling signal Sample_Φ3 of a low level are supplied, shifts from a low level to a high level. The output of the AND circuit 105043 to which the high level output of the exclusive OR circuit 105040 and the first gate control signal GSEL_Φ0 of a high level are supplied, that is, the two-phase "up" signal UP2_Φ0 from the Φ0 edge detection circuit 1050, shifts from a low level to a high level at timing t=t3(1). This two-phase "up" signal UP2_Φ0 maintains the high level in the period t of timing t3(1)≤t≤t2(2) until the third sampling signal Sample_Φ2 outputted from the delay flip-flop DFF 1062 of the sampling circuit 106 illustrated in FIG. 5 shifts from a high level to a low level at the next rise timing t=t2(2) of the third clock signal CLK2. That is, the two-phase "up" signal UP2_Φ0 does not fall at the rising edge of the fourth clock signal CLK3 unlike at timing t=t3(0), but maintains the high level until the rising edge t2(2) of the third clock signal CLK2, and falls immediately after this timing t2(2).

At the rise timing t=t1(1) of the second clock signal CLK1, when the high level of the received data signal RXDATA is sampled by the delay flip-flop DFF 1061 of the sampling circuit 106 illustrated in FIG. 5, the second sampling signal Sample_Φ1 maintains a high level. The third sampling signal Sample_Φ2 is a high level at this timing t=t1(1); accordingly, the output of the exclusive OR circuit 105020 of the second edge detection circuit 10502 of the Φ0 edge detection circuit 1050 illustrated in FIG. 24, to which the second sampling signal Sample_Φ1 of a high level and the third sampling signal Sample_Φ2 of a high level are supplied in the period t of timing te(1)<t1(1) t<t2(1), maintains the low level. The third sampling signal Sample_Φ2 maintains the high level after the rise timing t=t2(1) of the third clock signal CLK2. The output of the AND circuit 105023, to which the low level output of the exclusive OR circuit 105020 and the first gate control signal GSEL_Φ0 of a high level are supplied, maintains a low level. That is, the one-phase "up" signal UP1_Φ0 from the Φ0 edge detection circuit 1050 also maintains a low level.

At this time, in the edge detection circuit 105 illustrated in FIG. 23, the Φ1 edge detection circuit 1051 is still controlled in a non-active state by the second gate control signal GSEL_Φ1 of a low level. Accordingly, the one-phase "up" signal UP1_Φ1 maintains the low level consistently. Similarly, the one-phase "down" signal DN1_Φ3, generated by the Φ3 edge detection circuit 1053 which is controlled in the non-active state by the fourth gate control signal GSEL_Φ3 of a low level, also maintains a low level, and the two-phase "down" signal DN2_Φ4, generated by the Φ4 edge detection circuit 1054 which is controlled in a non-active state by the fifth gate control signal GSEL_Φ4 of a low level, also maintains a low level. Accordingly, at the timing immediately before the timing t2(2), the two-phase "up" signal UP2_Φ0 is a high level, and the one-phase "up" signal UP1_Φ1, the one-phase "down" signal DN1_Φ3, and the two-phase "down" signal DN2_Φ4 are a low level as described above. Accordingly, in response to one high level input signal and three low level input signals, the output of the four-input OR circuit 10523 becomes a high level. Accordingly, at the rise timing t=t2(2) of the third clock signal CLK2, the delay flip-flop DFF 105124 samples the high level output signal of the four-input OR circuit 10523 by the third clock signal CLK2; accordingly, the third edge detection signal Edge_Φ2 as the output signal of the delay flip-flop DFF 105124 shifts from a low level to a high level.

As a result, at timing t=t2(2), the third edge detection signal Edge_Φ2 shifts to a high level; consequently, in the Φ0 phase selection signal generating circuit 1030 illustrated in FIG. 26, the selector 10302 selects the input terminal on the side of a high level "1", and transfers the low level signal of the first edge detection signal Edge_Φ0 at a middle timing to two delay flip-flop DFFs 10304 and 10305 in the latter stage circuit. Then, at timing t=t3(2) of the rising edge of the fourth clock signal CLK3, the delay flip-flop DFF 10304 samples the low level signal of the first edge detection signal Edge_Φ0 which is the selected output signal of the selector 10302. Consequently, the first gate control signal GSEL_Φ0 as the output signal of the delay flip-flop DFF 10304 shifts from a high level to a low level. Consequently, from timing t=t3(2), in response to the first gate control signal GSEL_Φ0 of a low level, the Φ0 edge detection circuit 1050 of the edge detection circuit 105 illustrated in FIG. 23 shifts from an active state to a non-active state. Accordingly, the selection of phase 0 as the edge detection phase by the edge detection circuit 105 is terminated.

Next, at timing t=t0(3) of the rising edge of the first clock signal CLK0, in the Φ0 phase selection signal generating circuit 1030 illustrated in FIG. 26, the low level signal of the first edge detection signal Edge_Φ0 selected by the selector 10302 at a middle timing is sampled by the delay flip-flop DFF 10305. Accordingly, the Φ3 phase selection signal PSEL_Φ3 as the output signal of the delay flip-flop DFF 10305 shifts from a high level to a low level. Accordingly, at timing t=t0(3), the Φ3 phase selection signal PSEL_Φ3 shifts from a high level to a low level, and the other phase selection signals PSEL_Φ0-PSEL_Φ2, PSEL_Φ4-PSEL_Φ5 remain at a low level. Therefore, the clock data generating circuit 104 illustrated in FIG. 14 enters in a cut-off state or a not-selected state of the reproduction clock RCLK, and the reproduction clock RCLK becomes a low level.

In the Φ2 phase selection signal generating circuit 1032 illustrated in FIG. 27, on the other hand, in response to the third edge detection signal Edge_Φ2 of a high level, the selector 10322 selects the input terminal on the side of a high level "1", and transfers the third edge detection signal Edge_Φ2 of a high level at a middle timing to two delay flip-flop DFFs 10324 and 10325 in the latter stage circuit. Namely, at timing t=t5(2) of the rising edge of the sixth clock signal CLK5, the delay flip-flop DFF 10324 samples the high level signal of the third edge detection signal Edge_Φ2 as the output signal of the selector 10322; accordingly, the third gate control signal GSEL_Φ2 as the output signal of the delay flip-flop DFF 10324 shifts from a low level to a high level. Accordingly, from timing t=t5(2), in response to the third gate control signal GSEL_Φ2 of a high level, the Φ2 edge detection circuit 1052 of the edge detection circuit 105 illustrated in FIG. 23 shifts from a non-active state to an active state, and the selection of phase 2 as the edge detection phase by the edge detection circuit 105 starts.

Next, at timing t=t2(3) of the rising edge of the third clock signal CLK2, in the Φ2 phase selection signal generating circuit 1032 illustrated in FIG. 27, the delay flip-flop DFF 10325 samples the high level signal of the third edge detection signal Edge_Φ2 as the output signal of the selector 10325. Accordingly, the sixth phase selection signal PSEL_Φ5 as the output signal of the delay flip-flop DFF 10325 shifts from a low level to a high level. Accordingly, from timing t=t2(3), as the reproduction clock RCLK to be generated by the clock data generating circuit 104 illustrated in FIG. 14, the sixth clock signal CLK5 is selected instead of the fourth clock signal CLK3 which is selected until then. It can be verified from the explanation of operation described above that the selection phase of the clock data generating circuit 104 illustrated in FIG. 14 has been changed directly from the fourth clock signal CLK3 of the beginning to the sixth clock signal CLK5, without passing through the fifth clock signal CLK4.

In Embodiment 1 of the present invention explained first, the phase which can shift at a time in the edge detection and the phase selection of the reproduction clock is restricted to the amount of one phase. Accordingly, when the edge position of the received data signal RXDATA shifts by two phases of the clock at a time, it becomes possible by passing through state transitions twice that the phase selection of the edge detection and the phase selection of the reproduction clock follow the variation of the data edge of the received data signal RXDATA.

On the other hand, in Embodiment 2 of the present invention explained with reference to FIGS. 22 through 28, the phase which can shift at a time in the phase selection of the edge detection and of the reproduction clock is extended to the amount of two phases. Accordingly, even when the edge position of the received data signal RXDATA is varied by two phases at a time under the influence of a jitter etc., it becomes possible that the phase selection of the edge detection and the phase selection of the reproduction clock follow the variation of the data edge of the received data signal RXDATA by a single state transition.

It is understood that, even when the position of the data edge of the received data signal RXDATA exists approximately in the middle of the rising edge of the third clock signal CLK2 and the rising edge of the fourth clock signal CLK3 at timing t=te(2) of the timing chart illustrated in FIG. 28, phase 2 of the third clock signal CLK2 is stably selected as the edge detection phase. The reason is because the position of the data edge of the received data signal RXDATA at timing t=te(2) exists within the range of ±1 phase from the rising edge of the third clock signal CLK2 of phase 2 which is the edge detection phase selected currently by the third gate control signal GSEL_Φ2 of a high level.

It is understood that when, at timing t=te(3) of the timing chart illustrated in FIG. 28, the position of the data edge of the received data signal RXDATA exists between the rising edge of the second clock signal CLK1 and the rising edge of the third clock signal CLK2 and extremely near the edge of the third clock signal CLK2, phase 2 of the third clock signal CLK2 is stably selected as the edge detection phase. The reason is because the position of the data edge of the received data signal RXDATA at timing t=te(3) exists within the range of ±1 phase from the rising edge of the third clock signal CLK2 of phase 2 which is the edge detection phase selected currently by the third gate control signal GSEL_Φ2 of a high level.

It is understood that, at timing t=te(4) of the timing chart illustrated in FIG. 28, even when the position of the data edge of the received data signal RXDATA exists between the rising edge of the third clock signal CLK2 and the rising edge of the fourth clock signal CLK3 and extremely near the edge of the third clock signal CLK2, phase 2 of the third clock signal CLK2 is stably selected as the edge detection phase. The reason is because the position of the data edge of the received data signal RXDATA at timing t=te(4) exists within the range of ±1 phase from the rising edge of the third clock signal CLK2 of phase 2 which is the edge detection phase selected currently by the third gate control signal GSEL_Φ2 of a high level.

In the clock data recovery circuit 1 according to Embodiment 2 of the present invention explained above with reference to FIGS. 22 through 28, in initializing operation at the time of power-on or standby cancellation, a certain arbitrary edge detection phase, for example, the rising edge of the first clock signal CLK0 of phase 0, is selected as the initial edge detection phase. The following assumes the case where, to the rising edge of the first clock signal CLK0 in the edge detection phase at the time of the present initializing operation, the position of the rising edge or the falling edge of the data of the received data signal RXDATA exists within the range of ±1 phase from phase 0 which is the phase of the first clock signal CLK0 (between the rising edge of the sixth clock signal CLK5 and the rising edges of the second clock signal CLK1). In the present case, the phase of the first clock signal CLK0 which is the edge detection phase selected currently is selected and held as the edge detection phase. On the other hand, the following assumes the case where the position of the rising edge or a falling edge of the data of the received data signal RXDATA exists between the rising edge of the fourth clock signal CLK3 and the rising edge of the sixth clock signal CLK5 or between the rising edge of the second clock signal CLK1 and the rising edge of the fourth clock signal CLK3. In the present case, it is possible to make the selection phase of the detection edge in the detection edge circuit 105 and the phase of the reproduction clock RCLK in the clock data generating circuit 104 follow the change of the data edge of the received data signal RXDATA finally, by passing through a transition period of the edge detection phase described above.

As explained in the above, even when the receive data edge exist near an arbitrary clock phase of the multi-phase clock, the clock data recovery circuit 1 according to Embodiment 2 of the present invention explained with reference to FIGS. 22 through 28 does not produce highly frequent switching operation of the selection phase and hence has a high degree of jitter tolerance.

(Embodiment 3)
<<A Configuration of the Clock Data Recovery Circuit>>

FIG. 29 illustrates a configuration of the clock data recovery circuit 1 according to Embodiment 3 of the present invention.

As is the case with the clock data recovery circuit 1 according to Embodiment 1 of the present invention illustrated in FIG. 4 and Embodiment 2 of the present invention illustrated in FIG. 22, the clock data recovery circuit 1 according to Embodiment 3 of the present invention illustrated in FIG. 29 comprises a sampling circuit 106, an edge detection circuit 105, a phase selection signal generating circuit 103, and a clock data generating circuit 104.

The clock data recovery circuit 1 according to Embodiment 3 of the present invention illustrated in FIG. 29 is different from the clock data recovery circuit 1 according to Embodiment 1 of the present invention illustrated in FIG. 4 and Embodiment 2 of the present invention illustrated in FIG. 22 in the following point.

That is, in the edge detection circuit 105 of the clock data recovery circuit 1 according to Embodiment 3 of the present invention illustrated in FIG. 29, an integrator INT is coupled to an output of a ΦM edge detection circuit 105M which comprises a first edge detection circuit 105M1 and a second edge detection circuit 105M2. The integrator INT has function for averaging the edge detection result of the first edge detection circuit 105M1 and the edge detection result of the second edge detection circuit 105M2 of the ΦM edge detection circuit 105M.

<<The Edge Detection Circuit>>

FIG. 30 illustrates a configuration of the edge detection circuit 105 of the clock data recovery circuit 1 according to Embodiment 3 of the present invention illustrated in FIG. 29.

As is the case with the edge detection circuit 105 according to Embodiment 1 of the present invention illustrated in FIG. 6, the edge detection circuit 105 illustrated in FIG. 30 according to to Embodiment 3 of the present invention comprises six ΦM edge detection circuits 1050-1055 (M=0-5) which are the same number as the phase number of the multi-phase clock signals CLK0-CLK5, six two-input OR circuits 10503-10553, and six delay flip-flop DFFs 105104-105154. The edge detection circuit 105 illustrated in FIG. 30 comprises six integrators 105105-105155, which are coupled between the output of the six ΦM edge detection circuits 1050-1055 and the input of the six two-input OR circuits 10503-10553.

That is, the six integrators 105105-105155 have function of averaging the edge detection result in terms of six "down" signals DN_Φ0-DN_Φ5 and six "up" signals UP_Φ0-UP_Φ5 from the six ΦM edge detection circuits 1050-1055. That is, six averaged "down" signals DN'_Φ0-DN'_Φ5 and six averaged "up" signals UP'_Φ0-UP'_Φ5, which are generated by the six integrators 105105-105155, are supplied to 12 input terminals of the six two-input OR circuits 10503-10553. As a result, according to the clock data recovery circuit 1 according to Embodiment 3 of the present invention illustrated in FIG. 29, it is possible to decrease jitter-caused degradation which arises from random jitter included in the received data signal RXDATA. Furthermore, according to the edge detection circuit 105 according to Embodiment 3 of the present invention illustrated in FIG. 30, it is possible to cut off the operation of five integrators corresponding to the edge detection phases currently not selected, by means of six gate control signals GSEL_Φ0-GSEL_Φ5. Accordingly, it is possible to suppress increase of the current consumption and power consumption due to the addition of the six integrators 105105-105155.

The operation itself of each of the six ΦM edge detection circuits 1050-1055, the six two-input OR circuits 10503-10553, and the six delay flip-flop DFFs 105104-105154, included in the edge detection circuit 105 according to Embodiment 3 of the present invention illustrated in FIG. 30, is the same as that of the edge detection circuit 105 according to Embodiment 1 of the present invention illustrated in FIG. 6. Accordingly, the explanation thereof is omitted.

<<A Configuration and Operation of the Integrator>>

Figure 31:
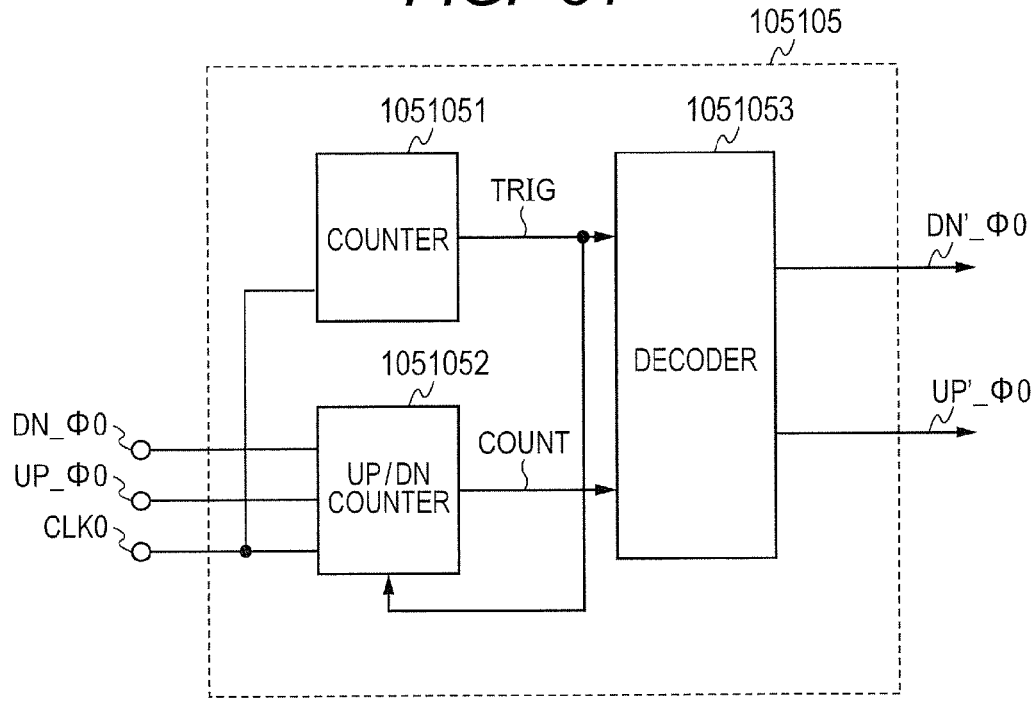
FIG. 31 is a drawing illustrating a configuration of an integrator 105105 included in the edge detection circuit 105, according to Embodiment 3 of the present invention illustrated in FIG. 30.

FIG. 31 illustrates a configuration of the integrator 105105 included in the edge detection circuit 105 according to Embodiment 3 of the present invention illustrated in FIG. 30.

As illustrated in FIG. 31, the integrator 105105 comprises a counter 1051051, an up/down counter 1051052, and a decoder 1051053.

Figure 32:
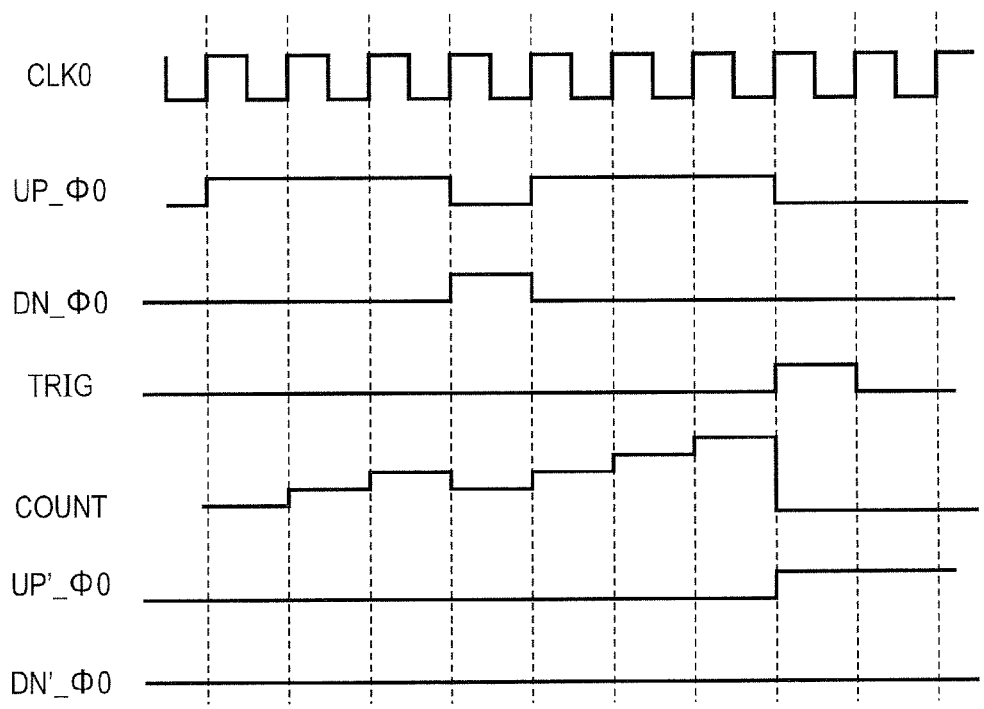
FIG. 32 is a drawing illustrating operation of the integrator 105105 according to Embodiment 3 of the present invention illustrated in FIG. 31.

FIG. 32 illustrates operation of the integrator 105105 according to Embodiment 3 of the present invention illustrated in FIG. 31.

The counter 1051051 is supplied with the first clock signal CLK0. When the counter 1051051 counts the number of the rising edge of the first clock signal CLK0 to a prescribed number, the counter 1051051 generates a trigger signal TRIG of a high level, and supplies it to the decoder 1051053 and the up/down counter 1051052. The period of the trigger signal TRIG at a high level is set to one cycle of the first clock signal CLK0.

On the other hand, the up/down counter 1051052 integrates the value of the "up" signal UP_Φ0 and the value of the "down" signal DN_Φ0 which are supplied from the Φ0 edge detection circuit 1050 of the edge detection circuit 105 illustrated in FIG. 30, synchronizing with the rising edge of the first clock signal CLK0. Accordingly, the up/down counter 1051052 supplies a count signal COUNT as the integrated value thereof to the decoder 1051053. In response to the trigger signal TRIG of a high level supplied from the counter 1051051, the up/down counter 1051052 resets the value of the count signal COUNT as an internal count value, to the initial value "0."

The up/down counter 1051052 increments the current count value by +1 when the "up" signal UP_Φ0 is a high level at the rising edge of the first clock signal CLK0, decrements the current count value by −1 when the "down" signal DN_Φ0 is a high level on the contrary, and holds the current count value when both the "up" signal UP_Φ0 and the "down" signal DN_Φ0 are low levels. That is, for each predetermined number of the rising edge of the clock specified by the counter 1051051, it is possible to count the total value of the "up" signal UP_Φ0 and the "down" signal DN_Φ0 (that is, to count which of the arrival frequency of the "up" signal UP_Φ0 and the arrival frequency of the "down" signal DN_Φ0 is how high).

In response to the rising edge of the output signal TRIG of the counter 1051051, the decoder 1051053 latches the value of the count signal COUNT outputted by the up/down counter 1051052. That is, the decoder 1051053 responds to the value of the count signal COUNT and generates an averaged "up" signal UP'_Φ0 or an averaged "down" signal DN'_Φ0.

When it is assumed that the arrival interval of the trigger signal TRIG generated from the output of the counter 1051051 is 16 cycles of the first clock signal CLK0, the up/down counter 1051052 executes integration and averaging for the 16 cycles. When the value of the count signal COUNT from the output of the up/down counter 1051052 is +3 or more, the decoder 1051053 outputs the averaged "up" signal UP'_Φ0 of a high level. On the contrary, when the value of the count signal COUNT from the output of the up/down counter 1051052 is −3 or less, the decoder 1051053 outputs the averaged "down" signal DN'_Φ0 of a high level. When the value of the count signal COUNT from the output of the up/down counter 1051052 is in the range of −2-+2, the decoder 1051053 outputs the averaged "up" signal UP'_Φ0 and the averaged "down" signal DN'_Φ0 both having a low level.

As clarified by the above-described explanation, by coupling the integrator 105105 to the output of the Φ0 edge detection circuit 1050, as illustrated in FIG. 30, the integrator 105105 supplies to the two-input OR circuits 10513 and 10553 in the latter stage circuit, respectively, the averaged "up" signal UP'_Φ0 and the averaged "down" signal DN'_Φ0 which are obtained by integration and averaging of the values of the "up" signal UP_Φ0 and the "down" signal DN_Φ0 outputted from the Φ0 edge detection circuit 1050. In this way, by adding six integrators 105105-105155 to the edge detection circuit 105 according to Embodiment 3 of the present invention illustrated in FIG. 30, it is possible that the clock data recovery circuit 1 according to Embodiment 3 of the present invention illustrated in FIG. 29 reduces the variation of the edge detection phase and the phase fluctuation of the reproduction clock, due to the position changing of the data edge of the received data signal RXDATA caused by a random jitter etc.

According to the clock data recovery circuit 1 according to Embodiment 3 of the present invention explained with reference to FIGS. 29 through 32, as is the case with the clock data recovery circuit 1 according to Embodiment 1 of the present invention explained with reference to FIGS. 4 through 15, it is possible to provide the oversampling digital clock data recovery circuit which can alleviate increase of the phase number of the multi-phase clock, the power consumption, and the semiconductor chip area.

The clock data recovery circuit 1 according to Embodiment 3 of the present invention explained with reference to FIGS. 29 through 32 employs six integrators 105105-105155 which execute integration and averaging in the edge detection circuit 105; accordingly, it is possible to reduce the variation of the edge detection phase and the phase fluctuation of the reproduction clock, due to the position changing of the data edge of the received data signal RXDATA caused by a random jitter etc. Accordingly, it becomes possible to realize the clock data recovery circuit 1 with a high degree of jitter tolerance, which can be utilized in the interface specifications environments such as PCI-Express, MIPI, etc., which assume no frequency deviation existing between a host and a device.

(Embodiment 4)

FIG. 33 illustrates a configuration of the clock data recovery circuit 1 according to Embodiment 4 of the present invention.

As is the case with the clock data recovery circuit 1 according to Embodiment 1 of the present invention illustrated in FIG. 4, the clock data recovery circuit 1 according to Embodiment 4 of the present invention illustrated in FIG. 33 comprises a sampling circuit 106, an edge detection circuit 105, a phase selection signal generating circuit 103, and a clock data generating circuit 104, and in addition, a multi-phase clock generating circuit 107.

The multi-phase clock generating circuit 107 of the clock data recovery circuit 1 according to Embodiment 4 of the present invention illustrated in FIG. 33 is supplied with a differential clock signal CLKIN of one phase, generated by a PLL (not shown) arranged in the exterior of the clock data recovery circuit 1. In response to the differential clock signal CLKIN, the multi-phase clock generating circuit 107 generates six-phase clock signals CLK0-CLK5 inside the clock data recovery circuit 1.

As a result, according to the clock data recovery circuit 1 according to Embodiment 4 of the present invention illustrated in FIG. 33, as is the case with the clock data recovery circuit 1 according to Embodiment 1 of the present invention illustrated in FIG. 4, it is possible to avoid the need of coupling a number of signal wirings of the six-phase clock signals CLK0-CLK5 with the exterior of the clock data recovery circuit 1. As a result, according to Embodiment 4 of the present invention illustrated in FIG. 33, it is possible to reduce the clock skew among the multi-phase clocks, and it is possible to improve the accuracy of the data restoration from the clock data recovery circuit 1.

<<The Multi-Phase Clock Generating Circuit>>

FIG. 34 illustrates a configuration of the multi-phase clock generating circuit 107 of the clock data recovery circuit 1 according to Embodiment 4 of the present invention illustrated in FIG. 33.

The multi-phase clock generating circuit 107 illustrated in FIG. 34 is comprised of a delayed locked loop (DLL) including a phase comparator (PD) 10701, a charge pump (CP) 10702, a loop filter (LP) 10704, and a voltage-controlled delay line (VCDL) 10703.

The phase comparator 10701 compares a phase difference of a clock signal CLKIN generated by a PLL (not shown) arranged in the exterior of the clock data recovery circuit 1 and one clock signal CLK0 of six-phase clock signals CLK0-CLK5 of an output signal of the voltage-controlled delay line 10701, and generates an "up" signal UP or a "down" signal DN which has a pulse width of the time corresponding to the phase difference.

In response to the "up" signal UP or the "down" signal DN, the charge pump 10702 supplies to the loop filter 10704 the charge current or discharge current which is proportional to the above-described phase difference, and generates a control voltage Vc to be supplied to the loop filter 10704.

In response to the above-described control voltage Vc, the voltage-controlled delay line 10703 controls the delaying amount related to the input clock signal CLKIN, and outputs the six-phase clock signals CLK0-CLK5. By the action of the feedback loop, the phase of the input clock signal CLKIN and the phase of the feedback clock signal CLK0 in the phase comparator 10701 become approximately equal.

Figure 35:
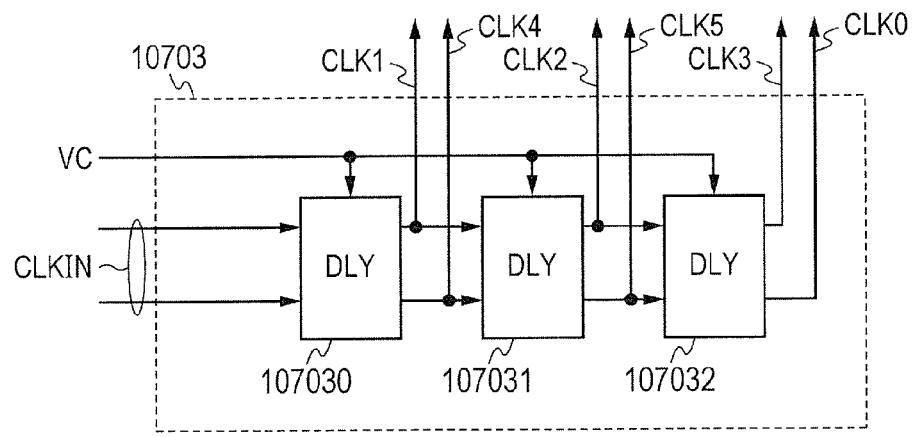
FIG. 35 is a drawing illustrating a configuration of a voltage-controlled delay line (VCDL) 10703 of the multi-phase clock generating circuit 107 illustrated in FIG. 34.

FIG. 35 illustrates a configuration of the voltage-controlled delay line (VCDL) 10703 of the multi-phase clock generating circuit 107 illustrated in FIG. 34.

The voltage-controlled delay line 10703 illustrated in FIG. 35 is comprised of differential voltage-controlled delay lines 107030-107032 which are cascade-connected in three stages. The differential clock signals CLKIN generated by the PLL (not shown) are supplied to the differential input terminals of the first-stage differential voltage-controlled delay line 107030. Differential output signals CLK1 and CLK4 of the first-stage differential voltage-controlled delay line 107030 are supplied to the differential input terminals of the second-stage differential voltage-controlled delay line 107031. Differential output signals CLK2 and CLK5 of the second-stage differential voltage-controlled delay line 107031 are supplied to the differential input terminals of the third-stage differential voltage-controlled delay line 107032, and differential output signals CLK3 and CLK0 of the third-stage differential voltage-controlled delay line 107032 are generated. In this way, the voltage-controlled delay line 10703 illustrated in FIG. 35 generates the six-phase clock signals CLK0-CLK5.

In the multi-phase clock generating circuit 107 illustrated in FIG. 34, it is possible to set the capacity value of the loop filter 10704 as a small value of about several picofarads. As a result, according to the clock data recovery circuit 1 according to Embodiment 4 of the present invention explained with reference to FIGS. 33 through 35, it is possible to alleviate increase of the area of a wiring substrate on which electronic parts are mounted, when compared with a PLL (not shown) which is arranged in the exterior of the clock data recovery circuit 1 and employs a loop filter with a large capacity.

(Embodiment 5)

FIG. 36 illustrates a configuration of an interface unit 11 of the transceiver LSI 7 according to Embodiment 5 of the present invention.

The interface unit (ATAPI) 11 of the transceiver LSI 7 examined by the present inventors in advance of the present invention illustrated in FIG. 1 comprises the serializer (SER) 14, the first PLL circuit (PLL1) 16, the second PLL circuit (PLL2) 13, the deserializer (DES) 15, and the clock data recovery circuit (CDR) 1.

In contrast to it, in the interface unit 11 of the transceiver LSI 7 according to Embodiment 5 of the present invention illustrated in FIG. 36, it has become possible to share a single PLL circuit 13 with the PLL circuit for reception and with the PLL circuit for transmission; accordingly, the semiconductor chip area of the transceiver LSI 7 is reduced greatly.

In the interface unit 11 illustrated in FIG. 36, the clock data recovery circuit (CDR) 1 responds to the received data signal RXDATA received from the host 2 and the six-phase clock signals CLK0-CLK5 or the differential clock signals CLKIN generated by the single PLL circuit 13, and reproduces the reproduction clock RCLK and the reproduction data RDATA. The deserializer (DES) 15 serving as a serial-to-parallel converter generates parallel receive data DR from the reproduction data RDATA and the reproduction clock RCLK which are reproduced by the clock data recovery circuit (CDR) 1.

The serializer (SER) 14 serving as a parallel-to-serial converter generates the serial transmit data TXDATA from the parallel transmit data DT by employing the six-phase clock signals CLK0-CLK5 or the differential clock signal CLKIN generated by the single PLL circuit 13, and transfers the serial transmit data TXDATA to the host 2.

The single shared PLL circuit 13 explained with reference to FIG. 36 or the multi-phase clock generating circuit 107 explained with reference to FIG. 33 and FIG. 34 has required in the past the multi-phase clock of a large number of phases as many as 12 phases, in order to reduce the quantization error in the clock data recovery circuit; accordingly the consumption current and the semiconductor chip area have been large.

In contrast to it, the clock data recovery circuit described in one of Embodiment 1 through Embodiment 4 of the present invention described above is employed in particular, as the clock data recovery circuit (CDR) 1 of the interface unit 11 of the transceiver LSI 7 according to Embodiment 5 of the present invention illustrated in FIG. 36. Consequently, according to Embodiment 5 of the present invention illustrated in FIG. 36, it is possible to set the phase number of the multi-phase clock signals of the single shared PLL circuit 13 or the multi-phase clock generating circuit 107 described above as six phases which are one half of 12 phases employed in the past. Consequently, according to Embodiment 5 of the present invention illustrated in FIG. 36, it becomes possible to realize the interface unit 11 with the built-in clock data recovery circuit, in which it is possible to reduce the consumption current and the semiconductor chip area and it is also possible to stably reproduce the reproduction clock RCLK and the reproduction data RDATA.

(Embodiment 6)

FIG. 37 illustrates a configuration of the transceiver LSI 7 according to Embodiment 6 of the present invention.

The transceiver LSI 7 according to Embodiment 6 of the present invention illustrated in FIG. 37 is comprised of a recording/reproduction unit (READ/WRITE) 8 coupled to the interface unit 11 of the transceiver LSI 7 according to Embodiment 5 of the present invention explained with reference to FIG. 36.

The recording/reproduction unit (READ/WRITE) 8 according to Embodiment 6 of the present invention illustrated in FIG. 37 is coupled to an optical pickup 6 which executes the read and write of data by irradiating an optical disk 5 with an optical beam. The recording/reproduction unit (READ/WRITE) 8 executes the write of data to the optical disk 5 by performing signal processing of a write signal supplied by a host 2 via the interface unit 11 and supplying it to the optical pickup 6. On the other hand, in the read of data from the optical disk 5, the recording/reproduction unit (READ/WRITE) 8 performs signal processing of a read signal supplied from the optical pickup 6, and supplies it to the interface unit 11.

A crystal oscillator 3 is coupled to the transceiver LSI 7 according to Embodiment 6 of the present invention illustrated in FIG. 37. The crystal oscillator 3 determines frequency Fref of an operation clock supplied to the recording/reproduction unit (READ/WRITE) 8. This frequency Fref determines the base frequency of the spread spectrum frequency on the device side of the single shared PLL circuit 13 included in the interface unit 11. The single shared PLL circuit 13 composed as a spread spectrum clock generator (SSCG) generates a clock signal with frequency lower than the base frequency. The frequency of the spread spectrum clock signal is changed periodically, for example in a triangular wave shape; accordingly it becomes possible to alleviate the spurious radiation of the clock signal.

As described above, the invention accomplished by the present inventors has been concretely explained based on various embodiments. However, it cannot be overemphasized that the present invention is not restricted to the embodiments, and it can be changed variously in the range which does not deviate from the gist.

For example, in the transceiver LSI 7 according to Embodiment 6 of the present invention illustrated in FIG. 37, the recording medium 5 for data recording is not restricted to disk-shaped recording media, such as an HDD, a CD, a DVD, and a BD, which are driven to rotate, but can employ a large-capacity semiconductor nonvolatile memory file as well.

What is claimed is:

1. A clock data recovery circuit comprising:
   a sampling circuit;
   an edge detector;
   a phase selection signal generating circuit; and
   a clock data generating circuit,
   wherein the sampling circuit samples a received data signal with the use of multi-phase clock signals, and generates a plurality of sampling signals,
   wherein the edge detector responds to the sampling signals and the multi-phase clock signals, and generates a plurality of edge detection signals,
   wherein the phase selection signal generating circuit responds to the edge detection signals and the multi-phase clock signals, and generates a plurality of phase selection signals,
   wherein the clock data generating circuit responds to the sampling signals, the phase selection signals, and the multi-phase clock signals, and generates a reproduction clock and reproduction data,
   wherein the edge detector comprises a plurality of edge detection circuits which respond to the sampling signals and the multi-phase clock signals and generate the plural edge detection signals,
   wherein each of the plural edge detection circuits comprises a first edge detection circuit and a second edge detection circuit,
   wherein when the first edge detection circuit detects that an data edge of the received data signal supplied currently is leading more than −1 phase of the multi-phase clock signals from an edge detection phase of one edge detection clock signal corresponding to the data edge detection phase of the each edge detection circuit among the multi-phase clock signals, the first edge detection circuit generates a first edge detection output signal,
   wherein when the second edge detection circuit detects that the data edge of the received data signal supplied currently is lagging more than +1 phase of the multi-phase clock signals from the edge detection phase of one edge detection clock signal corresponding to the data edge detection phase of the each edge detection circuit among the multi-phase clock signals, the second edge detection circuit generates a second edge detection output signal,
   wherein, in response to the first edge detection output signal or the second edge detection output signal, a next edge detection phase of the edge detector is changed by the amount of −1 phase or +1 phase from the edge detection phase of the one edge detection clock signal,
   wherein the first edge detection circuit and the second edge detection circuit are operable to detect that the data edge of the received data signal supplied currently lies in the range of ±1 phase of the multi-phase clock signals from the edge detection phase of one edge detection clock signal corresponding to the data edge detection phase of the each edge detection circuit among the multi-phase clock signals, and
   wherein when the first edge detection circuit and the second edge detection circuit detect that the data edge of the received data signal supplied currently lies in the range of ±1 phase, the next edge detection phase of the edge detector is maintained at the edge detection phase of the one edge detection clock signal.

2. The clock data recovery circuit according to claim 1,
   wherein the phase selection signal generating circuit responds to the edge detection signals and the multi-phase clock signals, and further generates a plurality of gate control signals,
   wherein the plural gate control signals generated by the phase selection signal generating circuit are supplied to the plural edge detection circuits of the edge detector,
   wherein one edge detection signal of the plural edge detection signals generated by the edge detector is set at a predetermined voltage level for indicating one clock signal corresponding to the data edge of the received data signal supplied currently among the multi-phase clock signals,
   wherein in response to the one edge detection signal set at the predetermined voltage level, one gate control signal of the plural gate control signals generated by the phase selection signal generating circuit is set at a predetermined signal level, and
   wherein one edge detection circuit to which the one gate control signal set at the predetermined signal level is supplied among the plural edge detection circuits of the edge detector is controlled to an active state, and the other edge detection circuits of the plural edge detection circuits of the edge detector are controlled to a non-active state.

3. The clock data recovery circuit according to claim 2,
   wherein the phase selection signal generating circuit comprises a plurality of phase selection signal generating circuits operable to generate the plural phase selection signals and the plural gate control signals, and wherein one phase selection signal and one gate control signal which are generated by each phase selection signal generating circuit of the plural phase selection signal generating circuits have a phase difference of 0.5 unit intervals substantially.

4. The clock data recovery circuit according to claim 3,
wherein the first edge detection circuit and the second edge detection circuit of the each edge detection circuit of the plural edge detection circuits comprise a first exclusive OR circuit and a second exclusive OR circuit, respectively,
wherein a first input signal and a first reference signal are supplied to the first exclusive OR circuit of the first edge detection circuit, and a second input signal and a second reference signal are supplied to the second exclusive OR circuit of the second edge detection circuit,
wherein the first input signal supplied to the first exclusive OR circuit is a one-phase-leading sampling signal which is formed from the received data signal sampled by a one-phase-leading clock signal of the multi-phase clock signals, leading by −1 phase as compared with the one edge detection clock signal corresponding to the data edge detection phase of the each edge detection circuit,
wherein the first reference signal supplied to the first exclusive OR circuit is a multi-phase-leading sampling signal which is formed from the received data signal sampled by a multi-phase-leading clock signal of the multi-phase clock signals, leading by −2 phases or more as compared with the one edge detection clock signal corresponding to the data edge detection phase of the each edge detection circuit,
wherein the second input signal supplied to the second exclusive OR circuit is a one-phase-lagging sampling signal which is formed from the received data signal sampled by a one-phase-lagging clock signal of the multi-phase clock signals, lagging by +1 phase as compared with the one edge detection clock signal corresponding to the data edge detection phase of the each edge detection circuit,
wherein the second reference signal supplied to the second exclusive OR circuit is a multi-phase-lagging sampling signal which is formed from the received data signal sampled by a multi-phase-lagging clock signal of the multi-phase clock signals, lagging by +2 phases or more as compared with the one edge detection clock signal corresponding to the data edge detection phase of the each edge detection circuit,
wherein in response to the output signal of the predetermined level of the first exclusive OR circuit, the each edge detection circuit of the plural edge detection circuits generates the first edge detection output signal, and
wherein in response to the output signal of the predetermined level of the second exclusive OR circuit, the each edge detection circuit of the plural edge detection circuits generates the second edge detection output signal.

5. The clock data recovery circuit according to claim 3,
wherein in initializing operation at the time of power-on or standby cancellation, one arbitrary gate control signal of the plural gate control signals generated by the phase selection signal generating circuit is set at the predetermined signal level, and
wherein, in the initializing operation, one phase selection signal which has a phase difference of 0.5 unit intervals substantially with the one arbitrary gate control signal, among the plural phase selection signals generated by the phase selection signal generating circuit, is also set at the predetermined signal level.

6. The clock data recovery circuit according to claim 3,
wherein when the data edge of the next received data signal shifts by the amount of at least 2 phases of the multi-phase clock signals as compared with the data edge of the received data signal supplied currently, the following follow-up operation is executed, and
wherein by the follow-up operation, the next edge detection phase of the edge detector and the phase of the reproduction clock generated by the clock data generating circuit follow the change of the data edge of the received data signal, by executing at least twice the state transition by the change for the amount of −1 phase or +1 phase from the edge detection phase in response to the first edge detection output signal or the second edge detection output signal.

7. The clock data recovery circuit according to claim 3,
wherein the each edge detection circuit of the plural edge detection circuits further comprises a third edge detection circuit and a fourth edge detection circuit,
wherein when the first edge detection circuit detects that the data edge of the received data signal supplied currently is leading between −1 phase and −2 phase of the multi-phase clock signals from the edge detection phase of one edge detection clock signal corresponding to the data edge detection phase of the each edge detection circuit among the multi-phase clock signals, the first edge detection circuit generates the first edge detection output signal,
wherein when the second edge detection circuit detects that the data edge of the received data signal supplied currently is lagging between +2 phases and +1 phase of the multi-phase clock signals from the edge detection phase of one edge detection clock signal corresponding to the data edge detection phase of the each edge detection circuit among the multi-phase clock signals, the second edge detection circuit generates the second edge detection output signal,
wherein, in response to the first edge detection output signal or the second edge detection output signal, a next edge detection phase of the edge detector is changed by the amount of −1 phase or +1 phase from the edge detection phase of the one edge detection clock signal,
wherein when the third edge detection circuit detects that the data edge of the received data signal supplied currently is leading between −2 phases to −3 phases of the multi-phase clock signals from the edge detection phase of one edge detection clock signal corresponding to the data edge detection phase of the each edge detection circuit among the multi-phase clock signals, the third edge detection circuit generates the third edge detection output signal,
wherein when the fourth edge detection circuit detects that the data edge of the received data signal supplied currently is lagging between +2 phases and +3 phases of the multi-phase clock signals from the edge detection phase of one edge detection clock signal corresponding to the data edge detection phase of the each edge detection circuit among the multi-phase clock signals, the fourth edge detection circuit generates the fourth edge detection output signal, and
wherein, in response to the third edge detection output signal or the fourth edge detection output signal, the next edge detection phase of the edge detector is changed by the amount of −2 phases or +2 phases from the edge detection phase of the one edge detection clock signal.

8. The clock data recovery circuit according to claim 7,
wherein when the data edge of the next received data signal shifts by the amount of at least 2 phases of the multi-phase clock signals as compared with the data edge of the received data signal supplied currently, the following follow-up operation is executed, and wherein, by the follow-up operation, the next edge detection phase of the edge detector and the phase of the reproduction clock generated by the clock data generating circuit follow the change of the data edge of the received data signal, by executing once the state transition by the change for the amount of −2 phases or +2 phases from the edge detection phase, in response to the third edge detection output signal or the fourth edge detection output signal.

9. The clock data recovery circuit according to claim 3,
  wherein the edge detector further comprises a plurality of integrators coupled to a plurality of output terminals of the plural edge detection circuits, and
  wherein each integrator of the plural integrators executes averaging of the first edge detection result of the first edge detection circuit and the second edge detection result of the second edge detection circuit, in the each edge detection circuit of the plural edge detection circuits.

10. The clock data recovery circuit according to claim 3,
  wherein the clock data recovery circuit further comprises a multi-phase clock generating circuit operable to generate the multi-phase clock signals in response to an external clock signal supplied from the exterior of the clock data recovery circuit, and
  wherein, inside the clock data recovery circuit, the multi-phase clock signals generated by the multi-phase clock generating circuit is supplied to the sampling circuit, the edge detector, the phase selection signal generating circuit, and the clock data generating circuit.

11. The clock data recovery circuit according to claim 3,
  wherein the multi-phase clock generating circuit for generating the multi-phase clock signals is configured with a delayed locked loop which comprises a phase comparator, a charge pump, a loop filter, and a voltage-controlled delay line.

12. A transceiver semiconductor integrated circuit comprising:
  an interface unit which comprises a clock data recovery circuit, a deserializer, a serializer, and a PLL circuit,
  wherein the serializer as a parallel-to-serial converter generates a serial transmit signal from a parallel transmit signal and a PLL clock generated by the PLL circuit,
  wherein the clock data recovery circuit generates a reproduction clock and reproduction data in response to a received data signal and the PLL clock generated by the PLL circuit,
  wherein the deserializer as a serial-to-parallel converter generates parallel receive data from the reproduction data and the reproduction clock generated by the clock data recovery circuit,
  wherein the clock data recovery circuit comprises a sampling circuit, an edge detector, a phase selection signal generating circuit, and a clock data generating circuit,
  wherein the sampling circuit samples a received data signal with the use of multi-phase clock signals, and generates a plurality of sampling signals,
  wherein the edge detector responds to the sampling signals and the multi-phase clock signals, and generates a plurality of edge detection signals,
  wherein the phase selection signal generating circuit responds to the edge detection signals and the multi-phase clock signals, and generates a plurality of phase selection signals,
  wherein the clock data generating circuit responds to the sampling signals, the phase selection signals, and the multi-phase clock signals, and generates a reproduction clock and reproduction data,
  wherein the edge detector comprises a plurality of edge detection circuits which respond to the sampling signals and the multi-phase clock signals and generate the plural edge detection signals,
  wherein each of the plural edge detection circuits comprises a first edge detection circuit and a second edge detection circuit,
  wherein when the first edge detection circuit detects that the data edge of the received data signal supplied currently is leading more than −1 phase of the multi-phase clock signals from the edge detection phase of one edge detection clock signal corresponding to the data edge detection phase of the each edge detection circuit among the multi-phase clock signals, the first edge detection circuit generates a first edge detection output signal,
  wherein when the second edge detection circuit detects that the data edge of the received data signal supplied currently is lagging more than +1 phase of the multi-phase clock signals from the edge detection phase of one edge detection clock signal corresponding to the data edge detection phase of the each edge detection circuit among the multi-phase clock signals, the second edge detection circuit generates a second edge detection output signal,
  wherein, in response to the first edge detection output signal or the second edge detection output signal, a next edge detection phase of the edge detector is changed by the amount of −1 phase or +1 phase from the edge detection phase of the one edge detection clock signal,
  wherein the first edge detection circuit and the second edge detection circuit are operable to detect that the data edge of the received data signal supplied currently lies in the range of ±1 phase of the multi-phase clock signals from the edge detection phase of one edge detection clock signal corresponding to the data edge detection phase of the each edge detection circuit among the multi-phase clock signals, and
  wherein when the first edge detection circuit and the second edge detection circuit detect that the data edge of the received data signal supplied currently lies in the range of ±1 phase, the next edge detection phase of the edge detector is maintained at the edge detection phase of the one edge detection clock signal.

13. The transceiver semiconductor integrated circuit according to claim 12,
  wherein the phase selection signal generating circuit responds to the edge detection signals and the multi-phase clock signals, and further generates a plurality of gate control signals,
  wherein the plural gate control signals generated by the phase selection signal generating circuit are supplied to the plural edge detection circuits of the edge detector,
  wherein one edge detection signal of the plural edge detection signals generated by the edge detector is set at a predetermined voltage level for indicating one clock signal corresponding to the data edge of the received data signal supplied currently among the multi-phase clock signals,
  wherein in response to the one edge detection signal set at the predetermined voltage level, one gate control signal of the plural gate control signals generated by the phase selection signal generating circuit is set at a predetermined signal level, and wherein one edge detection circuit to which the one gate control signal set at the predetermined signal level is supplied among the plural edge detection circuits of the edge detector is controlled to an active state, and the other edge detection circuits of the plural edge detection circuits of the edge detector are controlled to a non-active state.

14. The transceiver semiconductor integrated circuit according to claim 13, wherein the phase selection signal generating circuit comprises a plurality of phase selection signal generating circuits operable to generate the plural phase selection signals and the plural gate control signals, and wherein one phase selection signal and one gate control signal which are generated by each phase selection signal generating circuit of the plural phase selection signal generating circuits have a phase difference of 0.5 unit intervals substantially.

15. The transceiver semiconductor integrated circuit according to claim 14, wherein the first edge detection circuit and the second edge detection circuit of the each edge detection circuit of the plural edge detection circuits comprise a first exclusive OR circuit and a second exclusive OR circuit, respectively, wherein a first input signal and a first reference signal are supplied to the first exclusive OR circuit of the first edge detection circuit, and a second input signal and a second reference signal are supplied to the second exclusive OR circuit of the second edge detection circuit, wherein the first input signal supplied to the first exclusive OR circuit is a one-phase-leading sampling signal which is formed from the received data signal sampled by a one-phase-leading clock signal of the multi-phase clock signals, leading by −1 phase as compared with the one edge detection clock signal corresponding to the data edge detection phase of the each edge detection circuit, wherein the first reference signal supplied to the first exclusive OR circuit is a multi-phase-leading sampling signal which is formed from the received data signal sampled by a multi-phase-leading clock signal of the multi-phase clock signals, leading by −2 phases or more as compared with the one edge detection clock signal corresponding to the data edge detection phase of the each edge detection circuit, wherein the second input signal supplied to the second exclusive OR circuit is a one-phase-lagging sampling signal which is formed from the received data signal sampled by a one-phase-lagging clock signal of the multi-phase clock signals, lagging by +1 phase as compared with the one edge detection clock signal corresponding to the data edge detection phase of the each edge detection circuit, wherein the second reference signal supplied to the second exclusive OR circuit is a multi-phase-lagging sampling signal which is formed from the received data signal sampled by a multi-phase-lagging clock signal of the multi-phase clock signals, lagging by +2 phases or more as compared with the one edge detection clock signal corresponding to the data edge detection phase of the each edge detection circuit, wherein in response to the output signal of the predetermined level of the first exclusive OR circuit, the each edge detection circuit of the plural edge detection circuits generates the first edge detection output signal, and wherein in response to the output signal of the predetermined level of the second exclusive OR circuit, the each edge detection circuit of the plural edge detection circuits generates the second edge detection output signal.

16. The transceiver semiconductor integrated circuit according to claim 14, wherein in initializing operation at the time of power-on or standby cancellation, one arbitrary gate control signal of the plural gate control signals generated by the phase selection signal generating circuit is set at the predetermined signal level, and wherein, in the initializing operation, one phase selection signal which has a phase difference of 0.5 unit intervals substantially with the one arbitrary gate control signal, among the plural phase selection signals generated by the phase selection signal generating circuit, is also set at the predetermined signal level.

17. The transceiver semiconductor integrated circuit according to claim 14, wherein when the data edge of the next received data signal shifts by the amount of at least 2 phases of the multi-phase clock signals as compared with the data edge of the received data signal supplied currently, the following follow-up operation is executed, and wherein, by the follow-up operation, the next edge detection phase of the edge detector and the phase of the reproduction clock generated by the clock data generating circuit follow the change of the data edge of the received data signal, by executing at least twice the state transition by the change for the amount of −1 phase or +1 phase from the edge detection phase in response to the first edge detection output signal or the second edge detection output signal.

18. The transceiver semiconductor integrated circuit according to claim 14, wherein the each edge detection circuit of the plural edge detection circuits further comprises a third edge detection circuit and a fourth edge detection circuit, wherein when the first edge detection circuit detects that the data edge of the received data signal supplied currently is leading between −1 phase and −2 phases of the multi-phase clock signals from the edge detection phase of one edge detection clock signal corresponding to the data edge detection phase of the each edge detection circuit among the multi-phase clock signals, the first edge detection circuit generates the first edge detection output signal, wherein when the second edge detection circuit detects that the data edge of the received data signal supplied currently is lagging between +2 phases and +1 phase of the multi-phase clock signals from the edge detection phase of one edge detection clock signal corresponding to the data edge detection phase of the each edge detection circuit among the multi-phase clock signals, the second edge detection circuit generates the second edge detection output signal, wherein, in response to the first edge detection output signal or the second edge detection output signal, a next edge detection phase of the edge detector is changed by the amount of −1 phase or +1 phase from the edge detection phase of the one edge detection clock signal, wherein when the third edge detection circuit detects that the data edge of the received data signal supplied currently is leading between −2 phases to −3 phases of the multi-phase clock signals from the edge detection phase of one edge detection clock signal corresponding to the data edge detection phase of the each edge detection circuit among the multi-phase clock signals, the third edge detection circuit generates the third edge detection output signal, wherein when the fourth edge detection circuit detects that the data edge of the received data signal supplied currently is lagging between +2 phases and +3 phases circuits of the multi-phase clock signals from the edge detection phase of one edge detection clock signal corresponding to the data edge detection phase of the each edge detection circuit among the multi-phase clock signals, the fourth edge detection circuit generates the fourth edge detection output signal, and wherein, in response to the third edge detection output signal or the fourth edge detection output signal, the next edge detection phase of the edge detector is changed by the amount of −2 phases or +2 phases from the edge detection phase of the one edge detection clock signal.

19. The transceiver semiconductor integrated circuit according to claim 18, wherein when the data edge of the next received data signal shifts by the amount of at least 2 phases of the multi-phase clock signals as compared with the data edge of the received data signal supplied currently, the following follow-up operation is executed, and wherein, by the follow-up operation, the next edge detection phase of the edge detector and the phase of the reproduction clock generated by the clock data generating circuit follow the change of the data edge of the received data signal, by executing once the state transition by the change for the amount of −2 phases or +2 phases from the edge detection phase, in response to the third edge detection output signal or the fourth edge detection output signal.

20. The transceiver semiconductor integrated circuit according to claim 14, wherein the edge detector further comprises a plurality of integrators coupled to a plurality of output terminals of the plural edge detection circuits, and wherein each integrator of the plural integrators executes averaging of the first edge detection result of the first edge detection circuit and the second edge detection result of the second edge detection circuit, in the each edge detection circuit of the plural edge detection circuits.

* * * * *